(12) United States Patent
Tezuka et al.

(10) Patent No.: US 9,660,098 B2
(45) Date of Patent: May 23, 2017

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Sachiaki Tezuka, Kanagawa (JP); Tetsuhiro Tanaka, Kanagawa (JP); Toshihiko Takeuchi, Kanagawa (JP); Hideomi Suzawa, Kanagawa (JP); Suguru Hondo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 35 days.

(21) Appl. No.: 14/883,732

(22) Filed: Oct. 15, 2015

(65) Prior Publication Data
US 2016/0111546 A1 Apr. 21, 2016

Related U.S. Application Data

(63) Continuation of application No. 14/047,639, filed on Oct. 7, 2013, now Pat. No. 9,166,021.

(30) Foreign Application Priority Data

Oct. 17, 2012 (JP) .................................. 2012-230363
Nov. 16, 2012 (JP) .................................. 2012-252327
Mar. 15, 2013 (JP) .................................. 2013-052623

(51) Int. Cl.
*H01L 29/786* (2006.01)
*H01L 29/66* (2006.01)
(Continued)

(52) U.S. Cl.
CPC .... *H01L 29/7869* (2013.01); *H01L 21/28185* (2013.01); *H01L 21/28194* (2013.01);
(Continued)

(58) Field of Classification Search
CPC ............. H01L 29/7869; H01L 27/1225; H01L 21/02565; H01L 29/4908; H01L 29/78693;
(Continued)

(56) References Cited

U.S. PATENT DOCUMENTS 5,731,856 A  3/1998  Kim et al.
5,744,864 A  4/1998  Cillessen et al.
(Continued)

FOREIGN PATENT DOCUMENTS

EP  1737044 A  12/2006
EP  2226847 A  9/2010
(Continued)

OTHER PUBLICATIONS

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
(Continued)

*Primary Examiner* — Bac Au
(74) *Attorney, Agent, or Firm* — Fish & Richardson P.C.

(57) ABSTRACT

Stable electrical characteristics and high reliability are provided for a miniaturized semiconductor device including an oxide semiconductor, and the semiconductor device is manufactured. The semiconductor device includes a base insulating layer; an oxide stack which is over the base insulating layer and includes an oxide semiconductor layer; a source electrode layer and a drain electrode layer over the oxide stack; a gate insulating layer over the oxide stack, the
(Continued)

source electrode layer, and the drain electrode layer; a gate electrode layer over the gate insulating layer; and an interlayer insulating layer over the gate electrode layer. In the semiconductor device, the defect density in the oxide semiconductor layer is reduced.

21 Claims, 40 Drawing Sheets

(51) Int. Cl.
    *H01L 21/28* (2006.01)
    *H01L 21/8234* (2006.01)
    *H01L 29/78* (2006.01)
    *H01L 29/49* (2006.01)
    *H01L 21/8238* (2006.01)
    *H01L 29/10* (2006.01)
    *H01L 29/423* (2006.01)

(52) U.S. Cl.
CPC ............... *H01L 21/823462* (2013.01); *H01L 21/823857* (2013.01); *H01L 29/1054* (2013.01); *H01L 29/42384* (2013.01); *H01L 29/4908* (2013.01); *H01L 29/66765* (2013.01); *H01L 29/66969* (2013.01); *H01L 29/78* (2013.01)

(58) Field of Classification Search
CPC ........... H01L 29/41733; H01L 27/1251; H01L 29/247; H01L 29/2206
See application file for complete search history.

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,237,166 B2 | 8/2012 | Kumomi et al. |
| 8,274,078 B2 | 9/2012 | Itagaki et al. |
| 8,362,478 B2 | 1/2013 | Yamazaki et al. |
| 8,441,010 B2 | 5/2013 | Ichijo et al. |
| 8,461,007 B2 | 6/2013 | Yamazaki |
| 8,530,289 B2 | 9/2013 | Yamazaki |
| 8,546,225 B2 | 10/2013 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0111557 A1 | 5/2011 | Ichijo et al. |
| 2011/0193083 A1 | 8/2011 | Kim et al. |
| 2011/0215328 A1 | 9/2011 | Morosawa et al. |
| 2011/0260171 A1 | 10/2011 | Yamazaki |
| 2011/0263082 A1 | 10/2011 | Yamazaki |
| 2011/0263091 A1 | 10/2011 | Yamazaki |

(56) References Cited

U.S. PATENT DOCUMENTS

| | | |
|---|---|---|
| 2011/0284959 A1 | 11/2011 | Kimura et al. |
| 2011/0303913 A1 | 12/2011 | Yamazaki et al. |
| 2012/0119205 A1 | 5/2012 | Taniguchi et al. |
| 2013/0126862 A1 | 5/2013 | Yamazaki |
| 2013/0146870 A1 | 6/2013 | Yamazaki |
| 2013/0270549 A1 | 10/2013 | Okazaki et al. |
| 2014/0197408 A1 | 7/2014 | Tsuruma et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2012-019207 A | 1/2012 |
| JP | 2012-160679 A | 8/2012 |
| WO | WO-2004/114391 | 12/2004 |
| WO | WO-2008/133345 | 11/2008 |

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physical Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—0 TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bendigs Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "SPINEL,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn ] at Temperatures over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43 No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW'08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO) films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dieelectric Layers", J.

Electrochem. Soc. (Journal of the Electrochemical Society), 2008, vol. 155, No. 12, pp. H1009-H1014.
Ohara.H et al., "21.3:4.0 IN. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops. Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters) Jul. 31, 2000, vol. 85, No. 5, pp. 1012-1015.

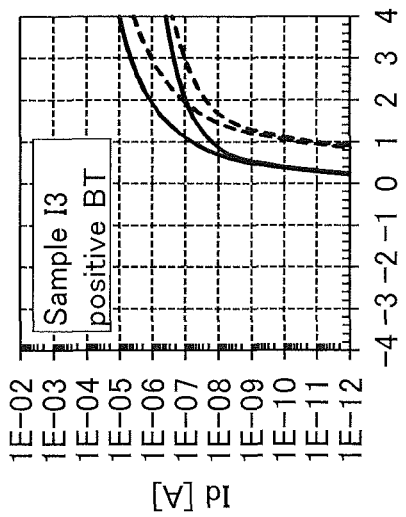
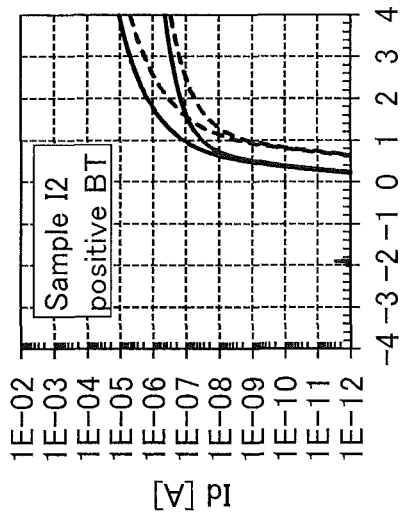
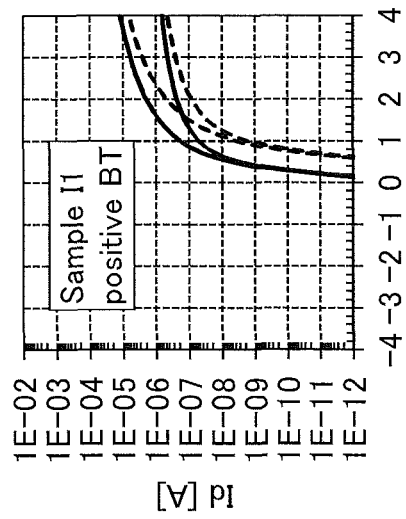
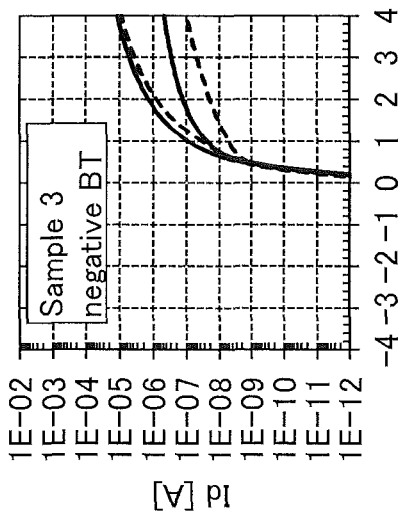
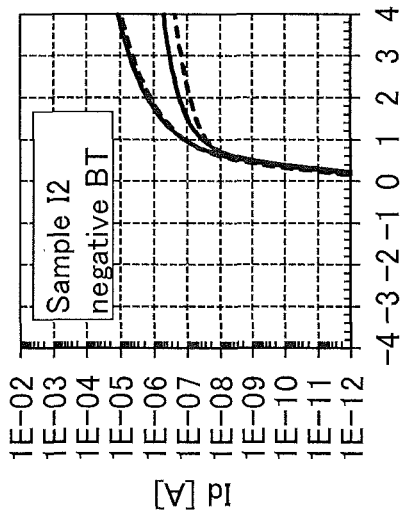
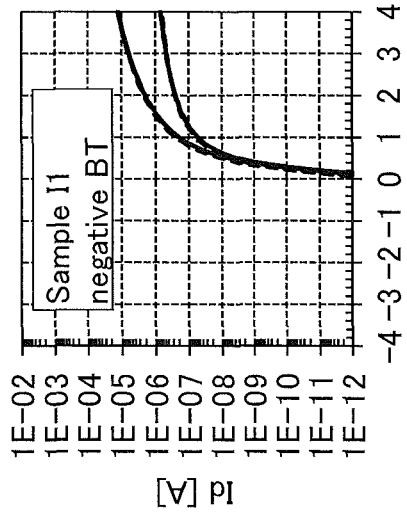

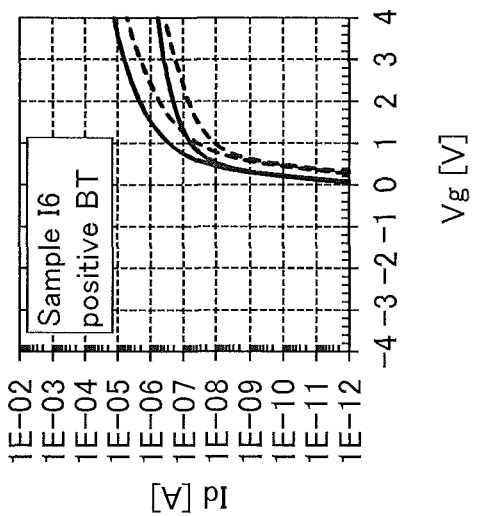
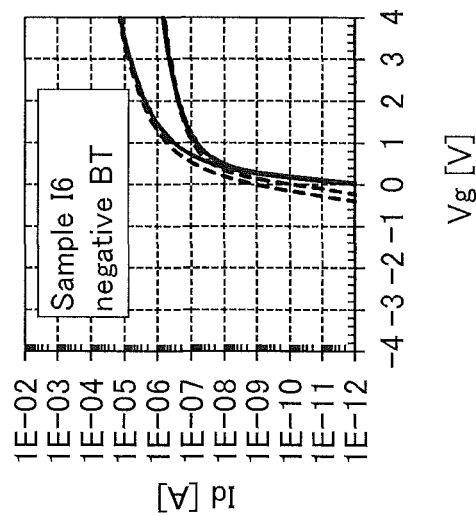
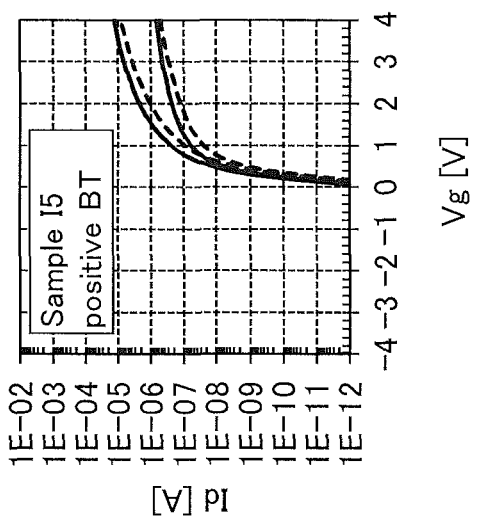
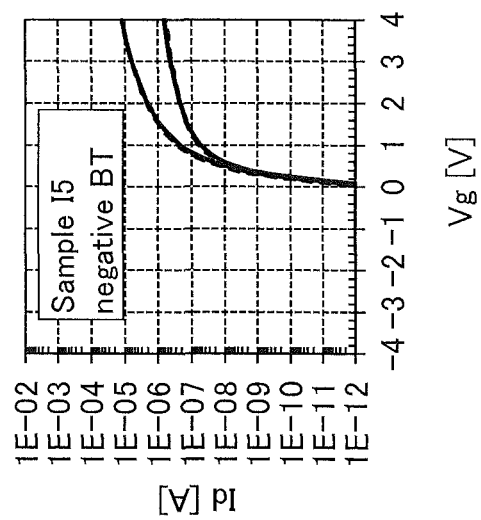
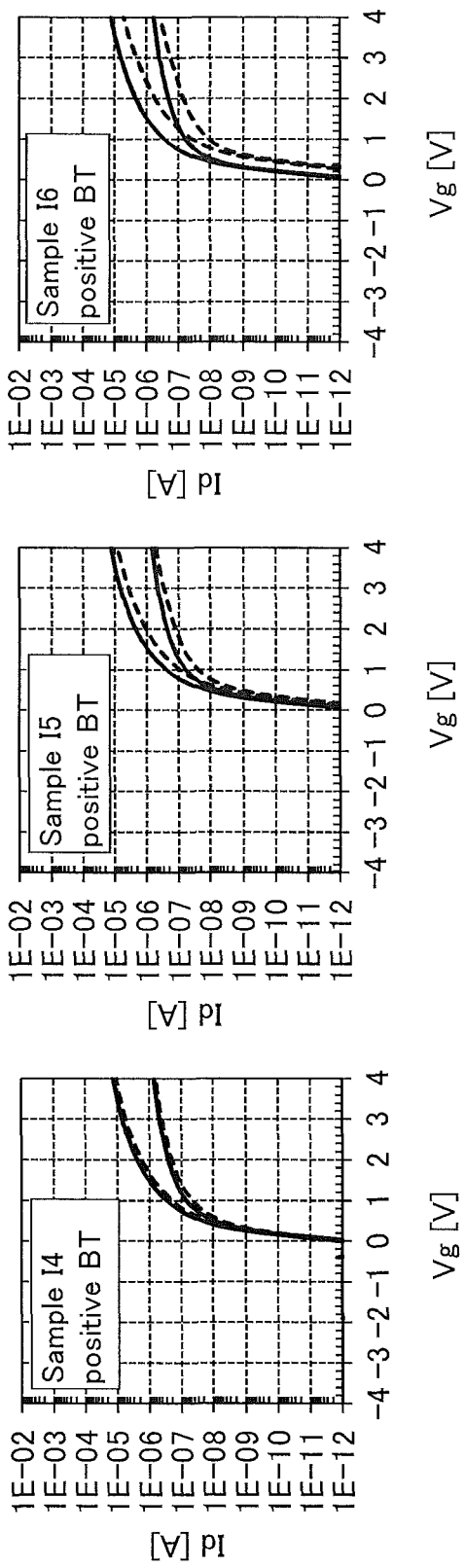
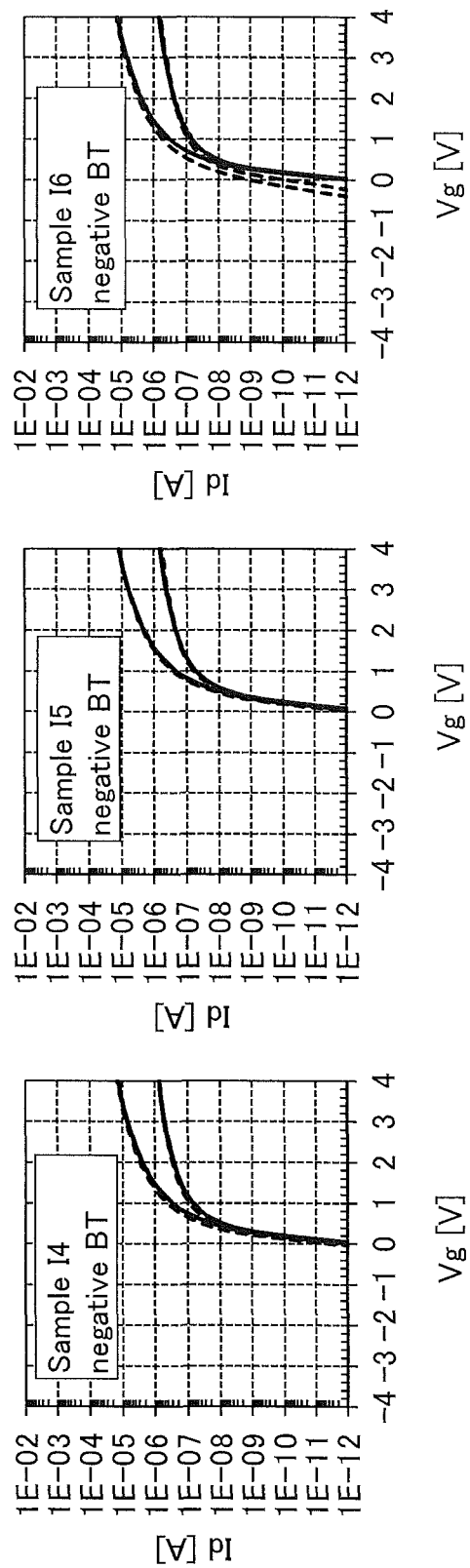

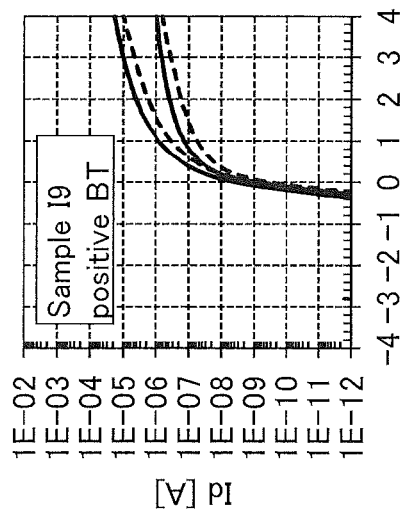
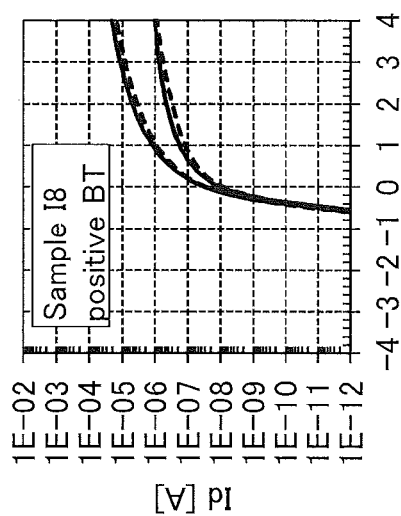
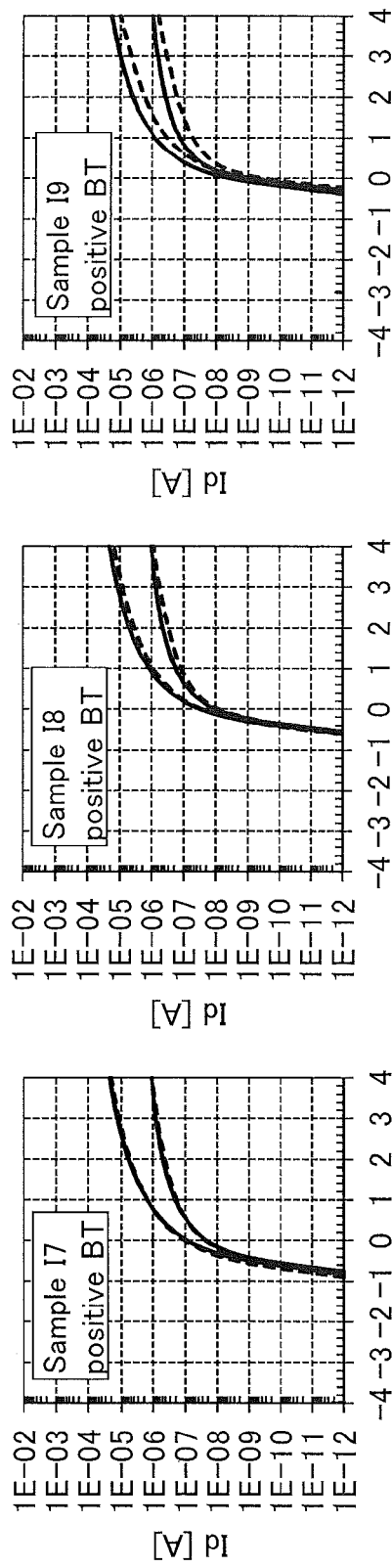
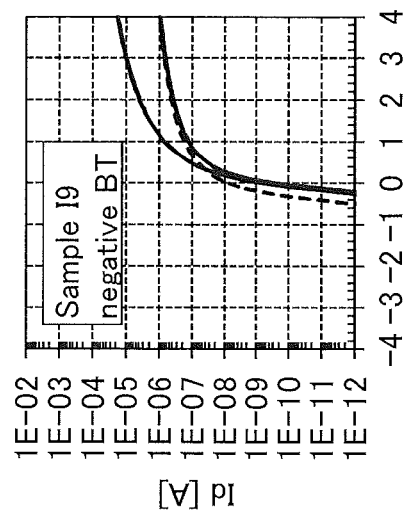
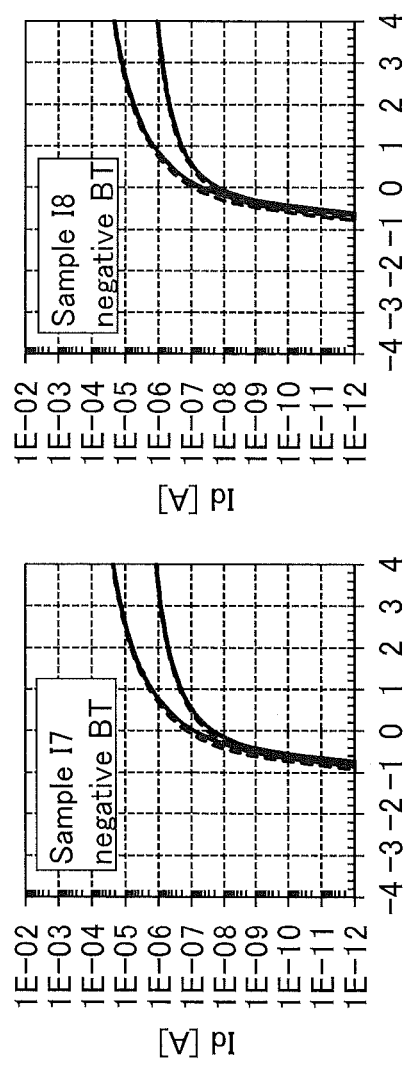

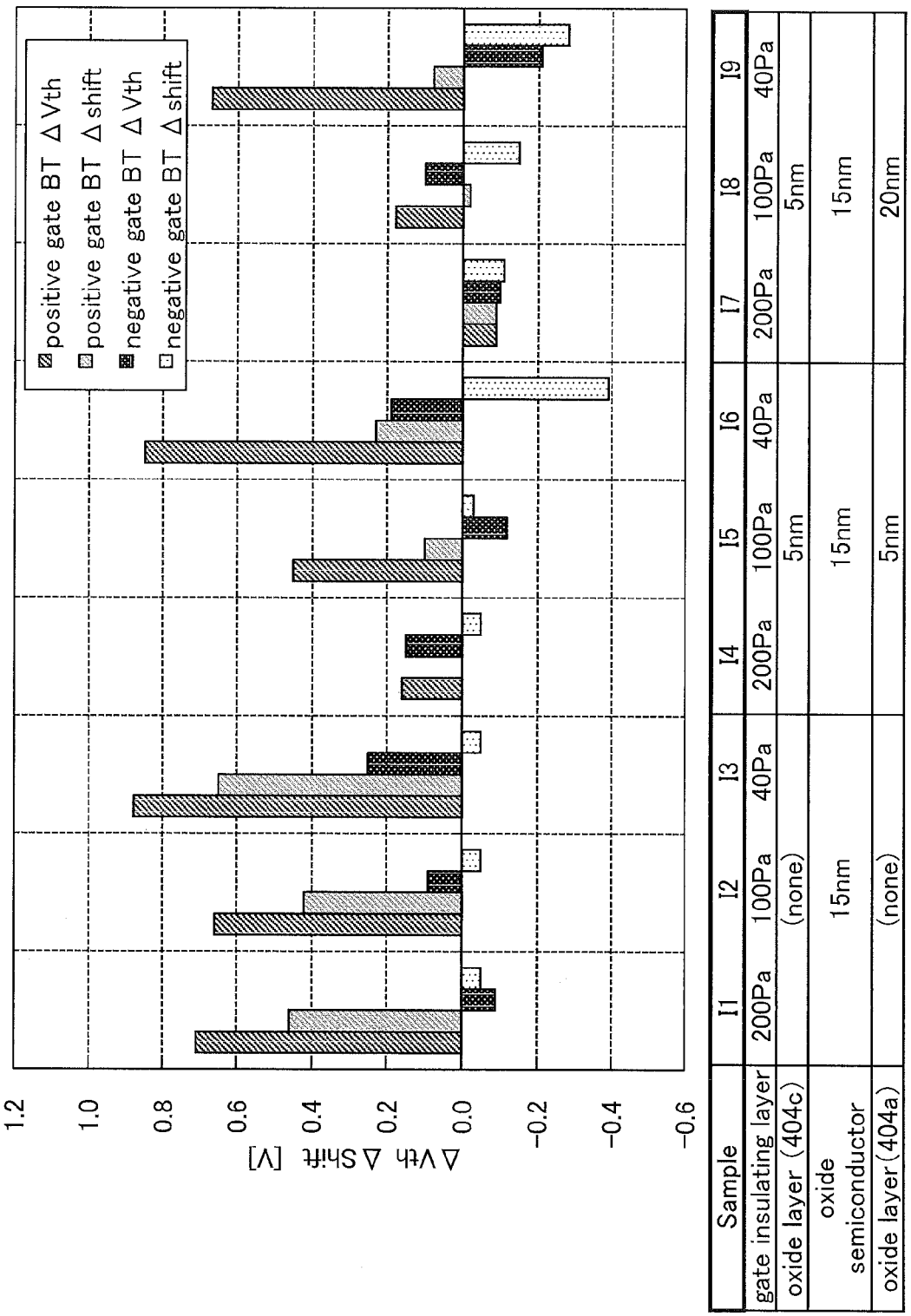

SEMICONDUCTOR DEVICE AND METHOD FOR MANUFACTURING THE SAME

CROSS-REFERENCE TO RELATED APPLICATIONS

This application is a continuation of U.S. application Ser. No. 14/047,639, filed Oct. 7, 2013, now allowed, which claims the benefit of foreign priority applications filed in Japan as Serial No. 2012-230363 on Oct. 17, 2012, Serial No. 2012-252327 on Nov. 16, 2012, and Serial No. 2013-052623 on Mar. 15, 2013, all of which are incorporated by reference.

BACKGROUND OF THE INVENTION

1. Field of the Invention

The present invention relates to an object, a method, a manufacturing method, a process, a machine, manufacture, or a composition of matter. In particular, one embodiment of the present invention relates to a semiconductor device, a display device, a light-emitting device, a driving method thereof, or a manufacturing method thereof.

In this specification, a semiconductor device generally means a device which can function by utilizing semiconductor characteristics. Electro-optical devices, display devices, memory devices, semiconductor circuits, and electronic devices are in some cases included in semiconductor devices and in other cases include semiconductor devices.

2. Description of the Related Art

Attention has been focused on a technique for forming a transistor using a semiconductor layer (also referred to as a thin film transistor (TFT)). The transistor is applied to a wide range of electronic devices such as an integrated circuit (IC) or an image display device (display device). A silicon-based semiconductor layer is widely known as a semiconductor layer applicable to such a transistor. As another material, an oxide semiconductor layer is attracting attention.

For example, a transistor including an amorphous oxide semiconductor layer containing indium (In), gallium (Ga), and zinc (Zn) in a channel formation region is disclosed (see Patent Document 1).

In a transistor including an oxide semiconductor layer serving as a channel formation region, an oxygen vacancy (also referred to as an oxygen defect) is generated by release of oxygen from the oxide semiconductor layer, and a carrier is generated owing to the oxygen vacancy. It is known that, to solve the above problem, oxygen released from a silicon oxide film containing excess oxygen is supplied to the oxide semiconductor layer to fill the oxygen vacancy in the oxide semiconductor layer, whereby a highly reliable semiconductor device with small change in electrical characteristics can be provided (see Patent Document 2).

REFERENCE

Patent Document

[Patent Document 1] Japanese Published Patent Application No. 2006-165528
[Patent Document 2] Japanese Published Patent Application No. 2012-19207

SUMMARY OF THE INVENTION

In order to achieve high-speed operation, low power consumption, or high integration of a transistor including an oxide semiconductor layer, it is becoming more necessary to miniaturize the transistor. For example, high-speed operation of the transistor can be achieved by shortening the channel length.

However, short channel length of a transistor causes a decrease in threshold voltage, an increase in leakage current, or the like. This is because an electric field of a drain reaches the vicinity of a source when the channel length is short.

In view of the above problem, an object is to provide stable electrical characteristics and high reliability for a miniaturized semiconductor device or the like including an oxide semiconductor layer. Another object is to provide a miniaturized semiconductor device or the like. Another object is to provide a semiconductor device or the like with stable electrical characteristics. Another object is to provide a highly reliable semiconductor device or the like. Further, another object is to provide a method for manufacturing the above semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

A semiconductor device of one embodiment of the present invention includes a base insulating layer; an oxide stack which is over the base insulating layer and includes an oxide layer and an oxide semiconductor layer having an electron affinity higher than that of the oxide layer by 0.1 eV or more; a source electrode layer and a drain electrode layer in contact with the oxide stack; a gate insulating layer over the oxide stack, the source electrode layer, and the drain electrode layer; a gate electrode layer over the gate insulating layer; and an interlayer insulating layer over the gate electrode layer. The oxide semiconductor layer has a low defect density.

For example, the oxide semiconductor layer in the semiconductor device has a spin density of $1.5\times10^{18}$ spins/cm$^3$ or less, preferably $1\times10^{17}$ spins/cm$^3$ or less corresponding to a signal at a g-factor of 1.93 in electron spin resonance (ESR) spectroscopy. Note that the spin density corresponding to a signal at a g-factor of 1.93 in electron spin resonance spectroscopy represents the number of oxygen vacancies in the oxide semiconductor layer. The g-factor corresponding to oxygen vacancies varies depending on, for example, the composition of the oxide semiconductor layer; thus, the g-factor may deviate within a range of about ±5% and is preferably about 1.90 to 1.95.

Further, it is preferable that the gate insulating layer have a spin density of $2\times10^{18}$ spins/cm$^3$ or more, preferably $2\times10^{19}$ spins/cm$^3$ or more corresponding to a signal at a g-factor of 2.001 in electron spin resonance spectroscopy. Note that the spin density corresponding to a signal at a g-factor of 2.001 in electron spin resonance spectroscopy represents the number of dangling bonds in the gate insulating layer. The g-factor varies depending on the composition or the kind of the insulating layer; thus, the g-factor may deviate within a range of about ±5% and is preferably about 2.00 to 2.01.

Thus, one embodiment of the present invention is a semiconductor device including a base insulating layer; an oxide stack including an oxide layer over the base insulating layer and an oxide semiconductor layer having an electron affinity higher than that of the oxide layer by 0.1 eV or more; a source electrode layer and a drain electrode layer in contact with the oxide stack; a gate insulating layer over the oxide stack, the source electrode layer, and the drain electrode layer; a gate electrode layer over the gate insulating layer;

and an interlayer insulating layer over the gate electrode layer. The oxide semiconductor layer has a spin density of $1.5\times10^{18}$ spins/cm$^3$ or less corresponding to a signal at a g-factor of greater than or equal to 1.90 and less than or equal to 1.95 in electron spin resonance spectroscopy. The gate insulating layer has a spin density of $2\times10^{18}$ spins/cm$^3$ or more corresponding to a signal at a g-factor of greater than or equal to 2.00 and less than or equal to 2.01 in electron spin resonance spectroscopy.

In a region including at least the oxide stack and the gate insulating layer in the above semiconductor device, a spin density of $1.5\times10^{12}$ spins/cm$^2$ or less corresponding to a signal at a g-factor of greater than or equal to 1.90 and less than or equal to 1.95 and a spin density of $2\times10^{12}$ spins/cm$^2$ or more corresponding to a signal at a g-factor of greater than or equal to 2.00 and less than or equal to 2.01 are obtained by electron spin resonance spectroscopy.

Thus, one embodiment of the present invention is a semiconductor device including an oxide stack including an oxide layer and an oxide semiconductor layer that is over the oxide layer and has an electron affinity higher than that of the oxide layer by 0.1 eV or more; a gate insulating layer in contact with the oxide stack; and a gate electrode layer overlapping with the oxide stack with the gate insulating layer therebetween. A spin density corresponding to a signal at a g-factor of greater than or equal to 1.90 and less than or equal to 1.95 is $1.5\times10^{12}$ spins/cm$^2$ or less and a spin density corresponding to a signal at a g-factor of greater than or equal to 2.00 and less than or equal to 2.01 is $2\times10^{12}$ spins/cm$^2$ or more in electron spin resonance spectroscopy.

The oxide layer and the oxide semiconductor layer contain at least indium. The proportion of indium in the oxide semiconductor layer is preferably higher than that in the oxide layer. The oxide layer and the oxide semiconductor layer preferably contain at least indium and zinc. Further, the oxide layer and the oxide semiconductor layer preferably contain one or more elements selected from Ga, Fe, Mn, and Co.

The oxide semiconductor layer preferably includes a crystal whose c-axis is aligned in a direction substantially perpendicular to an upper surface of the oxide semiconductor layer.

The concentration of silicon contained in the oxide semiconductor layer is preferably lower than $2\times10^{18}$ atoms/cm$^3$, further preferably lower than $2\times10^{17}$ atoms/cm$^3$.

Another embodiment of the present invention is a method for manufacturing a semiconductor device including the steps of forming a base insulating layer; forming an oxide stack including an oxide semiconductor layer over the base insulating layer; forming a source electrode layer and a drain electrode layer over the oxide stack; forming a gate insulating layer over the oxide stack, the source electrode layer, and the drain electrode layer; forming a gate electrode layer over the gate insulating layer; forming an interlayer insulating layer over the gate electrode layer; and performing heat treatment at a temperature higher than or equal to 300° C. and lower than 450° C. after forming the interlayer insulating layer. The gate insulating layer is formed by a plasma CVD method with the pressure inside a treatment chamber set to higher than or equal to 100 Pa and lower than or equal to 300 Pa.

Further, heat treatment may be performed after formation of the oxide stack. In addition, oxygen may be implanted to the base insulating layer by an ion implantation method.

According to one embodiment of the present invention, a miniaturized transistor including an oxide semiconductor can be formed. Further, the reliability of the transistor can be improved.

BRIEF DESCRIPTION OF THE DRAWINGS

FIGS. 37A1, 37A2, 37B1, 37B2, 37C1, and 37C2 each show the Vg-Id characteristics of a transistor before and after a gate BT stress test.

FIGS. 38A1, 38A2, 38B1, 38B2, 38C1, and 38C2 each show the Vg-Id characteristics of a transistor before and after a gate BT stress test.

FIGS. 39A1, 39A2, 39B1, 39B2, 39C1, and 39C2 each show the Vg-Id characteristics of a transistor before and after a gate BT stress test.

FIG. 40 shows the results of a gate BT stress test performed on transistors.

DETAILED DESCRIPTION OF THE INVENTION

Figure 1A:
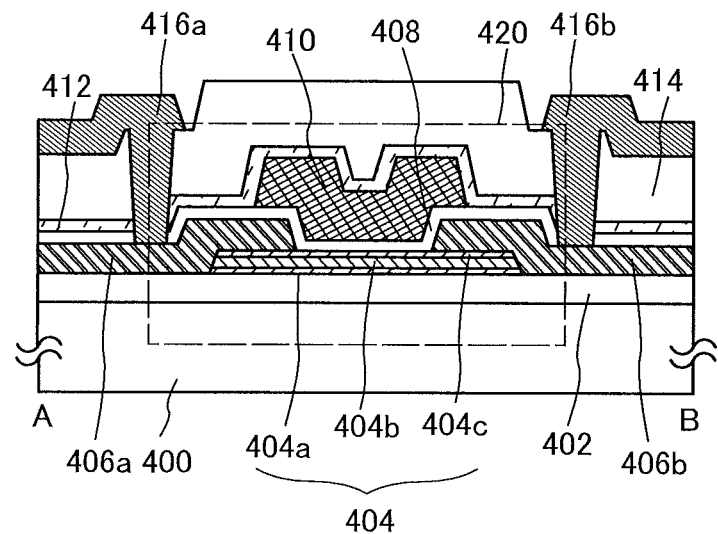
FIGS. 1A and 1B are a cross-sectional view and a top view of a semiconductor device of one embodiment of the present invention.

Hereinafter, embodiments and examples of the present invention will be described in detail with reference to the accompanying drawings. However, the present invention is not limited to the description below, and it is easily understood by those skilled in the art that modes and details thereof can be modified in various ways. Therefore, the present invention is not construed as being limited to description of the embodiments and the examples.

In embodiments hereinafter described, the same parts are denoted with the same reference numerals throughout the drawings in some cases. Note that the thickness, width, relative positional relation, and the like of components, i.e., a layer, a region, and the like, which are illustrated in the drawings are exaggerated for clarification of descriptions of the embodiments in some cases.

Note that the term such as "over" in this specification and the like does not necessarily mean that a component is placed "directly on" another component. For example, the expression "a gate electrode layer over an insulating layer" does not exclude the case where there is an additional component between the insulating layer and the gate electrode layer. The same applies to the term "below".

In this specification and the like, the term "electrode layer" or "wiring layer" does not limit the function of components. For example, an "electrode layer" can be used as part of a "wiring layer", and the "wiring layer" can be used as part of the "electrode layer". In addition, the term "electrode layer" or "wiring layer" can also mean a combination of a plurality of "electrode layers" or "wiring layers", for example.

Functions of a "source" and a "drain" are sometimes replaced with each other when a transistor of opposite polarity is used or when the direction of current flow is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are an electrode and a wiring.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 1000, and accordingly includes the case where the angle is greater than or equal to 85° and less than or equal to 95°.

In this specification, trigonal and rhombohedral crystal systems are included in a hexagonal crystal system.

<Structure of Transistor>

Figure 1B:
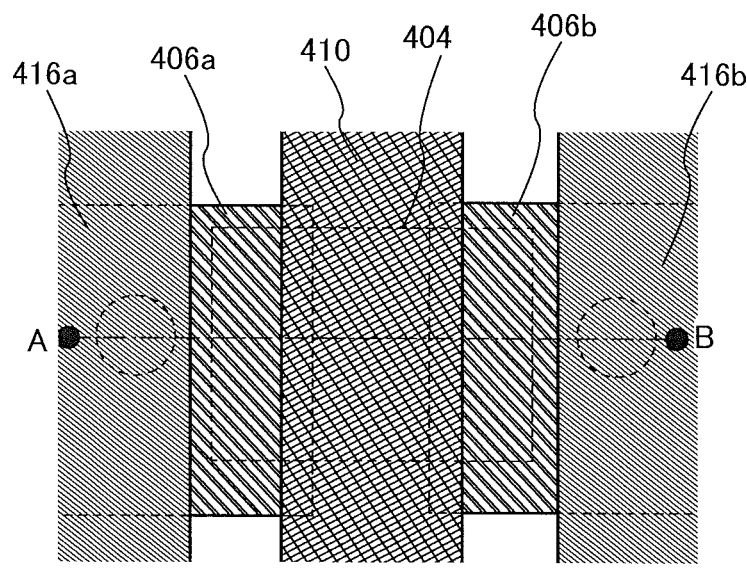

A transistor 420, which is a semiconductor device of one embodiment of the present invention, is described with reference to FIGS. 1A and 1B. FIG. 1B is a top view of the transistor 420 and FIG. 1A is a cross-sectional view taken along dashed-dotted line A-B in FIG. 1B.

The transistor 420 includes a base insulating layer 402 over a substrate 400; an oxide stack 404 including an oxide layer 404a over the base insulating layer 402, an oxide semiconductor layer 404b over the oxide layer 404a, and an oxide layer 404c over the oxide semiconductor layer 404b; a source electrode layer 406a and a drain electrode layer 406b over the oxide stack 404; a gate insulating layer 408 over the oxide stack 404, the source electrode layer 406a, and the drain electrode layer 406b; a gate electrode layer 410 over the gate insulating layer 408; an interlayer insulating layer 412 and an interlayer insulating layer 414 over the gate electrode layer 410; and a source wiring layer 416a and a drain wiring layer 416b connected to the source electrode layer 406a and the drain electrode layer 406b through openings formed in the gate insulating layer 408, the interlayer insulating layer 412, and the interlayer insulating layer 414. Note that a transistor operates as long as it includes at least a semiconductor layer serving as a channel formation region, a gate insulating layer, and a gate electrode layer overlapping with the semiconductor layer with the gate insulating layer provided therebetween. Accordingly, the transistor 420 includes at least the oxide stack 404, the gate insulating layer 408, and the gate electrode layer 410; one or more of the base insulating layer 402, the source electrode layer 406a, the drain electrode layer 406b, the interlayer insulating layer 412, the source wiring layer 416a, and the drain wiring layer 416b may be omitted.

<Oxide Stack>

The oxide stack 404 includes the oxide layer 404a, the oxide semiconductor layer 404b over the oxide layer 404a, and the oxide layer 404c over the oxide semiconductor layer 404b. Here, the oxide stack 404 includes three layers; however, the oxide stack may include two layers or four or more layers as long as the oxide stack is a stack of multiple oxide layers including an oxide semiconductor layer. For example, the oxide stack may be a stack of two layers: an oxide semiconductor layer and an oxide layer which is formed between the oxide semiconductor layer and a gate insulating layer; or an oxide layer formed over a base insulating layer and an oxide semiconductor layer formed over the oxide layer.

Materials are appropriately selected for the oxide stack 404 so that a channel is formed in the oxide semiconductor layer 404b by an electric field of the gate electrode layer 410. With such a structure, the channel can be formed apart from the base insulating layer 402 and the gate insulating layer 408. Thus, entry of an impurity to the channel from the base insulating layer 402 and the gate insulating layer 408 can be prevented. For example, in the case where an insulating layer containing silicon (hereinafter also referred to as a silicon insulating layer), such as a silicon oxide film, a silicon oxynitride film, a silicon nitride oxide film, or a silicon nitride film, is used as each of the base insulating layer 402 and the gate insulating layer 408, silicon contained in the base insulating layer 402 and the gate insulating layer 408 can be prevented from entering the oxide semiconductor layer 404b.

Here, silicon oxynitride means the one that contains more oxygen than nitrogen. For example, silicon oxynitride contains at least oxygen, nitrogen, and silicon at concentrations ranging from greater than or equal to 50 atomic % and less than or equal to 70 atomic %, greater than or equal to 0.5 atomic % and less than or equal to 15 atomic %, and greater than or equal to 25 atomic % and less than or equal to 35 atomic %, respectively. Note that the above ranges are obtained in the case where measurement is performed using Rutherford backscattering spectrometry or hydrogen forward scattering (HFS). In addition, the total of the percentages of the constituent elements does not exceed 100 atomic %.

To form a channel in the oxide semiconductor layer 404b, the oxide stack is preferably structured such that the depth of the bottom of the conduction band from the vacuum level (electron affinity) in the oxide semiconductor layer 404b is greatest in the oxide stack. Accordingly, in the transistor 420, materials are appropriately selected so that the electron affinity of the oxide semiconductor layer 404b is greater than those of the oxide layer 404a and the oxide layer 404c. A difference in electron affinity between the oxide semiconductor layer 404b and the oxide layer 404a and a difference in electron affinity between the oxide semiconductor layer 404b and the oxide layer 404c are each preferably greater than or equal to 0.1 eV, further preferably greater than or equal to 0.15 eV. With such a structure, the bottom of the conduction band in the oxide semiconductor layer 404b has lower energy level than those of the conduction band in the oxide layer 404a and the oxide layer 404c; thus, a current path of the transistor 420 is formed in the oxide semiconductor layer 404b.

<Band Structure of Oxide Stack>

Figure 2:
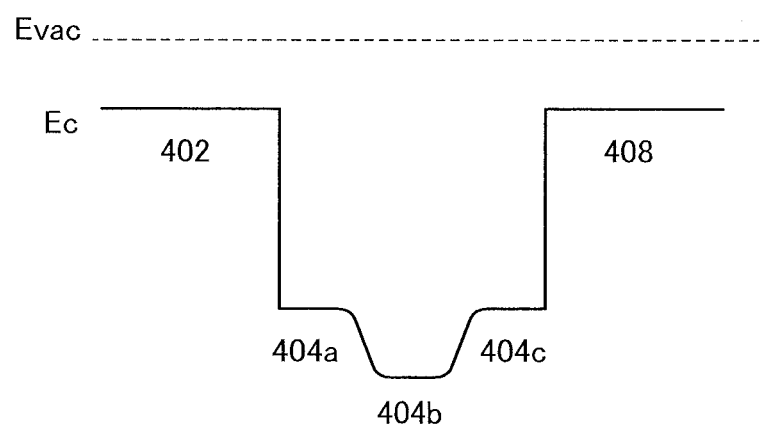
FIG. 2 illustrates a band structure in a semiconductor device of one embodiment of the present invention.

The band structure of the oxide stack 404 is described with reference to FIG. 2. FIG. 2 shows the band structure in the following case: the oxide layer 404a was formed using an In—Ga—Zn oxide having an energy gap of 3.15 eV, the oxide semiconductor layer 404b was formed using an In—Ga—Zn oxide having an energy gap of 2.8 eV, and the oxide layer 404c was formed using an oxide layer whose physical properties are similar to those of the oxide layer 404a. Further, the energy gap in the vicinity of the interface between the oxide layer 404a and the oxide semiconductor layer 404b and the energy gap in the vicinity of the interface between the oxide layer 404c and the oxide semiconductor layer 404b were each 3 eV. The energy gaps were measured using a spectroscopic ellipsometer (UT-300 manufactured by HORIBA JOBIN YVON S.A.S.). The thicknesses of the oxide layer 404a, the oxide semiconductor layer 404b, and the oxide layer 404c were each 10 nm.

FIG. 2 schematically shows a band diagram of the base insulating layer 402, the oxide stack 404, and the gate insulating layer 408. In FIG. 2, the case where silicon oxide films are provided as the oxide layer 404a and the oxide layer 404c is shown. Here, Evac denotes the energy of the vacuum level, and Ec denotes the energies of the bottoms of the conduction band in the base insulating layer 402, the oxide stack 404, and the gate insulating layer 408.

As shown in FIG. 2, the energy of the bottom of the conduction band is changed continuously between the oxide layer 404a, the oxide semiconductor layer 404b, and the oxide layer 404c. This is because oxygen is diffused among the oxide layer 404a, the oxide semiconductor layer 404b, and the oxide layer 404c.

Note that FIG. 2 shows the case where the oxide layers 404a and 404c have similar physical properties; however, the oxide layers 404a and 404c may have different physical properties.

According to FIG. 2, the oxide semiconductor layer 404b of the oxide stack 404 serves as a well and a channel of the transistor including the oxide stack 404 is formed in the oxide semiconductor layer 404b.

Note that when the energy gap between the oxide layer 404a or the oxide layer 404c, and the oxide semiconductor layer 404b is small, an electron in the oxide semiconductor layer 404b might reach the trap level by passing over the energy gap. When an electron is trapped in the trap level, a negative fixed charge is generated; thus, the threshold voltage of the transistor is shifted in the positive direction.

Thus, the energy gap between the oxide layer 404a and the oxide semiconductor layer 404b and the energy gap between the oxide layer 404c and the oxide semiconductor layer 404b are each preferably greater than or equal to 0.1 eV, more preferably greater than or equal to 0.15 eV because the amount of change of the threshold voltage of the transistor is reduced and the transistor has stable electrical characteristics.

The oxide layer 404a and the oxide layer 404c each may be either an insulating film or a film having semiconductor characteristics as long as it has a smaller electron affinity than the oxide semiconductor layer 404b. Note that oxide layers which do not contain an impurity such as silicon or hydrogen as a main component are used as the oxide layer 404a and the oxide layer 404c so that a trap level is not formed at the interface between the oxide semiconductor layer 404b and each of the oxide layer 404a and the oxide layer 404c, which are formed in contact with the oxide semiconductor layer 404b. In particular, when the oxide semiconductor layer 404b contains the same main component as the oxide layer 404a and the oxide layer 404c, interface scattering between the oxide semiconductor layer 404b and each of the oxide layer 404a and the oxide layer 404c can be prevented, leading to a reduction in the number of trap levels.

For example, in the case where the oxide semiconductor layer 404b is formed using an In—Ga—Zn oxide target containing In, Ga, and Zn at an atomic ratio of 1:1:1, the oxide layer 404a and the oxide layer 404c are preferably formed using an In—Ga—Zn oxide target containing In, Ga, and Zn at an atomic ratio of 1:3:2.

<Impurity in Oxide Semiconductor Layer>

It is effective to make the oxide semiconductor layer 404b be a highly purified intrinsic oxide semiconductor so that a transistor including the oxide stack 404 has stable electrical characteristics. Specifically, the carrier density of the oxide semiconductor layer 404b is set to be lower than $1\times10^{17}/$cm$^3$, lower than $1\times10^{15}$/cm$^3$, or lower than $1\times10^{13}$/cm$^3$. In the oxide semiconductor layer 404b, hydrogen, nitrogen, carbon, silicon, and a metal element other than a main component become an impurity. In order to reduce the concentration of impurities in the oxide semiconductor layer 404b, it is preferable to also reduce the concentration of impurities in the oxide layers 404a and 404c which are close to the oxide semiconductor layer 404b to a value almost equal to that in the oxide semiconductor layer 404b.

Particularly when elements such as silicon (Si), germanium (Ge), carbon (C), hafnium (Hf), and titanium (Ti) are contained in the oxide semiconductor layer 404b at a high concentration, an impurity state due to the elements is formed in the oxide semiconductor layer 404b. In some cases, the impurity state becomes a trap, which degrades electrical characteristics of the transistor. In order to prevent degradation of the electrical characteristics of the transistor, the concentration of the elements in the oxide semiconductor layer 404b is set to be lower than $1\times10^{19}$ atoms/cm$^3$, preferably lower than $2\times10^{18}$ atoms/cm$^3$, further preferably lower than $2\times10^{17}$ atoms/cm$^3$. Moreover, the concentrations of the elements at the interface between the oxide layer 404a and the oxide semiconductor layer 404b and the interface between the oxide semiconductor layer 404b and the oxide layer 404c are each set to be lower than $1\times10^{19}$ atoms/cm$^3$, preferably lower than $5\times10^{18}$ atoms/cm$^3$, more preferably lower than $1\times10^{18}$ atoms/cm$^3$.

Further, hydrogen and nitrogen in the oxide semiconductor layer 404b form donor levels, which increase carrier density. In order to make the oxide semiconductor layer 404b intrinsic or substantially intrinsic, the concentration of hydrogen in the oxide semiconductor layer 404b, which is measured by secondary ion mass spectrometry (SIMS), is set to be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen in the oxide semiconductor layer 404b, which is measured by SIMS, is set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Note that when silicon and carbon are contained in the oxide semiconductor layer 404b at a high concentration, the crystallinity of the oxide semiconductor layer 404b is lowered in some cases. In order not to lower the crystallinity of the oxide semiconductor layer 404b, the concentration of silicon in the oxide semiconductor layer 404b is set to be lower than $1\times10^{19}$ atoms/cm$^3$, preferably lower than $5\times10^{18}$ atoms/cm$^3$, more preferably lower than $1\times10^{18}$ atoms/cm$^3$. Moreover, in order not to lower the crystallinity of the oxide semiconductor layer 404b, the concentration of carbon in the oxide semiconductor layer 404b is set to be lower than $1\times10^{19}$ atoms/cm$^3$, preferably lower than $5\times10^{18}$ atoms/cm$^3$, more preferably lower than $1\times10^{18}$ atoms/cm$^3$. Description of the crystallinity of the oxide semiconductor layer 404b will be given later.

When the oxide semiconductor layer 404b contains hydrogen, hydrogen serves as a donor and changes the characteristics of the transistor. Thus, it is preferable that the concentration of hydrogen contained in the oxide semiconductor layer be lower than $5\times10^{18}$ atoms/cm$^3$, preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

<Spin Density of Oxide Semiconductor Layer>

Oxygen vacancies in the oxide semiconductor layer 404b form donors and serve as carriers; thus, when oxygen vacancies are formed in the oxide semiconductor layer, the characteristics of the transistor are changed and the reliability thereof is lowered. Accordingly, the number of oxygen vacancies in the oxide semiconductor layer is preferably reduced. For example, it is preferable that the oxide semiconductor layer have a spin density of $1.5\times10^{18}$ spins/cm$^3$ or less, further preferably $1\times10^{17}$ spins/cm$^3$ or less corresponding to a signal at a g-factor of 1.93 (greater than or equal to 1.90 and less than or equal to 1.95) in electron spin resonance spectroscopy in which a magnetic field is applied in parallel to the film surface. In addition, it is preferable that the oxide semiconductor layer have a spin density per unit area of $1.5\times10^{12}$ spins/cm$^2$ or less, further preferably $1\times10^{11}$ spins/cm$^2$ or less corresponding to the signal at a g-factor of 1.93. Note that the spin density corresponding to a signal at a g-factor of 1.93 in electron spin resonance spectroscopy represents the number of oxygen vacancies in the oxide semiconductor layer. The g-factor corresponding to oxygen vacancies varies depending on, for example, the composition of the oxide semiconductor layer; thus, the g-factor may deviate within a range of about ±5% and may be about 1.90 to 1.95 here. By reducing the number of oxygen vacancies in the oxide semiconductor layer as much as possible, generation of carriers can be reduced. As a result, the transistor can be prevented from having normally-on characteristics, so that the electrical characteristics and reliability of the semiconductor device can be improved.

<Gate Insulating Layer>

It is preferable that the gate insulating layer 408 have a spin density of $2\times10^{18}$ spins/cm$^3$ or more, preferably $2\times10^{19}$ spins/cm$^3$ or more corresponding to a signal at a g-factor of 2.001 (greater than or equal to 2.00 and less than or equal to 2.01) in electron spin resonance spectroscopy. In addition, it is preferable that the gate insulating layer 408 have a spin density per unit area of $2\times10^{12}$ spins/cm$^2$ or more, further preferably $2\times10^{13}$ spins/cm$^2$ or more corresponding to the signal at a g-factor of 2.001. The spin density corresponding to a signal at a g-factor of 2.001 represents the number of dangling bonds in the gate insulating layer 408. The g-factor varies depending on the composition or the kind of the insulating layer; thus, the g-factor may deviate within a range of about ±5% and may be about 2.00 to 2.01 here. The gate insulating layer 408 including a large number of dangling bonds releases a large amount of oxygen by being subjected to heat treatment or the like. Therefore, when the gate insulating layer 408 including a large number of dangling bonds is provided over the oxide semiconductor layer 404b, oxygen released from the gate insulating layer 408 fills the oxygen vacancies in the oxide semiconductor layer 404b; thus, the transistor can have stable electrical characteristics.

When a gate insulating layer including a large number of dangling bonds is used, the electrical characteristics of a transistor become unstable by the effect of the dangling bonds in some cases. However, in the semiconductor device of one embodiment of the present invention, since the oxide layer 404c is provided between the oxide semiconductor layer 404b and the gate insulating layer 408, the transistor can have stable electrical characteristics even with the gate insulating layer 408 including a large number of dangling bonds.

Further, the gate insulating layer 408 over the oxide semiconductor layer 404b is made dense; thus, constituent elements in the oxide semiconductor layer can be prevented from being partly released outside. The density can be evaluated by measuring the wet etching rate of the gate insulating layer, for example. The denser the film is, the lower the wet etching rate is; that is, a denser film is less likely to be etched.

The semiconductor device of one embodiment of the present invention is a semiconductor device in which the defect density in an oxide semiconductor layer is reduced and which has excellent electrical stability. For example, the amount of change in the threshold voltage of the semiconductor device in a gate bias-temperature (BT) stress test is small.

Note that the gate BT stress test is one kind of accelerated test and can evaluate, in a short time, a change in characteristics (i.e., a change with time) of a transistor, which is caused by long-term use. The amount of change in characteristics of the transistor due to the gate BT stress test is an important indicator when examining the reliability of the transistor.

A specific method of the gate BT stress test is described. First, electrical characteristics of a transistor are measured. Next, the temperature of a substrate over which the transistor is formed (substrate temperature) is set at fixed temperature, a pair of electrodes serving as a source and a drain of the transistor are set at a same potential, and a potential different from that of the pair of electrodes serving as a source and a drain is applied to a gate electrode for a certain period. The substrate temperature may be determined as appropriate in accordance with the test purpose. Then, the substrate temperature is set at a temperature similar to that at which the electrical characteristics have been measured, and the electrical characteristics of the transistor are measured again. As a result, a difference in threshold voltage and a difference in shift value between before and after the gate BT stress test can be obtained as the amount of change in the electrical characteristics.

Note that in this specification, the test in the case where the potential applied to the gate electrode is higher than the potentials of the source and the drain is referred to as a positive gate BT stress test, and the test in the case where the potential applied to the gate electrode is lower than the potentials of the source and the drain is referred to as a negative gate BT stress test.

In this specification, in a curve where the horizontal axis represents the gate voltage (Vg; voltage between a source and a gate) and the vertical axis represents the logarithm of drain current (Id), the shift value is defined as a gate voltage at a point of intersection of an extrapolated tangent line of Id having the highest inclination with a straight line of $Id=1\times10^{-12}$ [A]. Note that in this specification, the shift value was calculated with a drain voltage (voltage between a source and a drain) of 10 V.

The number of oxygen vacancies in the oxide semiconductor layer is sufficiently reduced in the semiconductor device of one embodiment of the present invention; thus, even a miniaturized transistor with a short channel length can have excellent electrical stability as the semiconductor device.

<Method for Manufacturing Transistor>

Next, a method of manufacturing the transistor 420 is described.

<Base Insulating Layer>

First, the base insulating layer 402 is formed over the substrate 400. There is no particular limitation on a substrate that can be used, as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used.

A single crystal semiconductor substrate or a polycrystalline semiconductor substrate of silicon, silicon carbide, or the like or a compound semiconductor substrate of silicon germanium or the like may be used as the substrate 400. Alternatively, an SOI substrate, a semiconductor substrate over which a semiconductor element is provided, or the like can be used.

The base insulating layer 402 can be formed by a sputtering method, a molecular beam epitaxy (MBE) method, a chemical vapor deposition (CVD) method, a pulsed laser deposition (PLD) method, an atomic layer deposition (ALD) method, or the like, as appropriate.

An inorganic insulating layer can be used as the base insulating layer 402. It is preferable to use, for example, a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, or an aluminum nitride oxide film. Further, the base insulating layer 402 can be formed with a single-layer structure or a stacked-layer structure including two or more layers with the use of these compounds.

As the base insulating layer 402, a silicon oxide film or a silicon oxynitride film may be formed under the following conditions: a vacuum-evacuated treatment chamber in a plasma CVD apparatus is held at a temperature higher than or equal to 180° C. and lower than or equal to 450° C., preferably higher than or equal to 180° C. and lower than or equal to 350° C.; a source gas is introduced into the treatment chamber; the pressure in the treatment chamber is higher than or equal to 100 Pa and lower than or equal to 250 Pa, preferably higher than or equal to 100 Pa and lower than or equal to 200 Pa; and the high-frequency power supplied to an electrode provided in the treatment chamber is greater than or equal to 1.48 W/cm$^2$ and less than or equal to 2.46 W/cm$^2$, preferably greater than or equal to 1.48 W/cm$^2$ and less than or equal to 1.97 W/cm$^2$.

As the source gas, a deposition gas containing silicon and an oxidation gas are preferably used. Typical examples of the deposition gas containing silicon include silane, disilane, trisilane, and silane fluoride. Examples of the oxidation gas include oxygen, ozone, dinitrogen monoxide, nitrogen dioxide, and dry air.

As deposition conditions, the power density is set high as described above in the treatment chamber under the above pressure, whereby the decomposition efficiency of the source gas in plasma is increased, oxygen radicals are increased, and oxidation of the deposition gas containing silicon is promoted; thus, the amount of oxygen contained in the base insulating layer 402 exceeds that in the stoichiometric composition. However, in the case where the substrate temperature is within the above temperature range, the bond between silicon and oxygen is weak. As a result, an oxide insulating layer which contains oxygen in excess of the stoichiometric composition and from which part of oxygen is released by heating can be formed.

In the source gas of the base insulating layer 402, the ratio of the deposition gas containing silicon to the oxidation gas is increased, and the high-frequency power is set to have the above power density. Thus, the deposition rate can be increased, and the amount of oxygen contained in the base insulating layer 402 can be increased.

After formation of the base insulating layer 402, oxygen may be implanted to the base insulating layer 402.

Here, oxygen atoms are implanted to silicon oxynitride films by an ion implantation method, and the results of detecting a gas ($O_2$; m/z (m: mass, z: charge)=32) by thermal desorption spectroscopy are shown.

First, a method for fabricating samples is described. Thermal oxidation was performed on a silicon substrate in an HCl atmosphere to form a thermal oxide film with a thickness of 100 nm on a surface of the substrate. The thermal oxidation was performed at 950° C. for four hours in a thermal oxidation atmosphere containing HCl at 3 vol % with respect to oxygen.

Next, a 300-nm-thick silicon oxynitride film was formed over the thermal oxide film. For the formation of the silicon oxynitride film, silane with a flow rate of 2.3 sccm and dinitrogen monoxide with a flow rate of 800 sccm as a source gas were supplied to a treatment chamber, and a power of 50 W was supplied with the use of a 27.12 MHz high-frequency power source. Further, the temperature of the silicon substrate at the formation of the silicon oxynitride film was 400° C. After the formation, heat treatment was performed at 450° C. for one hour.

Figure 13:
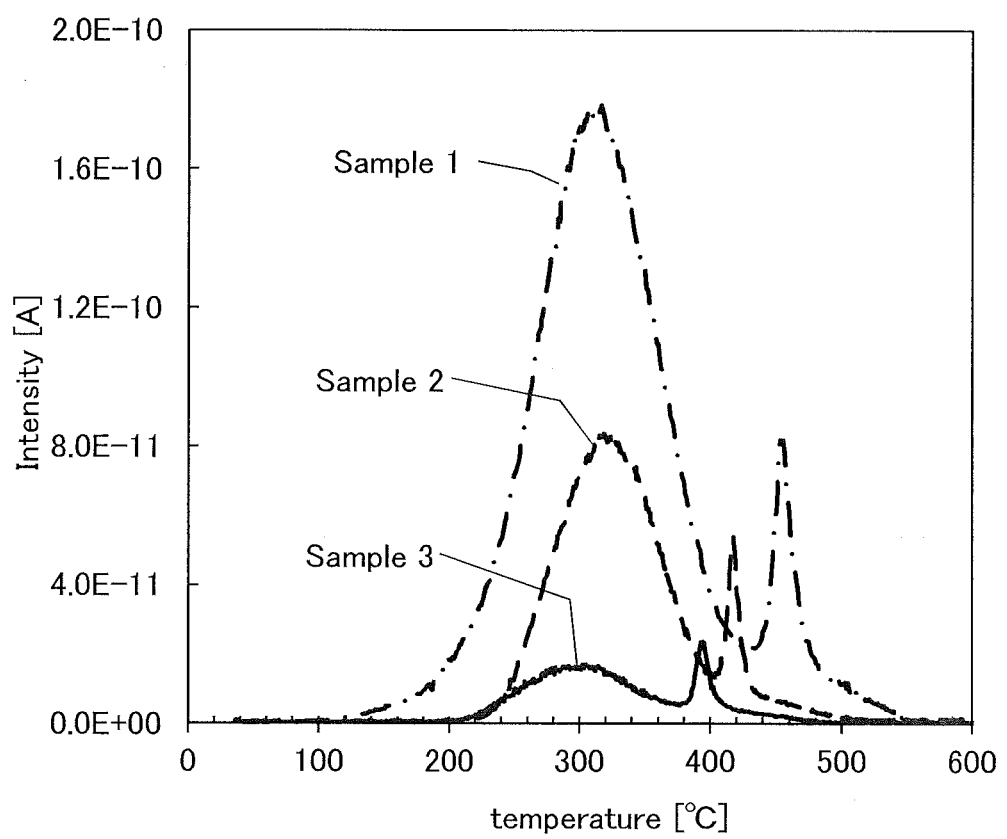
FIG. 13 shows the amount of released oxygen in thermal desorption spectroscopy (TDS).

Next, oxygen atoms were implanted by an ion implantation method to samples obtained in the above manner. Oxygen was implanted under the following conditions: the acceleration voltage was set to 60 kV; and the dosage was set to $2\times10^{16}$ ions/cm$^2$, $1\times10^{16}$ ions/cm$^2$, and $5\times10^{15}$ ions/cm$^2$ for Sample 1, Sample 2, and Sample 3, respectively. FIG. 13 shows the TDS results of the samples. The horizontal axis represents substrate temperature and the vertical axis represents detection intensity in FIG. 13. The dashed-dotted line, the broken line, and the solid line in FIG. 13 show the results of the sample for which the oxygen dosage was set to $2\times10^{16}$ ions/cm$^2$ (Sample 1), the sample for which the oxygen dosage was set to $1\times10^{16}$ ions/cm$^2$ (Sample 2), and the sample for which the oxygen dosage was set to $5\times10^{15}$ ions/cm$^2$ (Sample 3), respectively.

In Sample 1 for which the oxygen dosage was set to $2\times10^{16}$ ions/cm$^2$, oxygen begins to be released at around 100° C., and there are peaks at around 300° C. and around 450° C. In Sample 2 for which the oxygen dosage was set to $1\times10^{16}$ ions/cm$^2$, oxygen begins to be released at around 200° C., and there are peaks at around 300° C. and around 400° C. The amount of released oxygen at the peak at around 300° C. is less than or equal to one-half that in Sample 1 for which the oxygen dosage was set to $2\times10^{16}$ ions/cm$^2$. In Sample 3 for which the oxygen dosage was set to $5\times10^{15}$ ions/cm$^2$, oxygen begins to be released at around 200° C., and there are peaks at around 300° C. and around 400° C. The amount of released oxygen at the peak at around 300° C. is less than or equal to one-half that in Sample 2 for which the oxygen dosage was set to $1\times10^{16}$ ions/cm$^2$ (i.e., less than or equal to one-quarter that in Sample 1). According to FIG. 13, as oxygen dosage is increased, the amount of oxygen released by heat treatment is increased and the temperature at which oxygen begins to be released is lowered. Thus, when a large amount of oxygen is implanted to the base insulating layer 402, more oxygen can be released therefrom at lower temperature.

Note that the base insulating layer 402 is not necessarily provided as long as insulation between the substrate 400 and the oxide semiconductor layer 404b to be formed later can be ensured. That is, when the substrate 400 has a sufficient insulating property, a structure without the base insulating layer 402 may be employed in some cases.

<Oxide Stack>

Figure 3A:
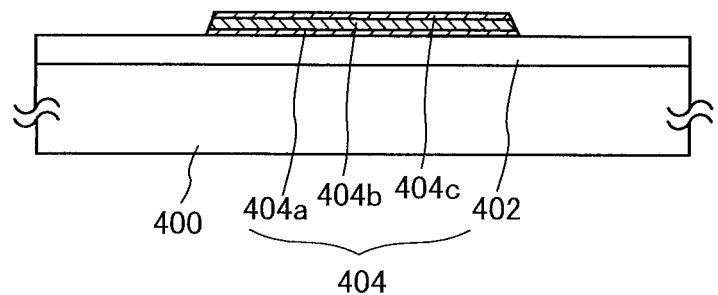
FIGS. 3A to 3D illustrate a method for manufacturing a semiconductor device of one embodiment of the present invention.

Next, the oxide stack 404 including the oxide layer 404a, the oxide semiconductor layer 404b, and the oxide layer 404c is formed over the base insulating layer 402 (see FIG. 3A). An oxide layer which can be used as each of the oxide layer 404a, the oxide semiconductor layer 404b, and the oxide layer 404c preferably contains at least indium (In) or zinc (Zn). Alternatively, both In and Zn are preferably contained. In order to reduce variations in electrical characteristics of the transistors including the oxide layer, the oxide layer preferably contains one or more stabilizers in addition to one of or both In and Zn.

As a stabilizer, gallium (Ga), tin (Sn), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

For the oxide layer 404a, the oxide semiconductor layer 404b, and the oxide layer 404c, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Al—Ga—Zn oxide, an In—Sn—Al—Zn oxide, an In—Sn—Hf—Zn oxide, or an In—Hf—Al—Zn oxide.

Note that here, for example, an "In—Ga—Zn oxide" means an oxide containing In, Ga, and Zn as its main components and there is no particular limitation on the ratio of In, Ga, and Zn. The In—Ga—Zn oxide may contain a metal element other than In, Ga, and Zn.

Alternatively, a material represented by $InMO_3(ZnO)_m$ (m>0 is satisfied, and m is not an integer) may be used. Note that M represents one or more metal elements selected from Ga, Fe, Mn, and Co. Alternatively, a material represented by $In_2SnO_5(ZnO)_n$ (n>0, n is an integer) may be used.

Note that materials are appropriately selected so that the electron affinity of the oxide semiconductor layer 404b is greater than those of the oxide layer 404a and the oxide layer 404c by 0.1 eV or more, preferably 0.15 eV or more. Accordingly, the bottom of the conduction band in the oxide semiconductor layer 404b is deeper from the vacuum level than those of the conduction band in the oxide layer 404a and the oxide layer 404c; thus, a channel is formed in the oxide semiconductor layer 404b by an electric field of the gate electrode layer 410.

An oxide used for each of the oxide layer 404a and the oxide layer 404c contains aluminum, gallium, germanium, yttrium, tin, lanthanum, or cerium such that the proportion of the element in each of the oxide layer 404a and the oxide layer 404c is higher than that in the oxide semiconductor layer 404b. Specifically, the content of any of the above elements in the oxide used for each of the oxide layer 404a and the oxide layer 404c is more than 1.5 times, preferably more than 2 times, further preferably more than 3 times as high as that in the oxide used for the oxide semiconductor layer 404b. The element strongly bonds to oxygen and high energy is needed for forming an oxygen vacancy; thus, an oxygen vacancy is less likely to occur. For this reason, an oxygen vacancy is less likely to occur in the oxide layer 404a and the oxide layer 404c in each of which the proportion of the element is higher than that in the oxide semiconductor layer 404b. This means that the oxide layer 404a and the oxide layer 404c have stable characteristics. Thus, the proportion of the element in each of the oxide layer 404a and the oxide layer 404c is set high, so that a stable interface can be formed between the oxide stack 404 and each of the base insulating layer 402 and the gate insulating layer 408, which results in highly reliability of the semiconductor device.

Note that when the oxide layer 404a is an In-M-Zn oxide, the atomic ratio of In to M is preferably as follows: the percentage of In is lower than 50 atomic % and the percentage of M is higher than or equal to 50 atomic %; further preferably, the percentage of In is lower than 25 atomic % and the percentage of M is higher than or equal to 75 atomic %. When the oxide semiconductor layer 404b is an In-M-Zn oxide, the atomic ratio of In to M is preferably as follows: the percentage of In is higher than or equal to 25 atomic % and the percentage of M is lower than 75 atomic %; further preferably, the percentage of In is higher than or equal to 34 atomic % and the percentage of M is lower than 66 atomic %. When the oxide layer 404c is an In-M-Zn oxide, the atomic ratio of In to M is preferably as follows: the percentage of In is lower than 50 atomic % and the percentage of M is higher than or equal to 50 atomic %; further preferably, the percentage of In is lower than 25 atomic % and the percentage of M is higher than or equal to 75 atomic %.

Note that when the oxide layer 404a and the oxide layer 404c each contain a material represented by $InGa_xZn_yO_z$, it is preferable that X do not exceed 10. An increase in the proportion of gallium in the oxide layer increases the amount of powder substances (also referred to as dust) generated in deposition by RF sputtering, which leads to deterioration in characteristics of a semiconductor device in some cases.

Note that the oxide semiconductor layer and the oxide layers can be formed by, instead of an RF sputtering method in which a high-frequency power source is used as a sputtering power source, a DC sputtering method in which a direct-current power source is used, an AC sputtering method in which an alternating-current power source, or the like. In particular, by a DC sputtering method, dust generated in the deposition can be reduced and the film thickness can be uniform.

The indium content in the oxide semiconductor layer 404b is preferably higher than those in the oxide layer 404a and the oxide layer 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the oxide semiconductor layer 404b, high mobility can be achieved.

To form the oxide stack 404 in which a continuous junction as shown in FIG. 2 (here, a U-shaped well structure where the energy of the bottom of the conduction band is changed continuously between the layers) is formed, instead of merely stacking the oxide layer 404a, the oxide semiconductor layer 404b, and the oxide layer 404c containing the same main component, the stack is formed in such a manner that an impurity for an oxide semiconductor, which forms a defect state such as a trap center or a recombination center or a barrier blocking carrier flow, does not exist at the interfaces between the layers. If there is an impurity between the stacked oxide semiconductor layer and oxide layers, the continuity of the energy band at the interfaces is lost, leading to disappearance of carriers by trapping or recombination in some cases.

To form a continuous junction, it is necessary to stack the layers in succession without exposure to the air using a multi-chamber deposition apparatus (sputtering apparatus) with load lock chambers. Each chamber in the sputtering apparatus is preferably evacuated to high vacuum (about $1\times10^{-4}$ Pa to $5\times10^{-7}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, it is necessary not only to evacuate the chamber to high vacuum but also to highly purify a sputtering gas. A highly purified gas having a dew point of $-40°$ C. or lower, preferably $-80°$ C. or lwer, still preferably $-100°$ C. or lower is used as an oxygen gas or an argon gas which is used as a sputtering gas; thus, entry of moisture or the like to the oxide semiconductor layer can be prevented as much as possible.

Note that the oxide layer 404a, the oxide semiconductor layer 404b, and the oxide layer 404c may have different crystallinities. In other words, a single crystal oxide layer, a polycrystalline oxide layer, an amorphous oxide layer, and the like may be combined as appropriate.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) layer, and the like.

The amorphous oxide semiconductor layer has disordered atomic arrangement and no crystalline component. A typical example thereof is an oxide semiconductor layer in which no crystal part exists even in a microscopic region, and the whole of the layer is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS layer is one of oxide semiconductor layers including a plurality of crystal parts, and most of the crystal parts each fit inside a cube whose one side is less than 100 nm. Thus, there is a case where a crystal part included in the CAAC-OS layer fits inside a cube whose one side is less than 10 nm, less than 5 nm, or less than 3 nm. The density of defect states of the CAAC-OS layer is lower than that of the microcrystalline oxide semiconductor layer. The CAAC-OS layer is described in detail below.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS layer, a peak is not clearly observed even when φ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Further, when an impurity is added to the CAAC-OS layer, the crystallinity in a region to which the impurity is added is changed, and the degree of crystallinity in the CAAC-OS layer varies depending on regions.

Note that when the CAAC-OS layer with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS layer. It is preferable that in the CAAC-OS layer, a peak of 2θ appear at around 31° and a peak of 2θ do not appear at around 36°.

In a transistor using the CAAC-OS layer, change in electrical characteristics due to irradiation with visible light or ultraviolet light is small. Thus, the transistor has high reliability.

Note that an oxide semiconductor layer may be a stacked film including two or more layers of an amorphous oxide semiconductor layer, a microcrystalline oxide semiconductor layer, and a CAAC-OS layer, for example.

A CAAC-OS layer is formed by, for example, a sputtering method using a polycrystalline oxide target. By collision of ions with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like sputtered particle reaches a substrate while maintaining its crystal state, whereby the CAAC-OS layer can be formed. To improve the crystallinity of the CAAC-OS layer, the average grain size of crystal grains included in the polycrystalline oxide target is set to 3 μm or less, preferably 2 μm or less, further preferably 1 μm or less.

The flat-plate-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm. Note that in the flat-plate-like sputtered particle, the plane parallel to the a-b plane may be a regular triangle or a regular hexagon. Here, the term "equivalent circle diameter of a plane" refers to the diameter of a perfect circle having the same area as the plane.

The following conditions are preferably employed in order to form a CAAC-OS layer over an amorphous surface, a surface of an amorphous insulating layer, or a surface of an insulating layer.

By increasing the substrate heating temperature during the deposition, migration of sputtered particles occurs after the sputtered particles reach the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particles reach the substrate, migration occurs on the substrate, so that a flat plane of each flat-plate-like sputtered particle is attached to the substrate. At this time, the sputtered particles are positively charged, thereby being attached to the substrate while repelling each other; thus, the sputtered particles are not stacked unevenly, so that a CAAC-OS layer with a uniform thickness can be deposited.

By reducing the amount of impurities entering the CAAC-OS layer during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

After the CAAC-OS layer is deposited, heat treatment may be performed. The temperature of the heat treatment is higher than or equal to 100° C. and lower than or equal to 740° C., preferably higher than or equal to 200° C. and lower than or equal to 500° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the CAAC-OS layer in a short time. At the same time, the heat treatment in an inert atmosphere may generate oxygen vacancies in the CAAC-OS layer. In such a case, the heat treatment in an oxidation atmosphere can reduce the oxygen vacancies. The heat treatment can further increase the crystallinity of the CAAC-OS layer. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS layer in a shorter time.

By using the above method, a CAAC-OS layer can be formed over an amorphous surface, a surface of an amorphous insulating layer, or a surface of an insulating layer.

Alternatively, the CAAC-OS layer may be formed by the following method.

First, a first oxide semiconductor layer is formed to a thickness of greater than or equal to 1 nm and less than 10 nm. The first oxide semiconductor layer is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor layer becomes a first CAAC-OS layer with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor layer in a short time. At the same time, the heat treatment in an inert atmosphere may generate oxygen vacancies in the first oxide semiconductor layer. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor layer in a shorter time.

The first oxide semiconductor layer with a thickness of greater than or equal to 1 nm and less than 10 nm can be easily crystallized by heat treatment as compared to the case where the first oxide semiconductor layer has a thickness of greater than or equal to 10 nm.

Next, a second oxide semiconductor layer having the same composition as the first oxide semiconductor layer is formed to a thickness of greater than or equal to 10 nm and less than or equal to 50 nm. The second oxide semiconductor layer is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor layer from the first CAAC-OS layer occurs, whereby the second oxide semiconductor layer is turned into a second CAAC-OS layer having high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor layer in a short time. At the same time, the heat treatment in an inert atmosphere may generate oxygen vacancies in the second oxide semiconductor layer. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor layer in a shorter time.

In the above-described manner, a CAAC-OS layer having a total thickness of 10 nm or more can be formed.

A stack of an oxide semiconductor layer and oxide layers which are formed by the above method is partly etched, whereby the oxide layer 404a, the oxide semiconductor layer 404b, and the oxide layer 404c can be formed. Note that the oxide semiconductor layer and the oxide layers to be the oxide layer 404a, the oxide semiconductor layer 404b, and the oxide layer 404c are preferably formed in succession without exposure to the air.

Heat treatment is preferably performed after formation of the oxide stack 404. Heat treatment here may be performed at a temperature higher than or equal to 250° C. and lower than or equal to 650° C., preferably higher than or equal to 300° C. and lower than or equal to 500° C. The heat treatment is performed in an inert gas atmosphere, an atmosphere containing an oxidizing gas at 10 ppm or more, 1% or more, or 10% or more, or under reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the heat treatment, the crystallinity of the oxide semiconductor layer 404b can be improved and impurities such as hydrogen and water can be removed from the oxide stack 404.

Moreover, by the heat treatment, excess oxygen contained in the base insulating layer 402 can be supplied to the oxide semiconductor layer 404b. Supply of oxygen to the oxide semiconductor layer 404b enables hydrogen in the oxide semiconductor layer 404b to be removed.

<Source Electrode Layer and Drain Electrode Layer>

Figure 3B:
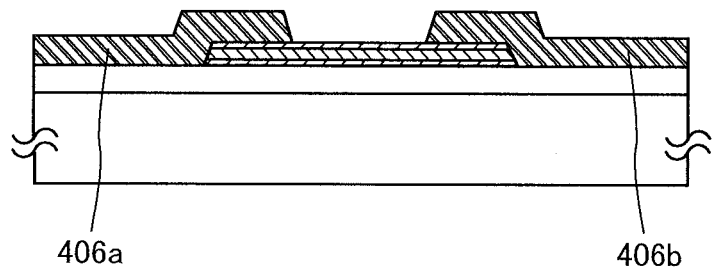

Next, a conductive layer which is to be the source electrode layer 406a and the drain electrode layer 406b is formed and partly etched, whereby the source electrode layer 406a and the drain electrode layer 406b are formed (see FIG. 3B).

The source electrode layer 406a and the drain electrode layer 406b may be formed using a single layer or a stack of a conductive layer containing one or more of aluminum, titanium, chromium, cobalt, nickel, copper, tantalum, and tungsten. Note that the source electrode layer 406a and the drain electrode layer 406b may have the same composition or different compositions.

<Gate Insulating Layer>

Figure 3C:
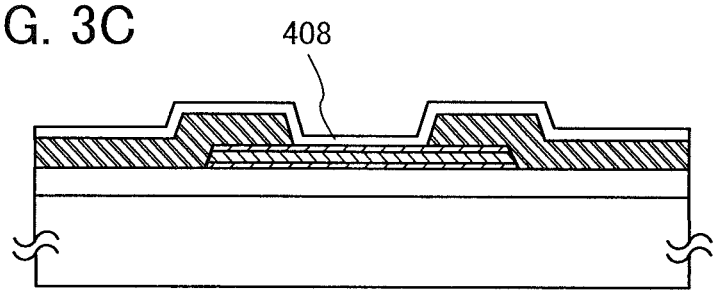

Next, the gate insulating layer 408 is formed over the source electrode layer 406a and the drain electrode layer 406b (see FIG. 3C). The gate insulating layer 408 may be formed using a single layer or a stack of an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

It is preferable to select appropriate conditions so that the oxide stack 404 is not damaged and the defect density in the oxide stack 404 is not increased in forming the gate insulating layer 408. As an example of a way to reduce damage to the oxide stack 404, the gate insulating layer 408 is preferably formed using a plasma CVD apparatus at a high deposition pressure. Specifically, the deposition pressure is preferably set to higher than or equal to 100 Pa and lower than or equal to 300 Pa, further preferably higher than or equal to 100 Pa and lower than or equal to 200 Pa. Increasing the deposition pressure in a reaction chamber enables high-density plasma to be generated, leading to a reduction in plasma damage to the deposition surface.

Further, by increasing the pressure in deposition of the gate insulating layer 408, a semiconductor device with high field-effect mobility and excellent electrical characteristics can be provided.

<Gate Electrode Layer>

Figure 3D:
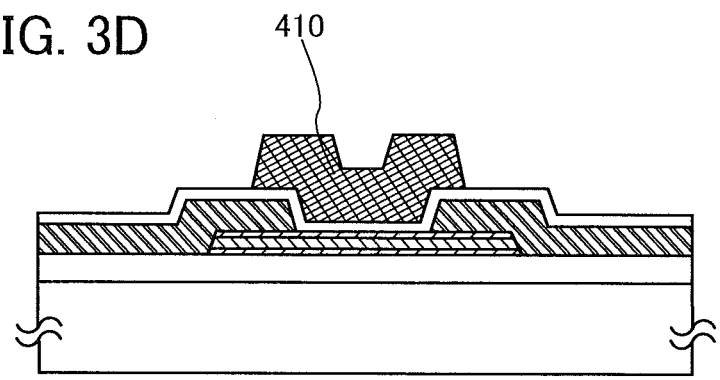

Next, a conductive layer which is to be the gate electrode layer 410 is formed over the gate insulating layer 408 and etched, whereby the gate electrode layer 410 is formed (see FIG. 3D). The gate electrode layer 410 may be formed using a single layer or a stack of a conductive layer containing one or more of aluminum, titanium, chromium, cobalt, nickel, copper, yttrium, zirconium, molybdenum, ruthenium, silver, tantalum, and tungsten.

<Interlayer Insulating Layer>

Figure 4A:
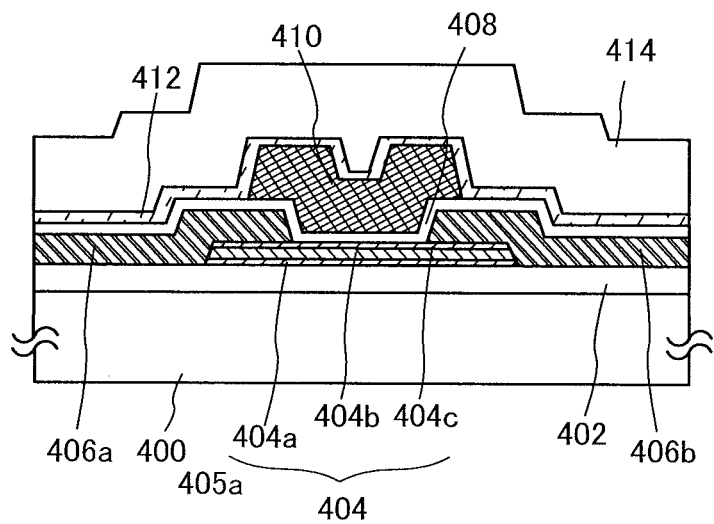
FIGS. 4A and 4B illustrate a method for manufacturing a semiconductor device of one embodiment of the present invention.

Next, the interlayer insulating layer 412 and the interlayer insulating layer 414 are formed over the gate insulating layer 408 and the gate electrode layer 410 (see FIG. 4A). Each of the interlayer insulating layers 412 and 414 may be formed using a single layer or a stack of an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Here, an example in which the interlayer insulating layer 412 and the interlayer insulating layer 414 are stacked is illustrated.

Heat treatment is preferably performed after formation of the interlayer insulating layer 414. Heat treatment makes it possible to fill oxygen vacancies which are formed in the formed oxide semiconductor layer 404b owing to etching, plasma treatment, and the like in the process for forming the source electrode layer 406a, the drain electrode layer 406b, the gate electrode layer 410, and the like.

When heat treatment is performed here, oxygen can be supplied to the oxide semiconductor layer 404b from the base insulating layer 402 or the gate insulating layer 408, or both, so that oxygen vacancies in the oxide semiconductor layer 404b are reduced and the reliability of the transistor can be improved.

Here, the results of analyzing the amount of released oxygen after silicon oxynitride films are subjected to heat treatment are shown.

First, a method for fabricating samples is described. Thermal oxidation was performed on a silicon substrate in an HCl atmosphere to form a thermal oxide film with a thickness of 100 nm on a surface of the substrate. The thermal oxidation was performed at 950° C. for one hour in a thermal oxidation atmosphere containing HCl at 3 vol % with respect to oxygen.

Next, a 300-nm-thick silicon oxynitride film was formed over the thermal oxide film. For the formation of the silicon oxynitride film, silane with a flow rate of 2.3 sccm and dinitrogen monoxide with a flow rate of 800 sccm as a source gas were supplied to a treatment chamber, and a power of 50 W was supplied with the use of a 27.12 MHz high-frequency power source. Further, the temperature of the silicon substrate at the formation of the silicon oxynitride film was 400° C. After the formation, heat treatment was performed at 450° C. for one hour.

Next, oxygen was implanted to the silicon oxynitride film by an ion implantation method. The conditions of the oxygen implantation were as follows: an acceleration voltage of 60 kV and a dosage of $2 \times 10^{16}$ ions/cm$^2$.

A 100-nm-thick In—Ga—Zn oxide layer was formed over the silicon oxynitride film by a sputtering method. Here, the In—Ga—Zn oxide layer was formed under the following conditions: a sputtering target containing In, Ga, and Zn at an atomic ratio of 1:1:1 was used, Ar with a flow rate of 30 sccm and oxygen with a flow rate of 15 sccm were supplied as a sputtering gas to a reaction chamber of a sputtering apparatus, the pressure in the reaction chamber was controlled to 0.4 Pa, and a direct current power of 0.5 kW was supplied. Note that the substrate temperature in the formation of the In—Ga—Zn oxide layer was set at 300° C.

Here, a sample which was not subjected to heat treatment, a sample which was subjected to heat treatment at 450° C. in a nitrogen atmosphere for one hour and then in an oxygen atmosphere for one hour, and a sample which was subjected to heat treatment at 450° C. in a nitrogen atmosphere for one hour and then in an oxygen atmosphere for one hour and then subjected to heat treatment at 400° C. in an oxygen atmosphere for one hour were prepared as Sample A1, Sample A2, and Sample A3, respectively.

Figure 14:
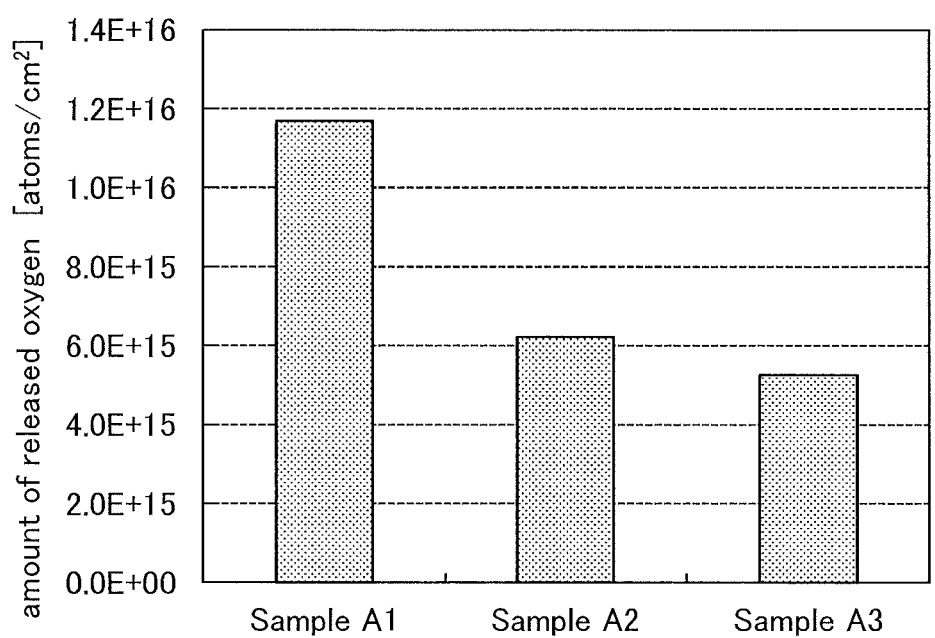
FIG. 14 shows the amount of oxygen released from silicon oxynitride films.

After that, Samples A1 to A3 were subjected to etching with an Al mixed-acid etchant (produced by KANTO CHEMICAL CO., INC.), whereby the In—Ga—Zn oxide was removed, and analyzed by TDS; thus, the amount of oxygen released from the silicon oxynitride films, that is, oxygen contained in the samples were measured. FIG. 14 shows quantitative values of the amount of released oxygen in Samples A1 to A3.

The amount of released oxygen was $1.17 \times 10^{16}$ atoms/cm$^2$ in Sample A1 not subjected to heat treatment, $6.23 \times 10^{15}$ atoms/cm$^2$ in Sample A2 subjected to heat treatment once, and $5.26 \times 10^{15}$ atoms/cm$^2$ in Sample A3 subjected to heat treatment twice.

As shown in FIG. 14, the amount of reduction in oxygen contained in the silicon oxynitride film corresponds to the number of times of heat treatment performed before the TDS analysis. This means that in the case where heat treatment is performed plural times after formation of the oxide semiconductor layer, oxygen is released from the silicon oxynitride film every heat treatment.

Accordingly, by performing heat treatment again after formation of an interlayer insulating layer, oxygen can be supplied to the oxide semiconductor layer again from the silicon oxynitride film (here, the base insulating layer 402) formed under the oxide semiconductor layer. Oxygen supplied here fills oxygen vacancies which are formed in the oxide semiconductor layer in forming the gate insulating layer, the gate electrode layer, and the like, thus stabilizing the characteristics of the oxide semiconductor layer.

Here, the results of analyzing the spin density in an oxide semiconductor layer in the case where a silicon oxynitride film is formed over the formed oxide semiconductor layer and heat treatment is performed are shown.

A method for fabricating samples is described. First, a 300-nm-thick silicon oxynitride film was formed over a quartz substrate. For the formation of the silicon oxynitride film, silane with a flow rate of 2.3 sccm and dinitrogen monoxide with a flow rate of 800 sccm as a source gas were supplied to a treatment chamber, and a power of 50 W was supplied with the use of a 27.12 MHz high-frequency power source. Further, the temperature of the quartz substrate at the formation of the silicon oxynitride film was 400° C. After the formation, heat treatment was performed at 450° C. for one hour.

Next, oxygen was implanted to the silicon oxynitride film by an ion implantation method. The conditions of the oxygen implantation were as follows: an acceleration voltage of 60 kV and a dosage of $2 \times 10^{16}$ ions/cm$^2$.

Then, a 50-nm-thick In—Ga—Zn oxide layer was formed over the silicon oxynitride film by a sputtering method. Here, the In—Ga—Zn oxide layer was formed under the following conditions: a sputtering target containing In, Ga, and Zn at an atomic ratio of 1:1:1 was used, Ar with a flow rate of 30 sccm and oxygen with a flow rate of 15 sccm were supplied as a sputtering gas to a reaction chamber of a sputtering apparatus, the pressure in the reaction chamber was controlled to 0.4 Pa, and a direct current power of 0.5 kW was supplied. Note that the substrate temperature in the formation of the In—Ga—Zn oxide layer was set at 300° C.

Here, heat treatment was performed at 450° C. in a nitrogen atmosphere for one hour and then in an oxygen atmosphere for one hour.

Next, a 20-nm-thick silicon oxynitride film was formed over the In—Ga—Zn oxide layer. The silicon oxynitride film was formed under the following conditions: the quartz substrate was placed in a treatment chamber of a plasma CVD apparatus, silane with a flow rate of 1 sccm and dinitrogen monoxide with a flow rate of 800 sccm as a source gas were supplied to the treatment chamber, and a power of 150 W was supplied with the use of a 60 MHz high-frequency power source. Further, the temperature of the quartz substrate at the formation of the silicon oxynitride film was 350° C. The deposition pressure was 40 Pa, which might not suitable for a gate insulating layer used in a semiconductor device of one embodiment of the present invention.

Here, a sample which was not subjected to heat treatment was prepared as Sample B1. Then, a sample which was subjected to heat treatment at 350° C. in an oxygen atmosphere for one hour was prepared as Sample B2, and a sample which was subjected to heat treatment at 400° C. in an oxygen atmosphere for one hour was prepared as Sample B3.

The samples were subjected to ESR measurement. The ESR measurement was performed under the following conditions: the measurement temperature was room temperature (25° C.), the high-frequency power (power of microwaves) of 9.5 GHz was 20 mW, and the direction of a magnetic field was parallel to a surface of each sample. Note that the lower limit of detection of the spin density corresponding to a signal at a g-factor of 1.93 due to oxygen vacancies in the In—Ga—Zn oxide layer was $1 \times 10^{17}$ spins/cm$^3$.

Figure 15A:
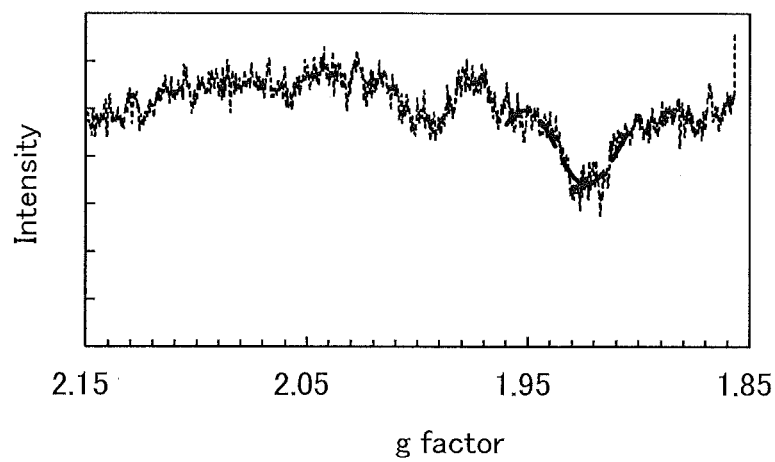
FIGS. 15A to 15C each show the result of ESR measurement performed on an oxide semiconductor layer.
Figure 15B:
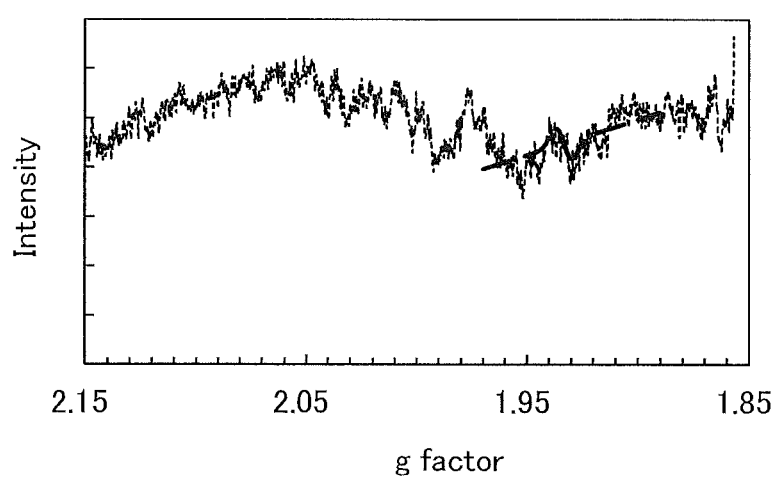
Figure 15C:
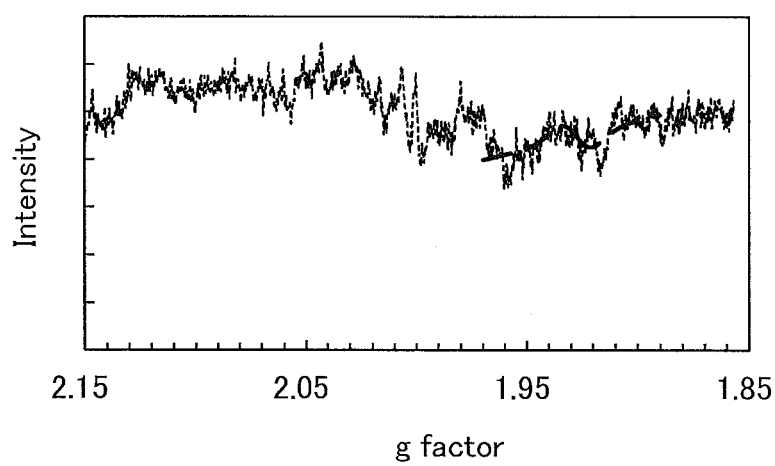

FIGS. 15A to 15C show the results of the ESR measurement. In the graphs shown in FIGS. 15A to 15C, the vertical axis represents a first-order derivative of the absorption intensity of a microwave, and the horizontal axis represents a g-factor. FIG. 15A, FIG. 15B, and FIG. 15C show the results of ESR measurement of Sample B1, Sample B2, and Sample B3, respectively. FIGS. 15A to 15C also show values obtained by fitting with a Gaussian profile at a g-factor of around 1.93 in the measurement results of the samples. In each of FIGS. 15A to 15C, the dotted line indicates the measurement result and the solid line indicates the result of the fitting. The spin density corresponding to the absorption intensity of the microwave was obtained by calculating the integral value of the signal at a g-factor of around 1.93 with the fitted curve.

Figure 16:
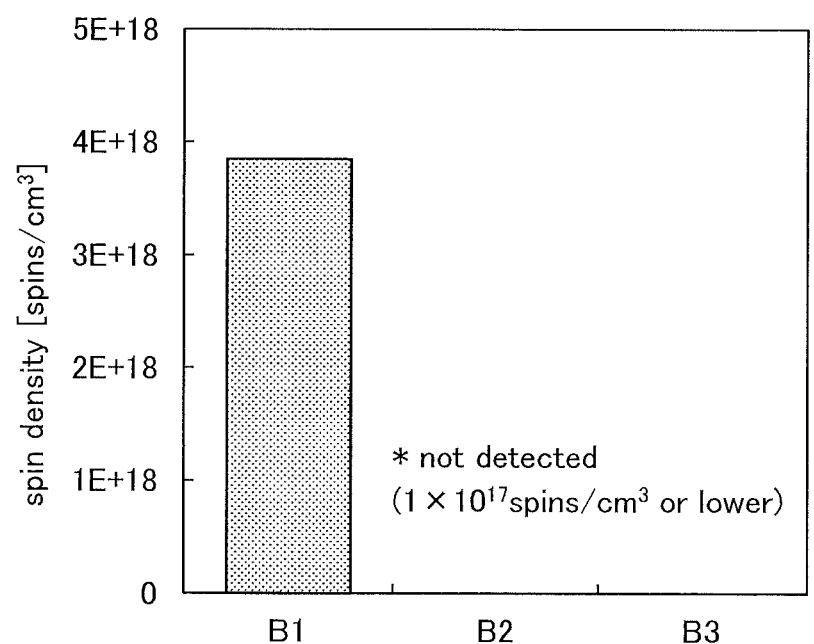
FIG. 16 shows the spin densities of oxide semiconductor layers.

FIG. 16 shows the spin densities. As seen from the result of Sample B1, the spin density in the oxide semiconductor layer was $3.9 \times 10^{18}$ spins/cm$^3$ owing to the formation of the silicon oxynitride film which might not be suitable as a gate insulating layer used in a semiconductor device of one embodiment of the present invention.

However, the spin density was decreased by heat treatment performed after the formation of the silicon oxynitride film, and became less than the lower limit of detection ($1 \times 10^{17}$ spins/cm$^3$) for both Sample B2 and Sample B3. Thus, oxygen vacancies generated in the oxide semiconductor layer after formation of the silicon oxynitride film can be filled by heat treatment performed with the oxide semiconductor layer being in contact with the silicon oxynitride film.

In particular, when a film having a property of blocking oxygen is used as the interlayer insulating layer 412 and heat treatment is performed, oxygen released from the base insulating layer 402 or the gate insulating layer 408, or both is prevented from being released to above the oxide semiconductor layer 404b, so that more oxygen can be supplied to the oxide semiconductor layer 404b.

The heat treatment is preferably performed at a temperature higher than or equal to 300° C. and lower than 450° C., further preferably higher than or equal to 350° C. and lower than or equal to 400° C. Note that when a metal with a high oxygen affinity is used for the source electrode layer 406a and the drain electrode layer 406b which are formed in contact with the oxide stack 404 and heat treatment is performed, the metal might extract oxygen from the oxide stack 404. Thus, the temperature range may be appropriately set so that heat treatment is performed at such a temperature that the amount of oxygen supplied from the base insulating layer 402 and the gate insulating layer 408 is larger than the amount of oxygen extracted to enter the source electrode layer 406a and the drain electrode layer 406b.

The above heat treatment can reduce the number of oxygen vacancies in the oxide semiconductor layer 404b, thus stabilizing the characteristics of the oxide semiconductor layer 404b. In particular, when the channel length of the transistor is shortened, the effect of oxygen vacancies in the oxide semiconductor layer on the characteristics of the transistor becomes greater. Thus, the above heat treatment is performed to reduce the number of oxygen vacancies in the oxide semiconductor layer 404b, so that a highly reliable semiconductor device which can maintain normally-off characteristics can be provided even when the channel length is shortened.

Figure 4B:
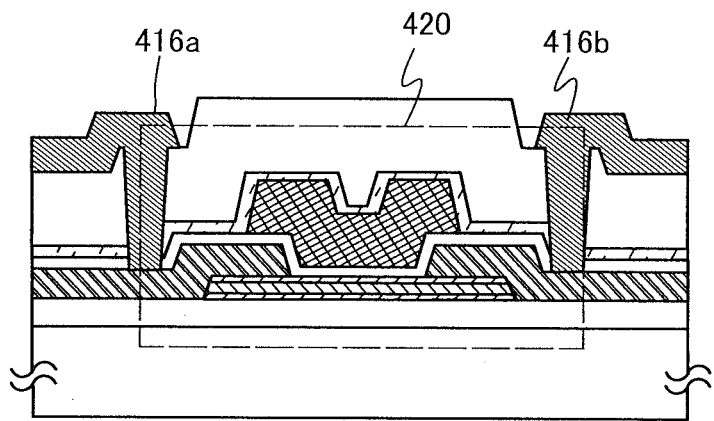

Next, openings are formed in the interlayer insulating layer 414, the interlayer insulating layer 412, and the gate insulating layer 408, a conductive layer is formed in the openings, and the conductive layer is etched; thus, the source wiring layer 416a and the drain wiring layer 416b are formed (see FIG. 4B). The source wiring layer 416a and the drain wiring layer 416b may be formed using a material and a method similar to those for the source electrode layer 406a and the drain electrode layer 406b.

The structure of a semiconductor device of one embodiment of the present invention is not limited to the above structure. For example, the oxide stack 404 may be composed of two layers, the oxide semiconductor layer 404b and the oxide layer 404c, as in a transistor 430 illustrated in FIG. 5A. Note that the other components of the transistor 430 can be similar to those of the transistor 420; thus, detailed description thereof is omitted.

Figure 5A:
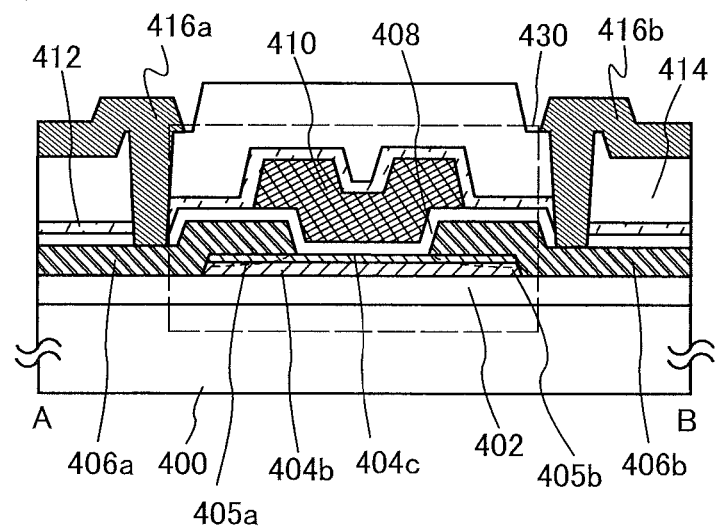
FIGS. 5A to 5C are cross-sectional views each illustrating a semiconductor device of one embodiment of the present invention.

In addition, a source region 405a and a drain region 405b may be formed in the oxide stack 404 as in FIG. 5A. The source region 405a and the drain region 405b are formed in the following manner: in regions of the oxide stack 404 which are in contact with the source electrode layer 406a and the drain electrode layer 406b, oxygen in the oxide stack 404 is easily taken in by a metal such as tungsten and thus oxygen vacancies are generated in a region of the oxide stack 404, the resistance of which is lowered, or a metal in the source electrode layer 406a and the drain electrode layer 406b enters the oxide stack 404 and thus the resistance of a region of the oxide stack 404 where the metal enters is lowered.

Figure 5B:
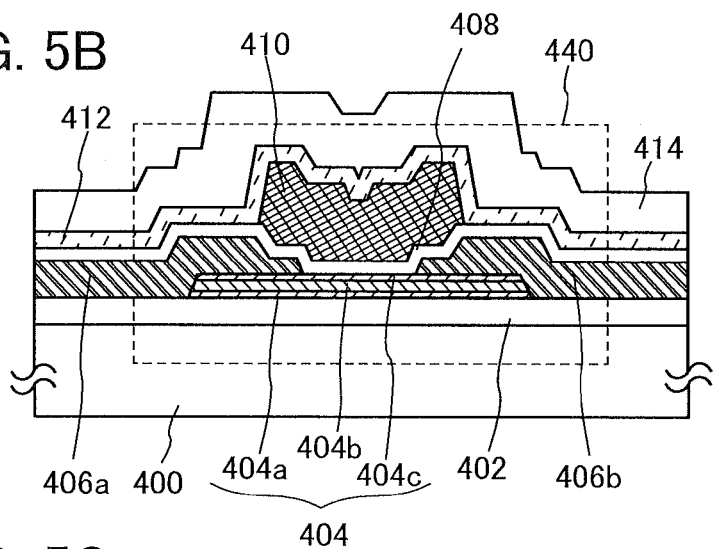

Alternatively, as in a transistor 440 illustrated in FIG. 5B, a periphery portion of the source electrode layer 406a and a periphery portion of the drain electrode layer 406b which overlap with the gate electrode layer 410 may have a stepped shape. The periphery portion having a stepped shape can be formed by a plurality of etching steps (etching involving a reduction (downsizing) in mask and etching using the downsized resist mask). With the stepped shapes of the periphery portions of the source electrode layer 406a and the drain electrode layer 406b, the step coverage with the gate insulating layer 408 can be improved.

Figure 5C:
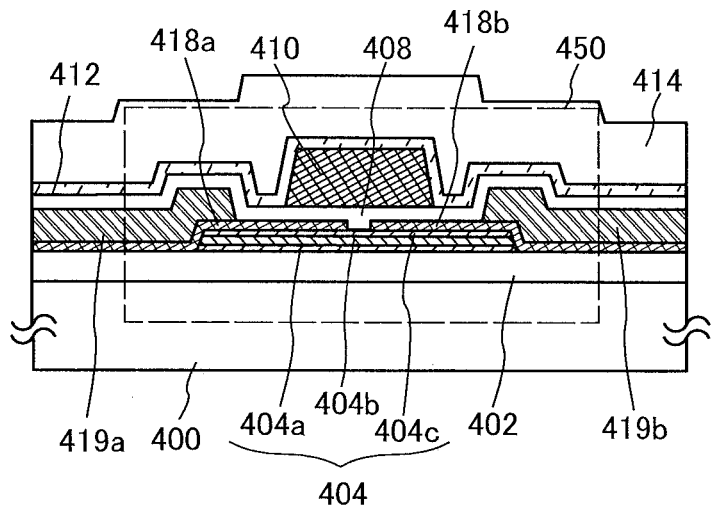

Further alternatively, as in a transistor 450 illustrated in FIG. 5C, the source electrode layer and the drain electrode layer may have a two-layer structure. The transistor 450 illustrated in FIG. 5C includes a first source electrode layer 418a and a first drain electrode layer 418b which determine the channel length, and a second source electrode layer 419a and a second drain electrode layer 419b, which reduce the resistance of the source electrode layer and the drain electrode layer and are provided over the first source electrode layer 418a and the first drain electrode layer 418b.

The distance between the first source electrode layer 418a and the first drain electrode layer 418b corresponds to the channel length of the transistor 450. In order that the channel length of the transistor 450 is less than 50 nm, preferably less than 30 nm, a developed mask which is obtained by exposing a resist with use of an electron beam is preferably used as an etching mask, for example. At this time, in an electron beam writing apparatus capable of electron beam irradiation, it is preferable that irradiation be performed with the minimum beam size set to 2 nm or less.

The thickness of a mask that can be formed by an electron beam is small. For this reason, the first source electrode layer 418a and the first drain electrode layer 418b are preferably formed to have a small thickness in consideration of the coverage of the resist functioning as the mask. However, a reduction in the thickness of the first source electrode layer 418a and the first drain electrode layer 418b makes the resistance high. Accordingly, to reduce the resistance, it is preferable to form the second source electrode layer 419a and the second drain electrode layer 419b which can have a large thickness.

Note that the thick second source electrode layer 419a and second drain electrode layer 419b are formed over the thin first source electrode layer 418a and first drain electrode layer 418b in FIG. 5C; however, it is also possible to form thin source and drain electrode layers over thick source and drain electrode layers.

<Application Example>

Figure 6A:
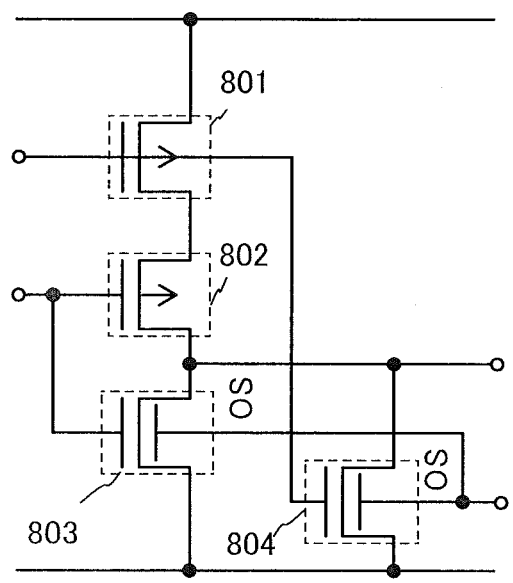
FIGS. 6A and 6B are circuit diagrams each illustrating a semiconductor device of one embodiment of the present invention.
Figure 6B:
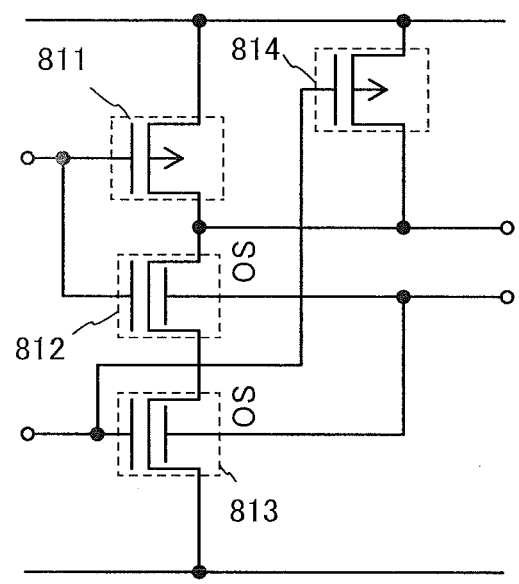

As an example of a semiconductor device, a circuit diagram of a NOR circuit, which is a logic circuit, in which any of the above transistors can be used is illustrated in FIG. 6A. FIG. 6B is a circuit diagram of a NAND circuit.

In the NOR circuit illustrated in FIG. 6A, p-channel transistors 801 and 802 each have a structure in which a single crystal silicon substrate is used for the channel formation region, and n-channel transistors 803 and 804 each have a structure which is similar to the structure of any of the transistors 420, 430, 440, and 450 and in which an oxide semiconductor layer is used for the channel formation region.

In the NOR circuit illustrated in FIG. 6A, a conductive layer controlling the electrical characteristics of the transistor may be provided to overlap with a gate electrode layer with an oxide semiconductor layer provided therebetween in each of the transistors 803 and 804. By controlling the potential of the conductive layer to a potential lower than that of a source, for example, GND (ground potential) or the minimum potential of the circuit, the threshold voltages of the transistors 803 and 804 are increased, so that the transistors can be normally off.

In the NAND circuit illustrated in FIG. 6B, n-channel transistors 812 and 813 each have a structure which is similar to the structure of any of the transistors 420, 430, 440, and 450 and in which an oxide semiconductor layer is used for the channel formation region.

In the NAND circuit illustrated in FIG. 6B, a conductive layer controlling the electrical characteristics of the transistor may be provided to overlap with a gate electrode layer with an oxide semiconductor layer provided therebetween in each of the transistors 812 and 813. By controlling the potential of the conductive layer to a potential lower than that of a source, for example, GND or the minimum potential of the circuit, the threshold voltages of the transistors 812 and 813 are increased, so that the transistors can be normally off.

By using a transistor including an oxide semiconductor for the channel formation region and having extremely small off-state current, power consumption of the semiconductor device can be sufficiently reduced.

The use of any of the transistors 420, 430, 440, and 450 makes it possible to provide a NOR circuit and a NAND circuit which are miniaturized, have high reliability, and show stable characteristics.

An example of a semiconductor device (memory device) which includes any of the above transistors, which can hold stored data even when not powered, and which has an unlimited number of write cycles is described with reference to FIGS. 7A to 7C.

Figure 7A:
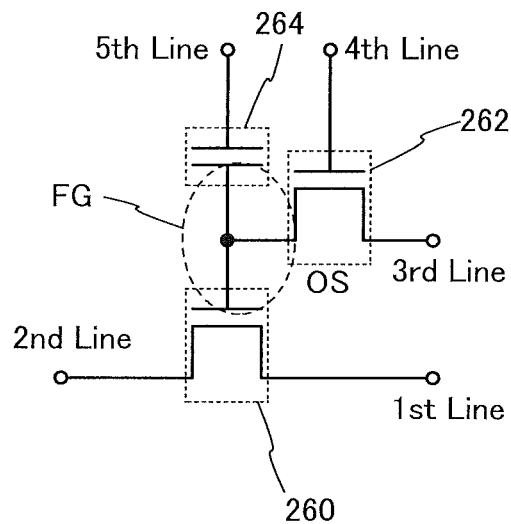
FIGS. 7A to 7C are circuit diagrams and a conceptual diagram each illustrating a semiconductor device of one embodiment of the present invention.

FIG. 7A is a circuit diagram illustrating a semiconductor device.

In a transistor 260 illustrated in FIG. 7A, a channel is formed in a single crystal silicon substrate, and the transistor 260 easily operates at high speed. Any of the transistors 420, 430, 440, and 450 can be employed as a transistor 262, and the transistor 262 enables charge to be held for a long time owing to its characteristics.

Although all the transistors are n-channel transistors here, p-channel transistors can be used as the transistors used for the semiconductor device.

In FIG. 7A, a first wiring (1st Line) is electrically connected to a source electrode layer of the transistor 260, and a second wiring (2nd Line) is electrically connected to a drain electrode layer of the transistor 260. A third wiring (3rd Line) is electrically connected to one of the source electrode layer and the drain electrode layer of the transistor 262, and a fourth wiring (4th Line) is electrically connected to the gate electrode layer of the transistor 262. A gate electrode layer of the transistor 260 and the other of the source electrode layer and the drain electrode layer of the transistor 262 are electrically connected to one electrode of a capacitor 264. A fifth wiring (5th Line) and the other electrode of the capacitor 264 are electrically connected to each other.

The semiconductor device illustrate in FIG. 7A utilizes a characteristic in which the potential of the gate electrode layer of the transistor 260 can be held, and thus enables data writing, holding, and reading as follows.

Writing and holding of data will be described. First, the potential of the fourth wiring is set to a potential at which the transistor 262 is turned on, so that the transistor 262 is turned on. Accordingly, the potential of the third wiring is supplied to the gate electrode layer of the transistor 260 and to the capacitor 264. That is, predetermined charge is supplied to the gate electrode layer of the transistor 260 (writing). Here, charge for supplying either of two different potential levels (hereinafter referred to as low-level charge and high-level charge) is given. After that, the potential of the fourth wiring is set to a potential at which the transistor 262 is turned off, so that the transistor 262 is turned off. Thus, the charge given to the gate electrode layer of the transistor 260 is held (holding).

Since the off-state current of the transistor 262 is extremely low, the charge of the gate electrode layer of the transistor 260 is held for a long time.

Next, reading of data will be described. By supplying an appropriate potential (reading potential) to the fifth wiring while supplying a predetermined potential (constant potential) to the first wiring, the potential of the second wiring varies depending on the amount of charge held at the gate electrode layer of the transistor 260. This is because in general, when the transistor 260 is an n-channel transistor, an apparent threshold voltage $V_{th\_H}$ in the case where the high-level charge is given to the gate electrode layer of the transistor 260 is lower than an apparent threshold voltage $V_{th\_L}$ in the case where the low-level charge is given to the gate electrode layer of the transistor 260. Here, an apparent threshold voltage refers to the potential of the fifth wiring, which is needed to turn on the transistor 260. Thus, the potential of the fifth wiring is set to a potential $V_0$ which is between $V_{th\_H}$ and $V_{th\_L}$, whereby charge given to the gate electrode layer of the transistor 260 can be determined. For example, in the case where the high-level charge is given in writing, when the potential of the fifth wiring is set to $V_0$ ($>V_{th\_H}$), the transistor 260 is turned on. In the case where the low-level charge is given in writing, even when the potential of the fifth wiring is set to $V_0$ ($<V_{th\_L}$), the transistor 260 remains in an off state. Therefore, the data held can be read by measuring the potential of the second wiring.

Note that in the case where memory cells are arrayed to be used, only data of desired memory cells needs to be read. In the case where such reading is not performed, a potential at which the transistor 260 is turned off regardless of the state of the gate electrode layer, that is, a potential lower than $V_{th\_H}$ may be given to the fifth wiring. Alternatively, a potential at which the transistor 260 is turned on regardless of the state of the gate electrode layer, that is, a potential higher than $V_{th\_L}$ may be given to the fifth wiring.

Figure 7B:
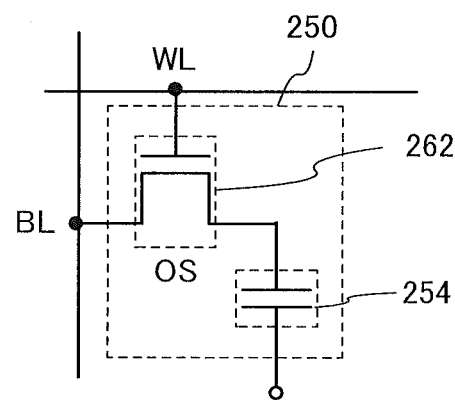

FIG. 7B illustrates another example of one embodiment of a structure of a memory device. FIG. 7B illustrates an example of a circuit configuration of a semiconductor device, and FIG. 7C is a conceptual diagram illustrating an example of a semiconductor device. First, the semiconductor device illustrated in FIG. 7B will be described, and then, the semiconductor device illustrated in FIG. 7C will be described.

In the semiconductor device illustrated in FIG. 7B, a bit line BL is electrically connected to one of the source electrode layer and the drain electrode layer of the transistor 262, a word line WL is electrically connected to the gate electrode layer of the transistor 262, and the other of the source electrode layer and the drain electrode layer of the transistor 262 is electrically connected to a first terminal of a capacitor 254.

Here, the transistor 262 including an oxide semiconductor has extremely low off-state current. For that reason, a potential of the first terminal of the capacitor 254 (or a charge accumulated in the capacitor 254) can be held for an extremely long time by turning off the transistor 262.

Next, writing and holding of data in the semiconductor device (a memory cell 250) illustrated in FIG. 7B will be described.

First, the potential of the word line WL is set to a potential at which the transistor 262 is turned on, so that the transistor 262 is turned on. Accordingly, the potential of the bit line BL is supplied to the first terminal of the capacitor 254 (writing). After that, the potential of the word line WL is set to a potential at which the transistor 262 is turned off, so that the transistor 262 is turned off. Thus, the potential of the first terminal of the capacitor 254 is held (holding).

Because the off-state current of the transistor 262 is extremely small, the potential of the first terminal of the capacitor 254 (or a charge accumulated in the capacitor) can be held for an extremely long period.

Next, reading of data will be described. When the transistor 262 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is represented by $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 7B can hold charge that is accumulated in the capacitor 254 for a long time because the amount of the off-state current of the transistor 262 is extremely small. In other words, power consumption can be sufficiently reduced because refresh operation becomes unnecessary or the frequency of refresh operation can be extremely low. Moreover, stored data can be stored for a long time even when power is not supplied.

Next, the semiconductor device illustrated in FIG. 7C will be described.

Figure 7C:
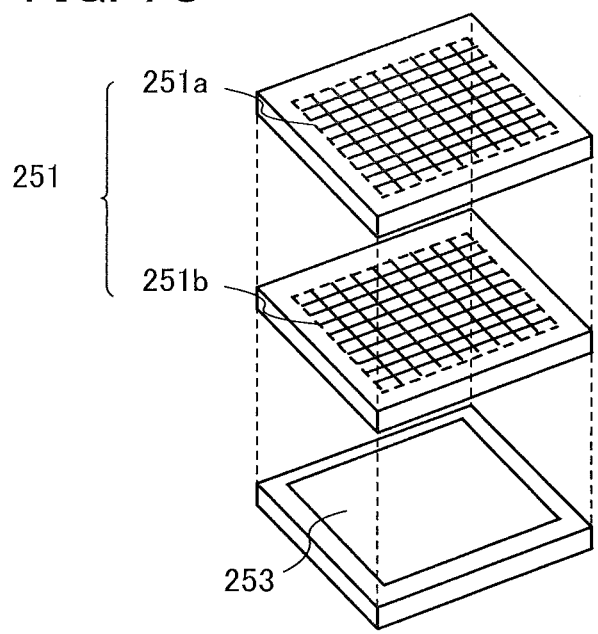

The semiconductor device illustrated in FIG. 7C includes memory cell arrays 251a and 251b including a plurality of memory cells 250 illustrated in FIG. 7B as memory circuits in an upper portion, and a peripheral circuit 253 in a lower portion which is necessary for operating a memory cell array 251 (the memory cell arrays 251a and 251b). Note that the peripheral circuit 253 is electrically connected to the memory cell array 251.

In the structure illustrated in FIG. 7C, the peripheral circuit 253 can be provided directly under the memory cell array 251 (the memory cell arrays 251a and 251b). Thus, the size of the semiconductor device can be reduced.

It is preferable that a semiconductor material of a transistor provided in the peripheral circuit 253 be different from that of the transistor 262. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which need to operate at high speed can be favorably realized by the transistor.

Note that FIG. 7C illustrates, as an example, the semiconductor device in which two memory cell arrays 251 (the memory cell arrays 251a and 251b) are stacked; however, the number of memory cell arrays to be stacked is not limited thereto. Three or more memory cell arrays may be stacked.

When a transistor including an oxide semiconductor in a channel formation region is used as the transistor 262, stored data can be held for a long time. In other words, power consumption can be sufficiently reduced because a semiconductor device in which refresh operation is unnecessary or the frequency of refresh operation is extremely low can be provided.

Further, a transistor which includes an oxide stack and in which an oxide semiconductor layer to be a channel formation region is apart from the surface of the oxide stack is used as the transistor. Thus, a highly reliable semiconductor device that shows stable electrical characteristics can be provided.

Figure 8:
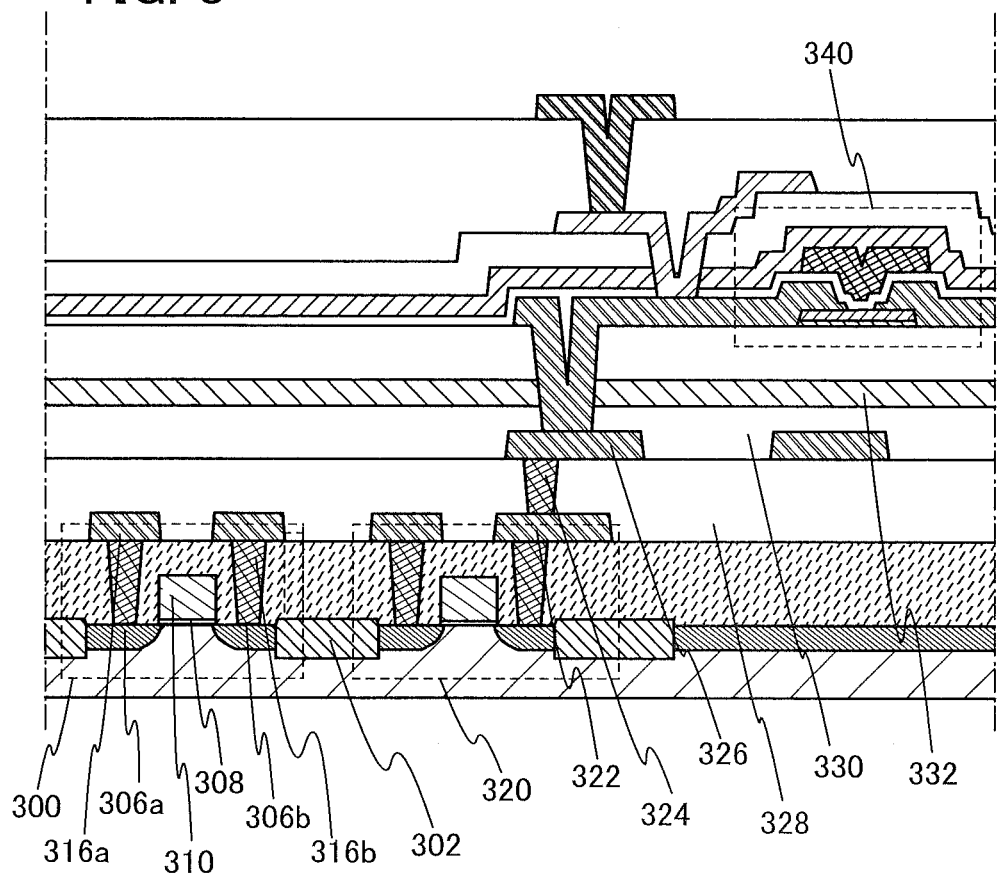
FIG. 8 is a cross-sectional view illustrating a semiconductor device of one embodiment of the present invention.

FIG. 8 illustrates an example of a specific structure of any of the semiconductor devices illustrated in FIGS. 6A and 6B and FIGS. 7A to 7C. FIG. 8 is a cross-sectional view of any of the circuits illustrated in FIGS. 6A and 6B and FIGS. 7A to 7C. The semiconductor device in FIG. 8 includes a transistor 300, a transistor 320, and a transistor 340. The transistor 300 and the transistor 320 are each a transistor in which a channel is formed in a single crystal silicon substrate. The transistor 340 is a transistor in which a channel is formed in an oxide semiconductor. The structure of any of the transistors 420, 430, 440, and 450 can be applied to the transistor 340. Note that in FIG. 8, the transistor 440 illustrated in FIG. 5B is used as the transistor 340; however, another transistor may be used.

The transistor 300 and the transistor 320 are each a transistor obtained by forming an element isolation insulating layer 302 in a silicon substrate and forming a region to be a channel formation region in a region surrounded by the element isolation insulating layer 302. A gate insulating layer 308 and a gate electrode layer 310 are formed to overlap with the channel formation region. A source region 306a and a drain region 306b are formed in contact with the channel formation region, and a source electrode layer 316a and a drain electrode layer 316b are formed in contact with the source region 306a and the drain region 306b.

Although the above structure is shown as an example of the structure of each of the transistors 300 and 320, a known structure of a transistor can be applied to the transistors 300 and 320.

An insulating layer 328, an insulating layer 330, and an insulating layer 332 are formed over the transistors 300 and 320. The insulating layer 332 serves as a protective film which prevents entry of an impurity such as silicon or hydrogen to an oxide semiconductor layer in the transistor 340 from the transistors 300 and 320. The insulating layer 330 prevents entry of oxygen or the like included in the transistor 340 to the transistors 300 and 320.

A conductive layer 322, a conductive layer 324, a conductive layer 326, and the like are formed in openings provided in the insulating layers, and the drain electrode layer 316b of the transistor 320 is electrically connected to a drain electrode of the transistor 340 through the conductive layers.

As illustrated in FIG. 8, the transistor 320 and the transistor 340 partly overlap with each other; thus, the area needed for the circuit can be reduced and high integration can be achieved.

Although the variety of films such as the metal film, the semiconductor layer, and the inorganic insulating film which are described in the above embodiment can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the metal film, the semiconductor layer, and the inorganic insulating film which are described in the above embodiment can be formed by a thermal CVD method such as a MOCVD method or an ALD method. For example, in the case where an InGaZnO$_x$ (X>0) film is formed, trimethylindium, trimethylgallium, and diethylzinc are used. Note that the chemical formula of trimethylindium is (CH$_3$)$_3$In. The chemical formula of trimethylgallium is (CH$_3$)$_3$Ga.

The chemical formula of diethylzinc is (CH$_3$)$_2$Zn. Without limitation to the above combination, triethylgallium (chemical formula: (C$_2$H$_5$)$_3$Ga) can be used instead of trimethylgallium and dimethylzinc (chemical formula: (C$_2$H$_5$)$_2$Zn) can be used instead of diethylzinc.

For example, in the case where a hafnium oxide film is formed, two kinds of gases, i.e., ozone (O$_3$) as an oxidizer and a source gas which is obtained by vaporizing a solvent and liquid containing a hafnium precursor compound (a hafnium alkoxide solution, typically tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed, two kinds of gases, e.g., H$_2$O as an oxidizer and a source gas which is obtained by vaporizing a solvent and liquid containing an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionato).

For example, in the case where a silicon oxide film is formed, hexadichlorosilane is adsorbed on a surface where a film is to be formed, chlorine contained in the adsorbate is removed, and radicals of an oxidizing gas (e.g., O$_2$ or dinitrogen monoxide) are supplied to react with the adsorbate.

For example, in the case where a tungsten film is formed using a deposition apparatus employing ALD, a WF$_6$ gas and a B$_2$H$_6$ gas are sequentially introduced plural times to form an initial tungsten film, and then a WF$_6$ gas and an H$_2$ gas are introduced at a time, so that a tungsten film is formed. Note that an SiH$_4$ gas may be used instead of a B$_2$H$_6$ gas.

For example, in the case where an oxide semiconductor film, e.g., an InGaZnO$_x$ (X>0) film is formed using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Further, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Instead of an In(CH$_3$)$_3$ gas, an In(C$_2$H$_5$)$_3$ may be used. Furthermore, a Zn(CH$_3$)$_2$ gas may be used.

<Electronic Device>

Examples of application of any of the semiconductor devices described above to electronic devices such as a smartphone or an e-book reader will be described with reference to FIG. 9, FIG. 10, FIG. 11, and FIGS. 12A and 12B.

Figure 9:
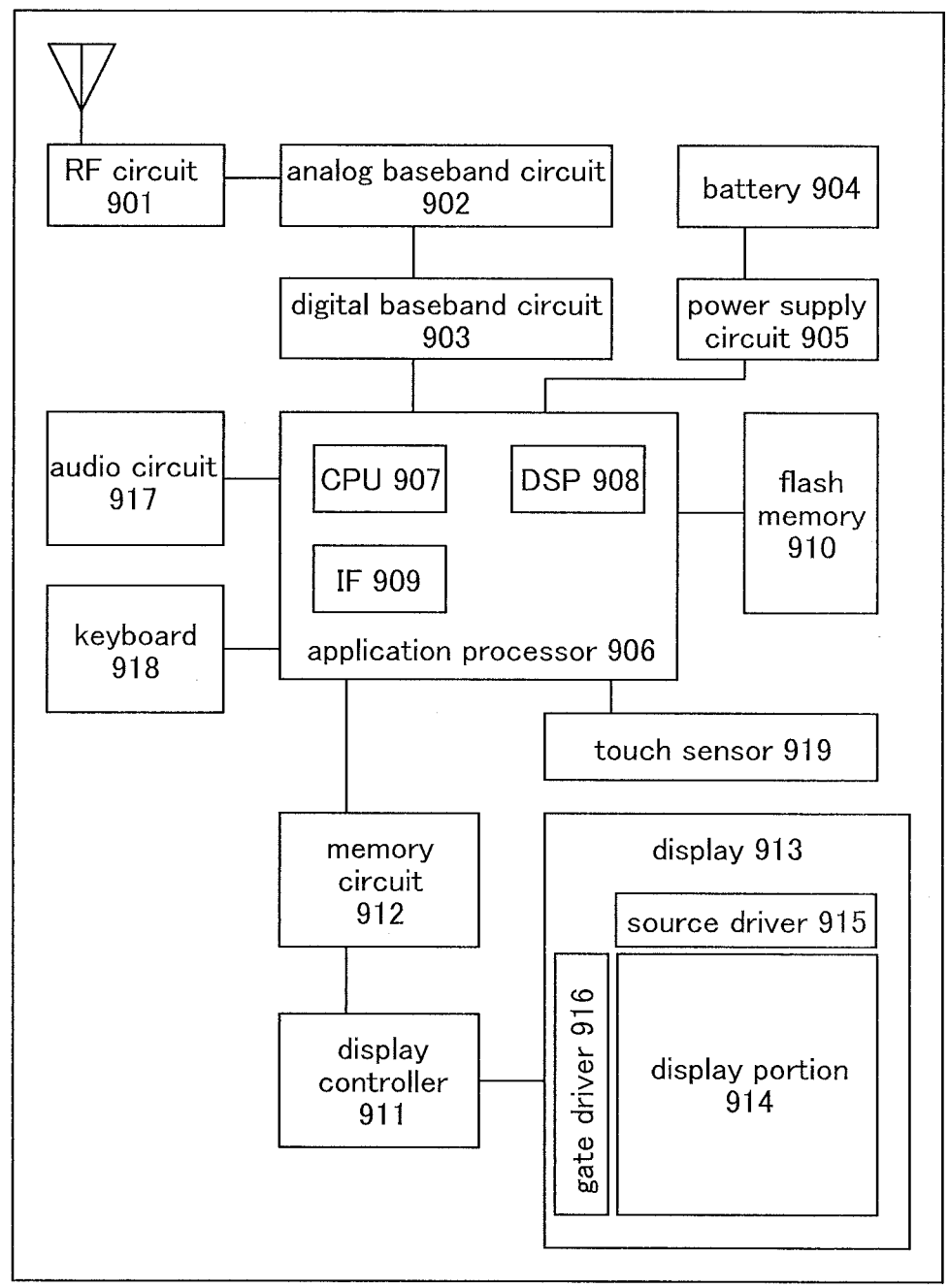
FIG. 9 is a block diagram illustrating a semiconductor device of one embodiment of the present invention.

FIG. 9 is a block diagram of an electronic device. An electronic device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described above for the memory circuit 912, it is possible to provide a highly reliable electronic device in which writing and reading of data can be performed at high speed, data can be held for a long time, and power consumption can be sufficiently reduced.

Figure 10:
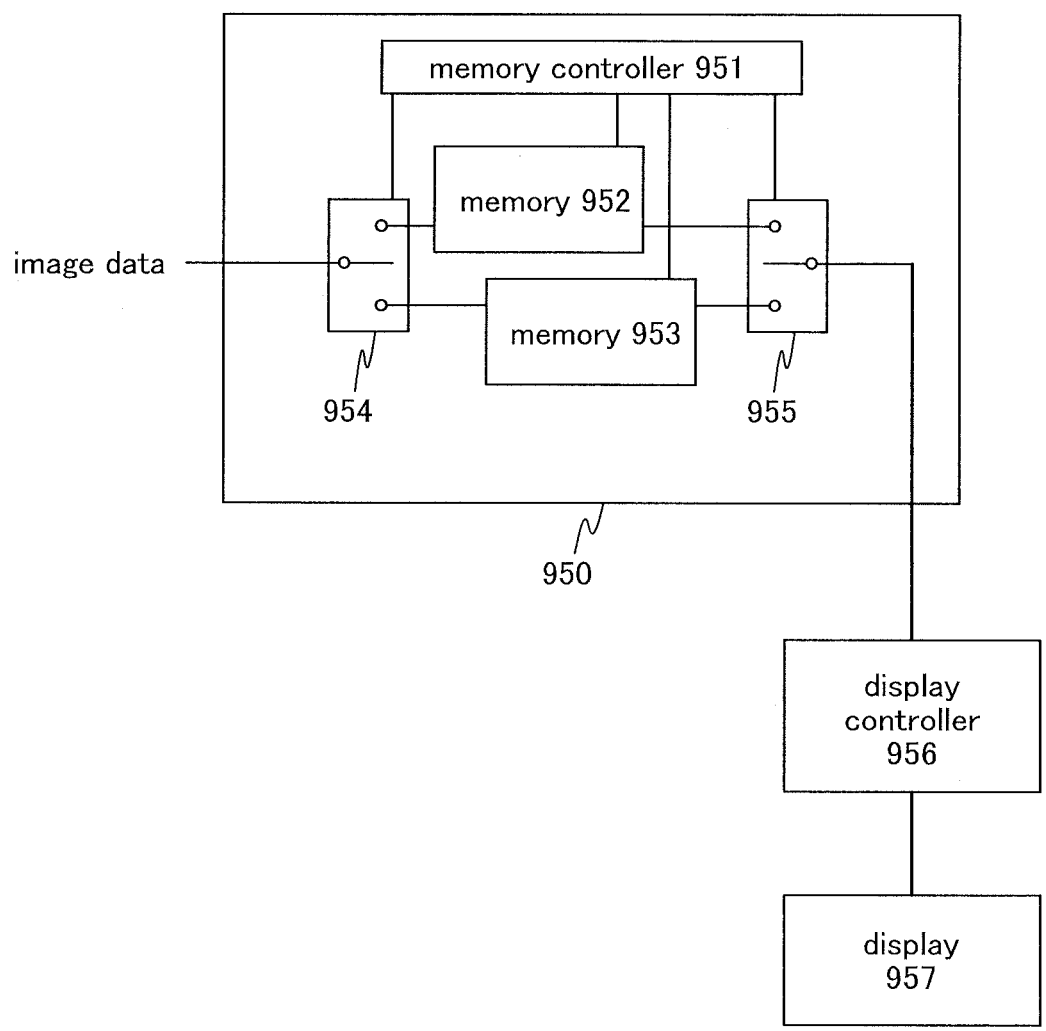
FIG. 10 is a block diagram illustrating a semiconductor device of one embodiment of the present invention.

FIG. 10 illustrates an example in which any of the semiconductor devices described above is used for a memory circuit 950 in a display. The memory circuit 950 illustrated in FIG. 10 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is stored in the memory 952 through the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing any of the semiconductor devices described above for the memory 952 and the memory 953, writing and reading of data can be performed at high speed, data can be held for a long time, and power consumption can be sufficiently reduced. Further, a semiconductor device which is hardly affected by entry of water, moisture, and the like from the outside and has high reliability can be provided.

Figure 11:
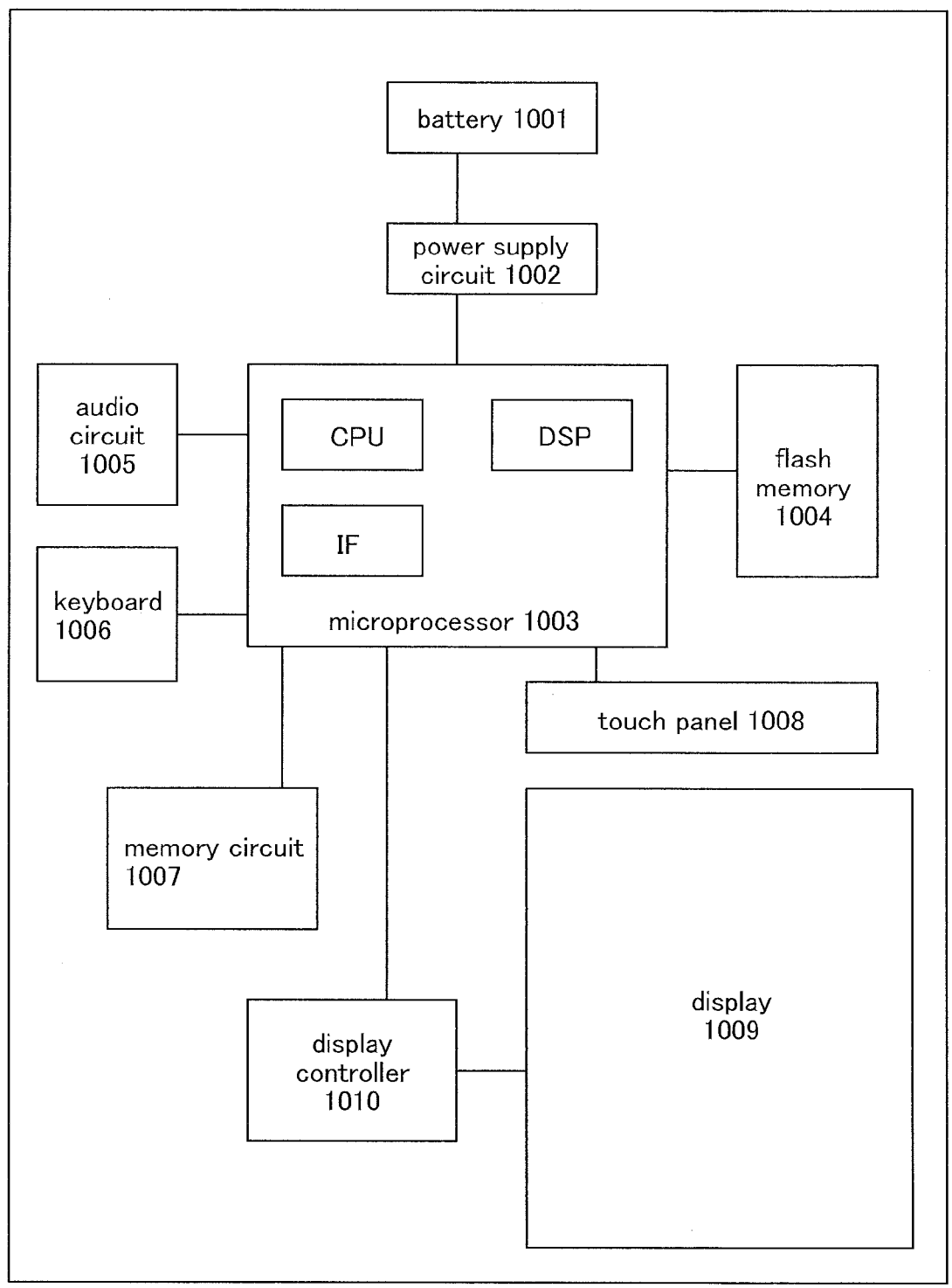
FIG. 11 is a block diagram illustrating a semiconductor device of one embodiment of the present invention.

FIG. 11 is a block diagram of an e-book reader. The e-book reader in FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, any of the semiconductor devices described above can be used for the memory circuit 1007 in FIG. 11. The memory circuit 1007 has a function of temporarily holding the contents of a book. For example, when a user uses a highlight function, the memory circuit 1007 stores and holds data of a portion specified by the user. Note that the highlight function is used to make a difference between a specific portion and the other portions while reading an e-book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing any of the semiconductor devices described above, data can be written and read at high speed and held for a long time, and power consumption can be sufficiently reduced. Further, a semiconductor device which is hardly affected by entry of water, moisture, and the like from the outside and has high reliability can be provided.

Figure 12A:
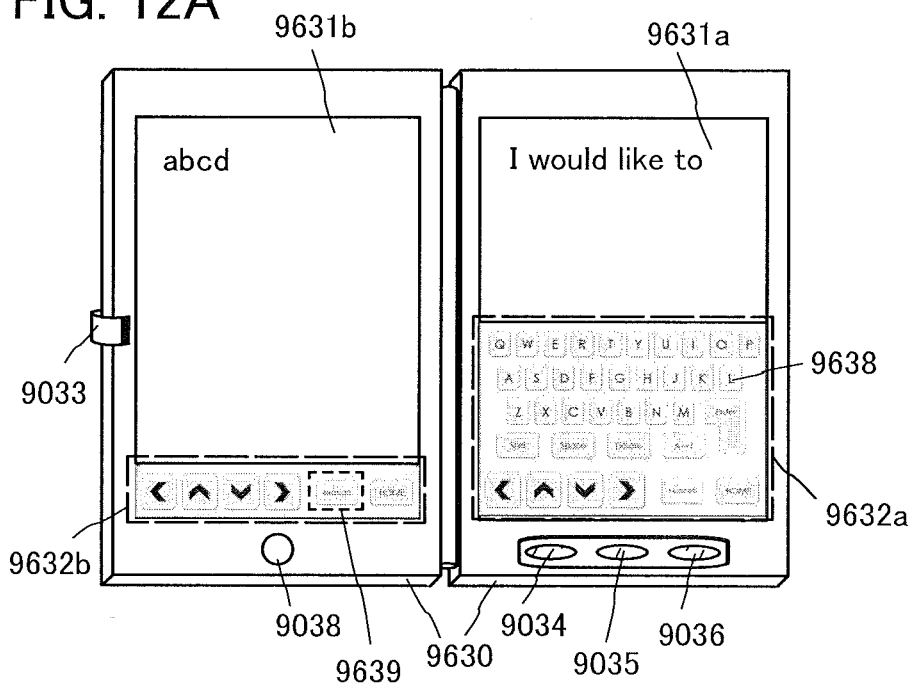
FIGS. 12A and 12B illustrate an electronic device including a semiconductor device of one embodiment of the present invention.
Figure 12B:
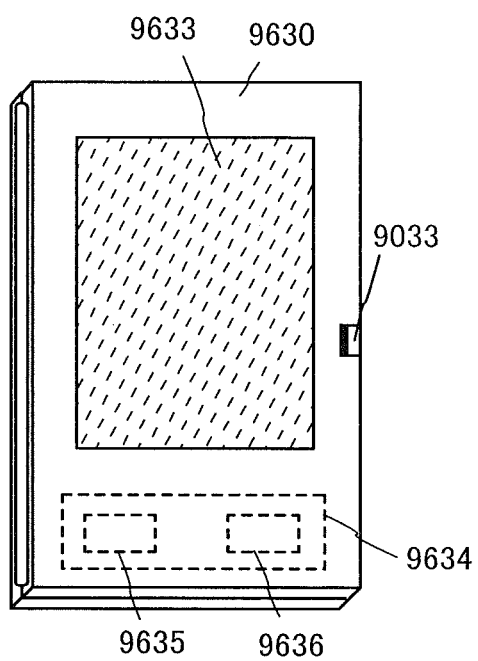

FIGS. 12A and 12B illustrate a specific example of an electronic device. FIGS. 12A and 12B illustrate a foldable tablet terminal. The tablet terminal is opened in FIG. 12A. The tablet terminal includes a housing 9630, a display portion 9631a, a display portion 9631b, a display mode switch 9034, a power switch 9035, a power saver switch 9036, a clasp 9033, and an operation switch 9038.

Any of the above semiconductor devices can be used for the display portion 9631a and the display portion 9631b, so that the tablet terminal can have high reliability. Further, the above semiconductor devices may be used in combination as appropriate.

Part of the display portion 9631a can be a touch panel region 9632a, and data can be input by touching operation keys 9638 that are displayed. Although a structure in which a half region in the display portion 9631a has only a display function and the other half region also has a touch panel function is shown as an example, the display portion 9631a is not limited to the structure. For example, the display portion 9631a can display a keyboard in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Although the display portion 9631a and the display portion 9631b have the same display area in FIG. 12A, one embodiment of the present invention is not limited to this structure. The display portion 9631a and the display portion 9631b may have different areas or different display quality. For example, one of them may be a display panel that can display higher-definition images than the other.

The tablet terminal is closed in FIG. 12B. The tablet terminal includes the housing 9630, a solar cell 9633, a charge and discharge control circuit 9634, a battery 9635, and a DCDC converter 9636. In FIG. 12B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 12A and 12B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

EXAMPLE 1

In this example, silicon oxynitride films which can be used as a gate insulating layer included in a semiconductor device of one embodiment of the present invention were fabricated, and characteristics thereof were evaluated.

First, a method for fabricating samples is described.

A 100-nm-thick silicon oxynitride film was formed over a quartz substrate. The silicon oxynitride film was formed under the following conditions: the substrate was placed in a treatment chamber of a plasma CVD apparatus, silane with a flow rate of 1 sccm and dinitrogen monoxide with a flow rate of 800 sccm as a source gas were supplied to the treatment chamber, and a power of 150 W was supplied with the use of a 60 MHz high-frequency power source. Further, the temperature of the substrate at the formation of the silicon oxynitride film was 350° C. Note that the plasma CVD apparatus used in this example is a parallel-plate plasma CVD apparatus in which the electrode area is 615 cm$^2$ and the density of power applied to a wafer is $2.4\times10^{-1}$ W/cm$^2$.

Here, the silicon oxynitride film was deposited at a pressure of 200 Pa for Sample C1, 100 Pa for Sample C2, and 40 Pa for Comparative Sample C3. Sample C1 and Sample C2 are silicon oxynitride films deposited at pressures greater than or equal to 100 Pa, which are conditions suitable for a gate insulating layer included in a semiconductor device of one embodiment of the present invention. On the other hand, Comparative Sample C3 is a silicon oxynitride film deposited under a condition which is not suitable for a gate insulating layer included in a semiconductor device of one embodiment of the present invention.

Next, the samples were subjected to ESR measurement. In the ESR measurement performed at a predetermined temperature, a value of a magnetic field (H$_0$) where a microwave is absorbed is used for an equation g=hv/βH$_0$; thus, a parameter "g-factor" can be obtained. Note that the frequency of the microwave is denoted by v, and the Planck constant and the Bohr magneton are denoted by, respectively, h and β, which are both constants.

Here, the ESR measurement was performed under the following conditions. The measurement temperature was room temperature (25° C.), the high-frequency power (power of microwaves) of 9.5 GHz was 20 mW, and the direction of a magnetic field was parallel to a surface of each sample. The spin density corresponding to a signal at a g-factor of 2.001 due to dangling bonds in the silicon oxynitride film was measured. The lower limit of detection was $1\times10^{17}$ spins/cm$^3$ ($1\times10^{11}$ spins/cm$^2$ per unit area).

Figure 17A:
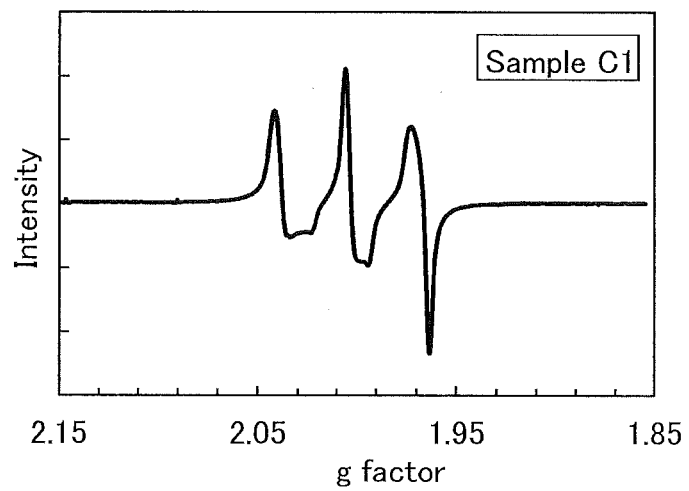
FIGS. 17A to 17C each show the result of ESR measurement performed on a silicon oxynitride film.
Figure 17B:
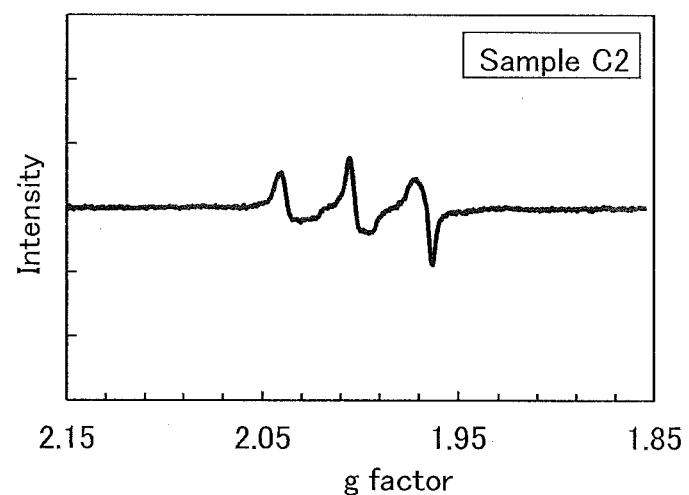
Figure 17C:
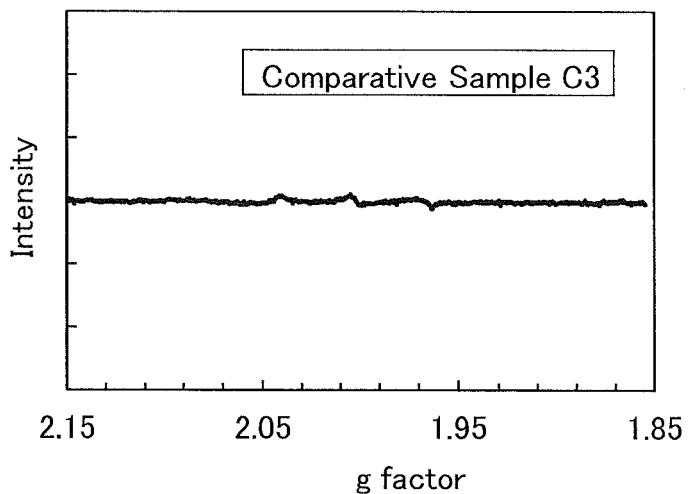

FIGS. 17A to 17C show the results of the ESR measurement performed on Sample C1, Sample C2, and Comparative Sample C3. FIG. 17A, FIG. 17B, and FIG. 17C show the results of ESR measurement of Sample C1, Sample C2, and Comparative Sample C3, respectively. In the graphs shown in FIGS. 17A to 17C, the vertical axis represents a first-order derivative of the absorption intensity of a microwave, and the horizontal axis represents a g-factor.

Next, the integrated intensity of the signal at a g-factor of around 2.001 in the spectrum shown in each of FIGS. 17A to 17C was calculated. Then, the number of spins was obtained from the ratio of the calculated integrated intensity to that of a standard sample and the number of spins in the standard sample. The obtained number of spins was divided by the volume of the film, whereby the spin density corresponding to the absorption intensity of the microwave was calculated.

Figure 18:
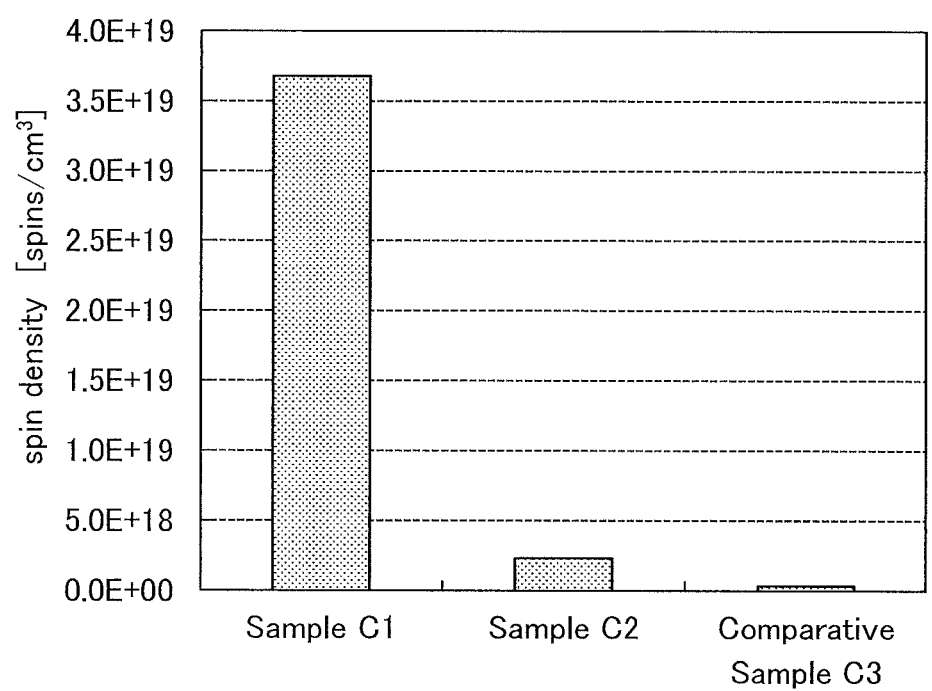
FIG. 18 shows the spin densities of silicon oxynitride films.

FIG. 18 shows the spin density in each sample. The spin density was $3.7\times10^{19}$ spins/cm$^3$ ($3.7\times10^{13}$ spins/cm$^2$ per unit area) in Sample C1, $2.3\times10^{18}$ spins/cm$^3$ ($2.3\times10^{12}$ spins/cm$^2$ per unit area) in Sample C2, and $3.5\times10^{17}$ spins/cm$^3$ ($3.5\times10^{11}$ spins/cm$^2$ per unit area) in Comparative Sample C3. That is, the lower the deposition pressure is, the lower the spin density in the silicon oxynitride film is. Sample C1 and Sample C2 are silicon oxynitride films each having a spin density of $2\times10^{18}$ spins/cm$^3$ or more ($2\times10^{12}$ spins/cm$^2$ or more per unit area) corresponding to the signal at a g-factor of 2.001 (greater than or equal to 2.00 and less than or equal to 2.01), which can be suitably used for a semiconductor device of one embodiment of the present invention. The higher the density of spins detected in the silicon oxynitride film is, the larger the number of oxygen vacancies formed in the silicon oxynitride film is. In other words, the density of spins detected in the silicon oxynitride film is proportional to the number of oxygen vacancies formed in the silicon oxynitride film. This means that Sample C1 and Sample C2 in this embodiment release oxygen to an oxide semiconductor layer more easily than Comparative Sample C3.

Figure 19:
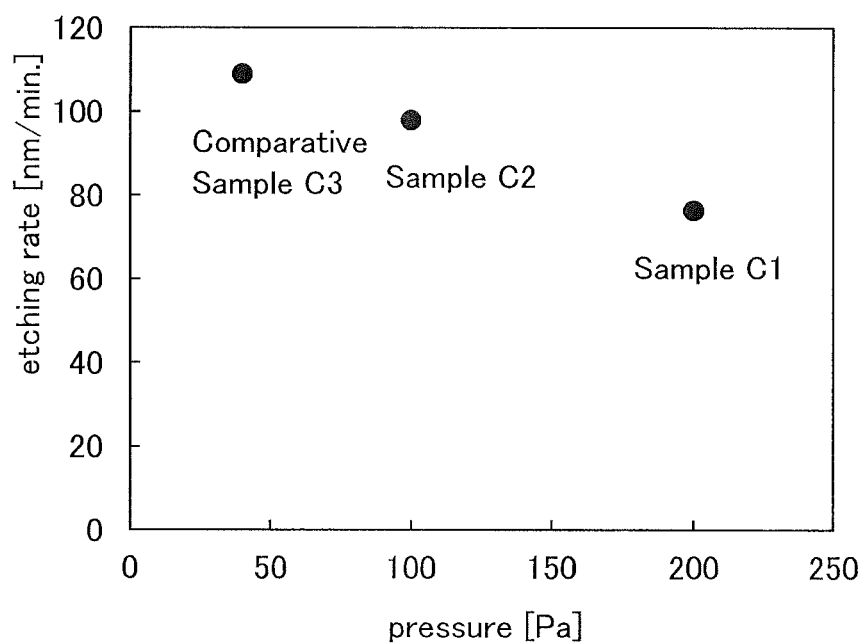
FIG. 19 shows the etching rates of silicon oxynitride films.

Next, the wet etching rate of each sample was measured. Etching was performed at 20° C. using a mixed solution containing 6.7% ammonium hydrogen fluoride (NH$_4$HF$_2$) and 12.7% ammonium fluoride (NH$_4$F) (product name: LAL 500, produced by Stella Chemifa Corporation) as an etchant. FIG. 19 shows the relation between the deposition pressure and the wet etching rate of the silicon oxynitride film. In FIG. 19, the horizontal axis represents the pressure in deposition of silicon oxynitride film and the vertical axis represents the wet etching rate of silicon oxynitride film.

Here, the wet etching rate of Comparative Sample C3 (deposition pressure: 40 Pa) was 108.9 [nm/min], the wet etching rate of Sample C2 (deposition pressure: 100 Pa) was 97.9 [nm/min], and the wet etching rate of Sample C1 (deposition pressure: 200 Pa) was 76.4 [nm/min]. The results show that as the deposition pressure is increased, the etching rate is decreased and a denser film is formed.

Figure 20:
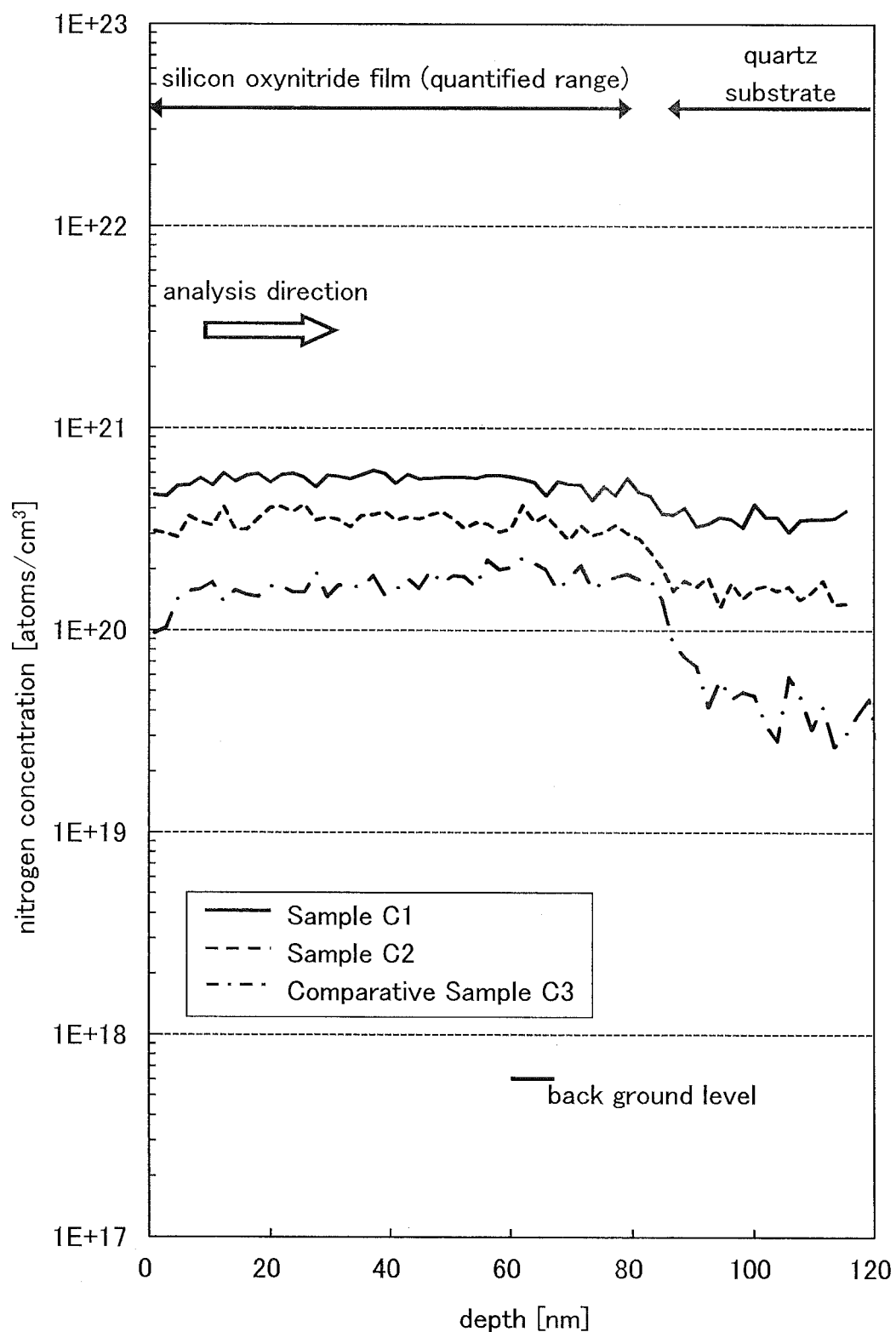
FIG. 20 shows the results of measuring nitrogen concentrations in silicon oxynitride films by SIMS.

Next, the nitrogen concentration in the depth direction in each sample was analyzed by SIMS. The results are shown in FIG. 20. The solid line, the broken line, and the dashed-dotted line show the results of Sample C1, Sample C2, and Comparative Sample C3, respectively. The SIMS analysis was performed by using a PHI ADEPT-1010 quadrupole SIMS instrument manufactured by ULVAC-PHI, Inc.

In FIG. 20, the nitrogen concentration in each silicon oxynitride film is quantified. Each sample was analyzed from the upper surface side. Note that the depth represented by the horizontal axis in FIG. 20 was not actually measured but was estimated from the etching rate of a standard sample.

The average nitrogen concentration in a region (depth: 20 nm to 60 nm) that is less affected by an interface was $5.7\times10^{20}$ atoms/cm$^3$ in Sample C1, $3.6\times10^{20}$ atoms/cm$^3$ in Sample C2, and $1.7\times10^{20}$ atoms/cm$^3$ in Comparative Sample C3. By comparing the nitrogen concentrations in the samples, it was found that Sample C1 had the highest nitrogen concentration and Comparative Sample C3 had the lowest nitrogen concentration.

EXAMPLE 2

In this example, silicon oxynitride films which can be used as a gate insulating layer included in a semiconductor device of one embodiment of the present invention were fabricated, and characteristics thereof were evaluated.

A 100-nm-thick silicon oxynitride film was formed over a silicon substrate. Conditions for forming the silicon oxynitride film were similar to those in Example 1. Here, the silicon oxynitride film was deposited at a pressure of 200 Pa for Sample F1, 100 Pa for Sample F2, and 40 Pa for Comparative Sample F3.

Figure 21A:
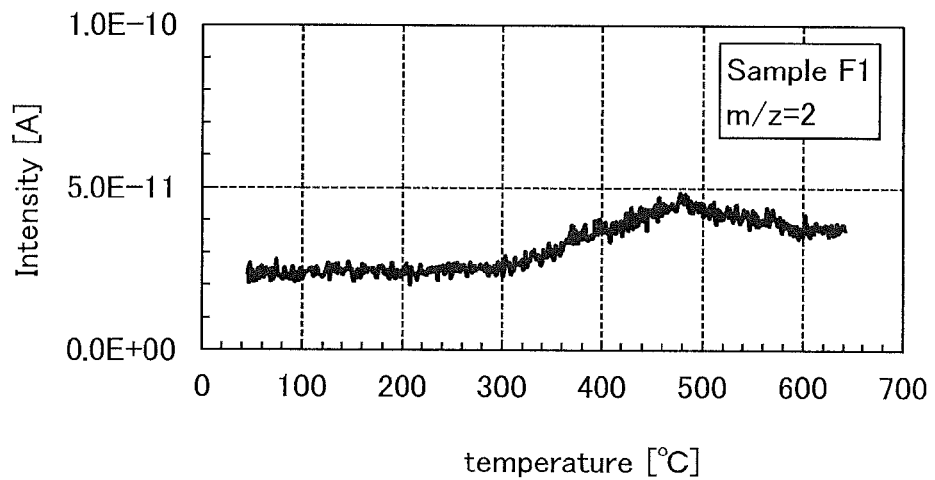
FIGS. 21A to 21C each show the amount of released hydrogen in TDS.
Figure 21B:
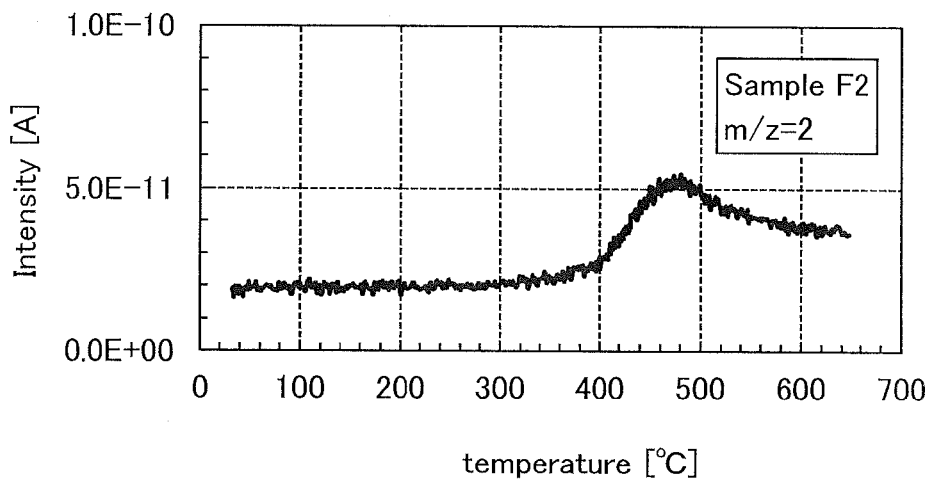
Figure 21C:
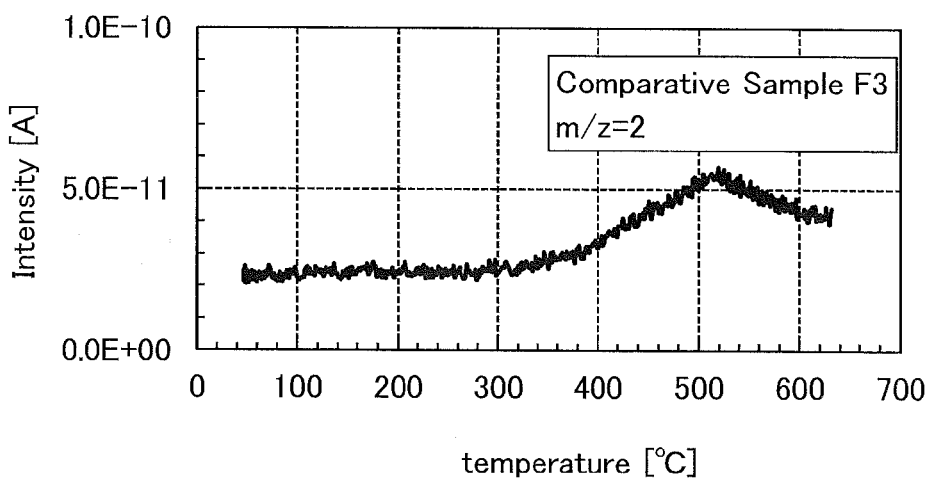

FIGS. 21A to 21C show the TDS results of Sample F1, Sample F2, and Comparative Sample F3. In the TDS analysis, the ion intensity of a gas detected at m/z=2 (e.g., $H_2$) was measured. FIG. 21A, FIG. 21B, and FIG. 21C show the results of Sample F1, Sample F2, and Comparative Sample F3, respectively.

Figure 22A:
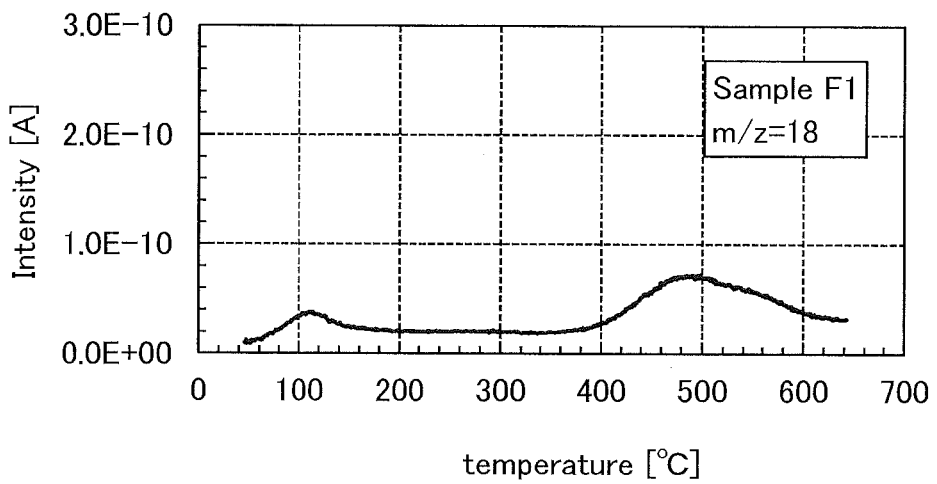
FIGS. 22A to 22C each show the amount of released water in TDS.
Figure 22B:
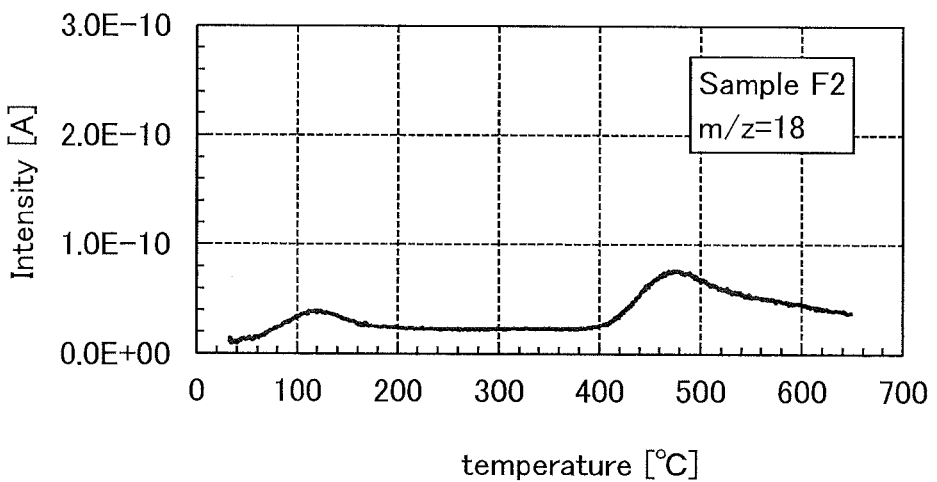
Figure 22C:
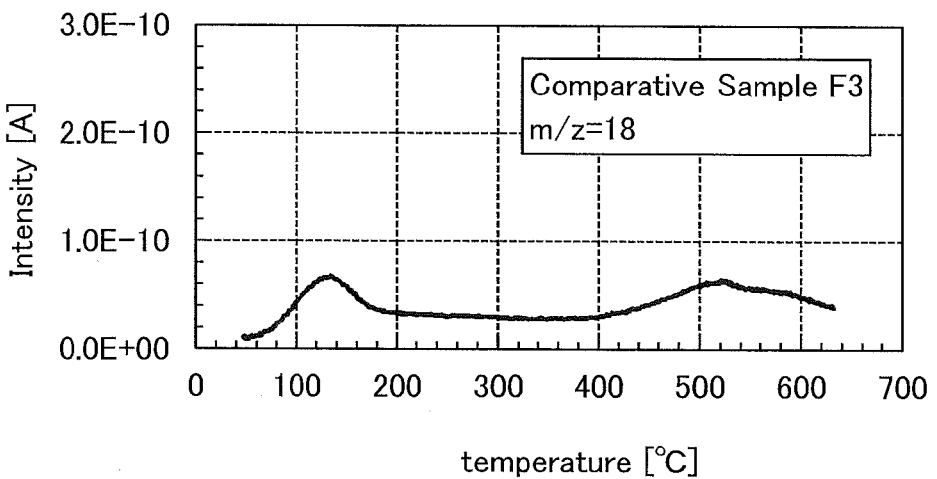

Similarly, FIGS. 22A to 22C show the TDS results of Sample F1, Sample F2, and Comparative Sample F3. In the TDS analysis, the ion intensity of a gas detected at m/z=18 (e.g., $H_2O$) was measured. FIG. 22A, FIG. 22B, and FIG. 22C show the results of Sample F1, Sample F2, and Comparative Sample F3, respectively.

Figure 23A:
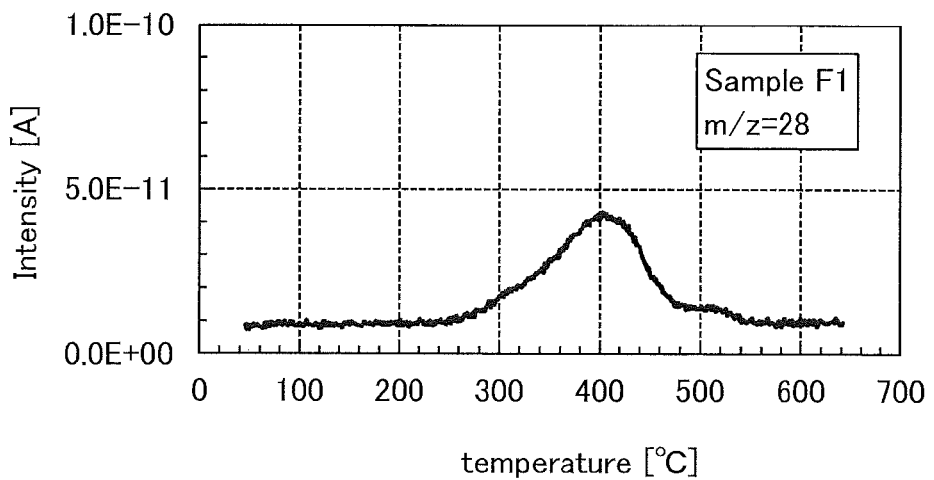
FIGS. 23A to 23C each show the amount of released nitrogen in TDS.
Figure 23B:
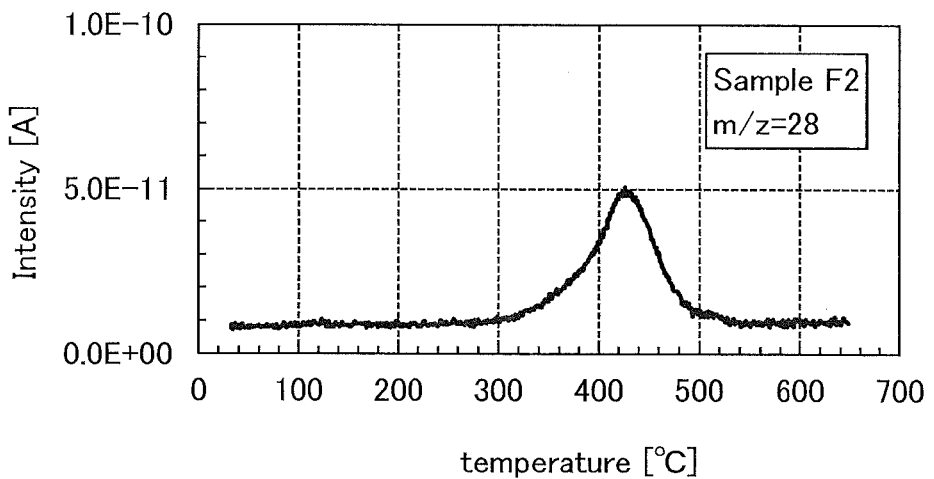
Figure 23C:
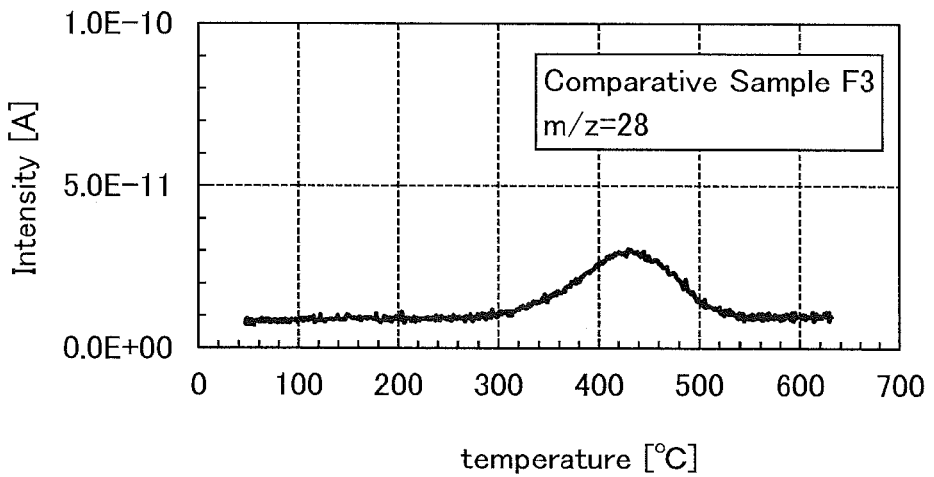

Similarly, FIGS. 23A to 23C show the TDS results of Sample F1, Sample F2, and Comparative Sample F3. In the TDS analysis, the ion intensity of a gas detected at m/z=28 (e.g., $N_2$) was measured. FIG. 23A, FIG. 23B, and FIG. 23C show the results of Sample F1, Sample F2, and Comparative Sample F3, respectively.

Figure 24A:
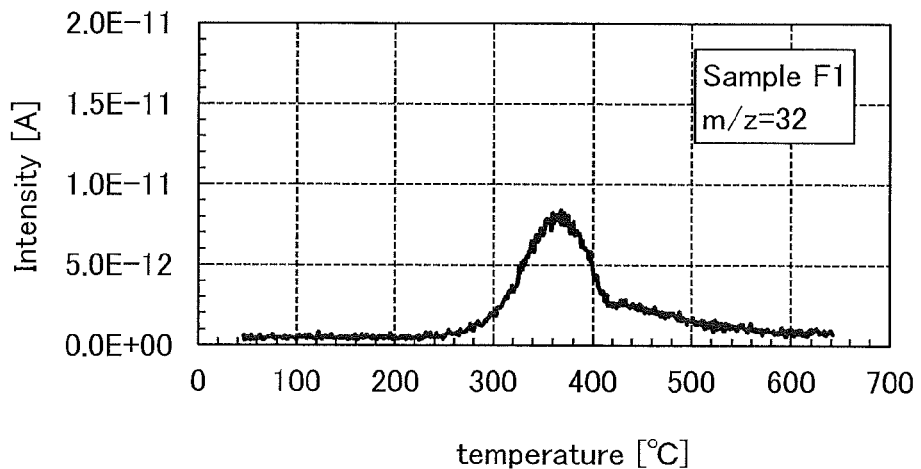
FIGS. 24A to 24C each show the amount of released oxygen in TDS.
Figure 24B:
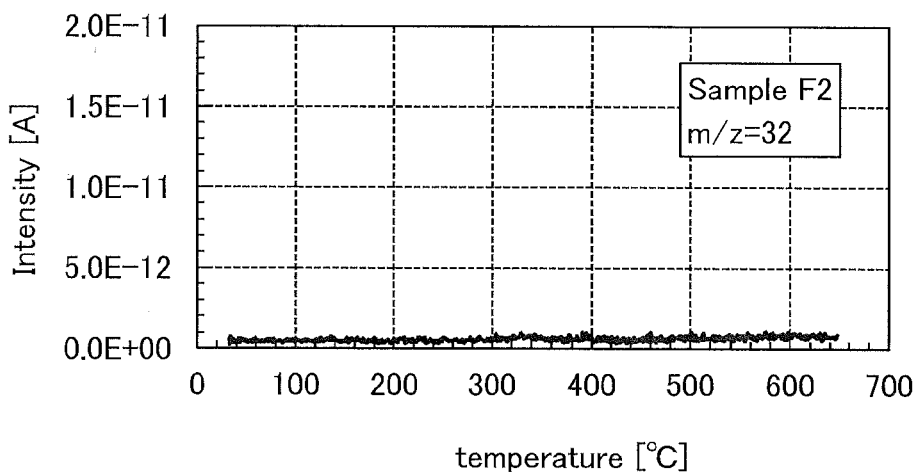
Figure 24C:
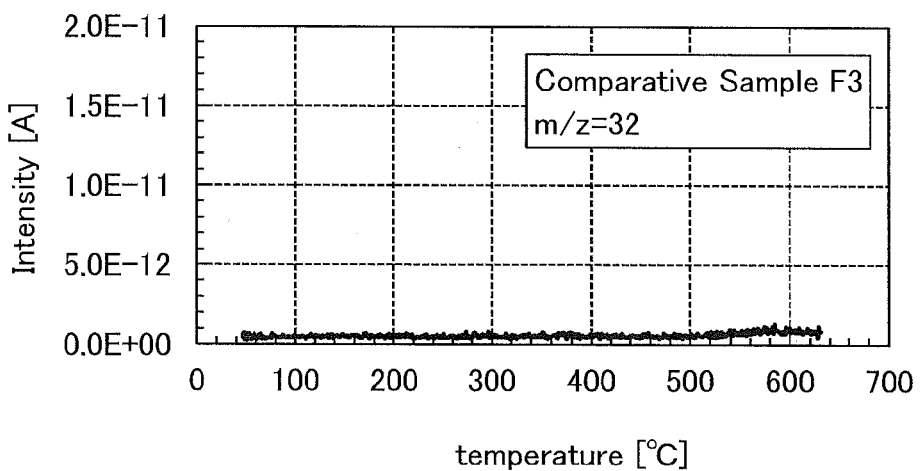

Similarly, FIGS. 24A to 24C show the TDS results of Sample F1, Sample F2, and Comparative Sample F3. In the TDS analysis, the ion intensity of a gas detected at m/z=32 (e.g., $O_2$) was measured. FIG. 24A, FIG. 24B, and FIG. 24C show the results of Sample F1, Sample F2, and Comparative Sample F3, respectively.

According to FIGS. 24A to 24C, a gas (m/z=32) was released from Sample F1 in the TDS analysis. This shows that a silicon oxynitride film which releases oxygen by being subjected to heat treatment (contains excess oxygen) can be formed by increasing the deposition pressure up to about 200 Pa. When excess oxygen contained in the silicon oxynitride film moves to an oxide semiconductor layer, the number of oxygen vacancies in the oxide semiconductor layer can be reduced. Thus, a transistor including an oxide semiconductor layer and a silicon oxynitride film containing excess oxygen has stable electrical characteristics and high reliability.

EXAMPLE 3

In this example, the silicon oxynitride films described in Example 1 were fabricated and binding states in the films were evaluated.

A 20-nm-thick silicon oxynitride film was formed over a silicon substrate. Conditions for forming the silicon oxynitride film were similar to those in Example 1. Here, the silicon oxynitride film was deposited at a pressure of 200 Pa for Sample G1, 100 Pa for Sample G2, and 40 Pa for Comparative Sample G3.

Next, evaluation of binding states in the samples was carried out by X-ray photoelectron spectroscopy (XPS). The results are shown in FIG. 25, FIG. 26, FIG. 27, and FIG. 28. In the XPS, Quantera SXM manufactured by ULVAC-PHI, Inc. was used and monochromatic AlKα ray (1.486 keV) was used for an X-ray source. The diameter of a detection region was set to 100 μm and the depth thereof was set to greater than or equal to 4 nm and less than or equal to 5 nm.

Figure 25:
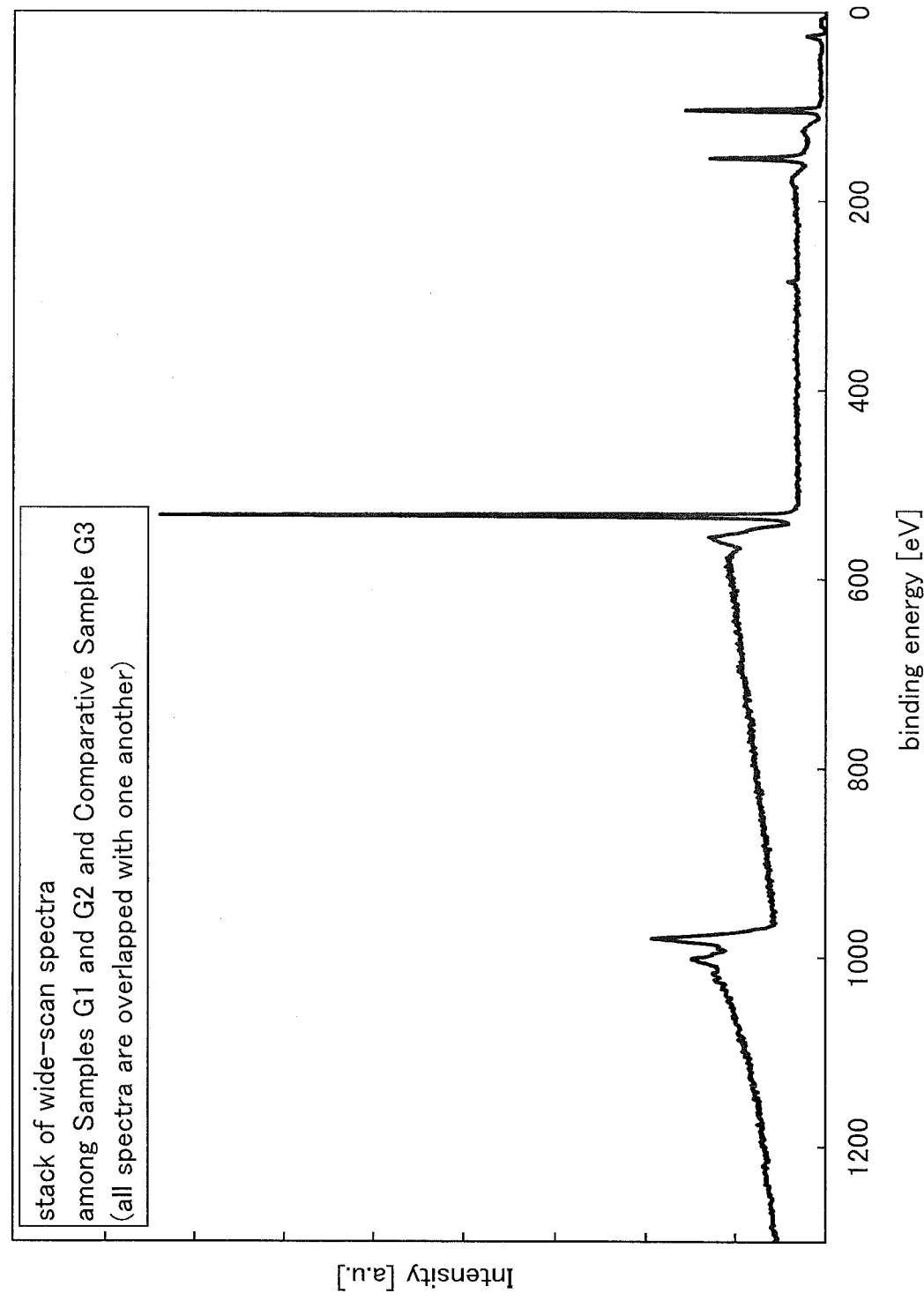
FIG. 25 shows XPS spectra of silicon oxynitride films.

FIG. 25 shows XPS spectra of the samples in a wide binding energy range of 0 eV to 1350 eV. In FIG. 25, the XPS spectra of the samples overlap with each other and no difference is observed therebetween.

Figure 26:
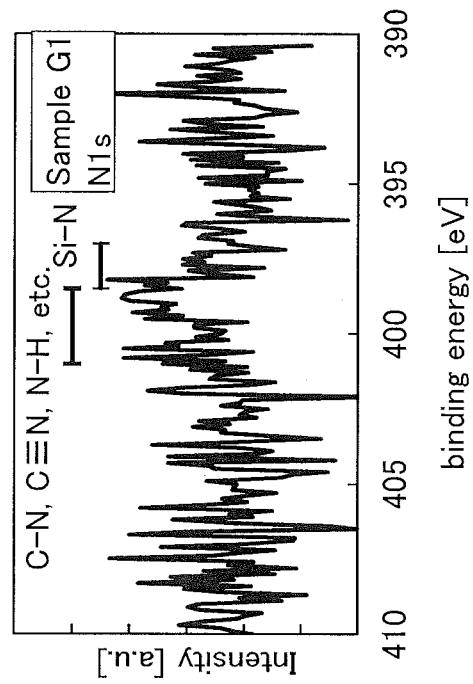
FIG. 26 shows XPS spectra of a silicon oxynitride film.
Figure 26:
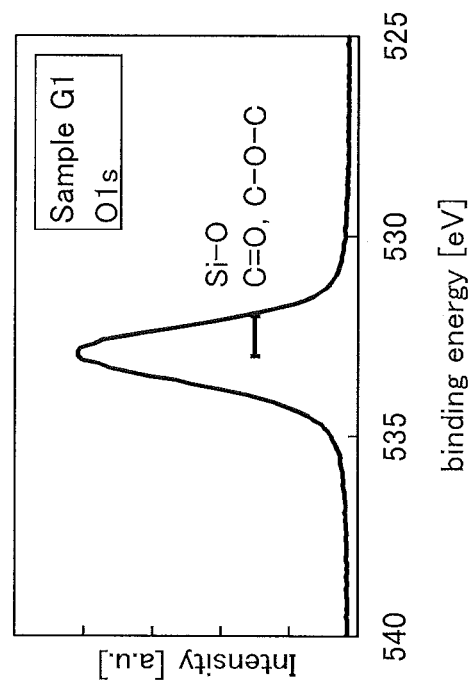
Figure 26:
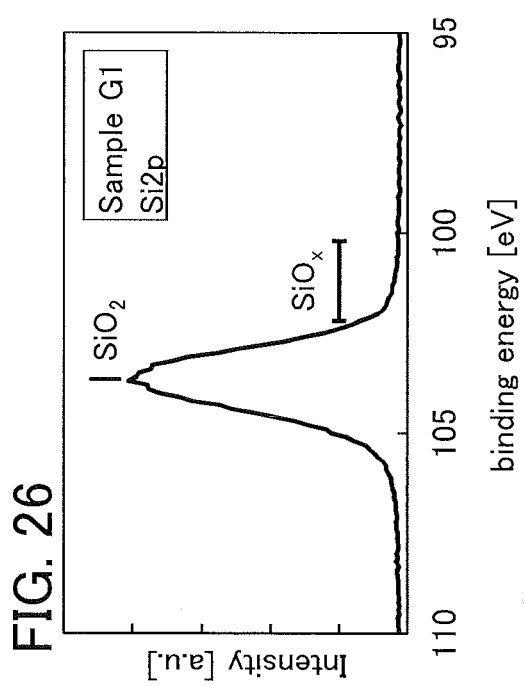
Figure 26:
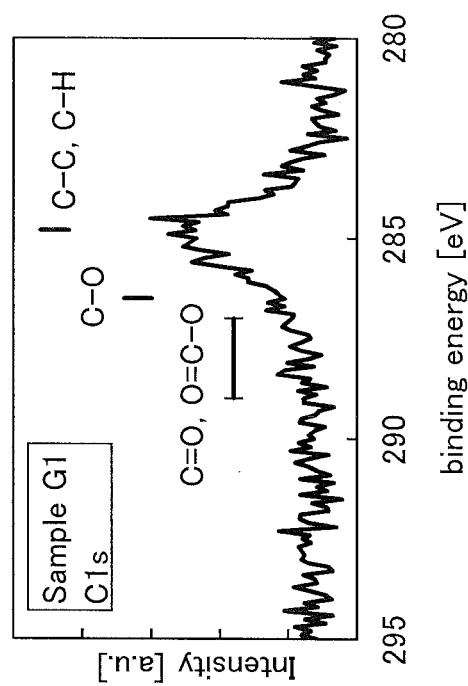
Figure 27:
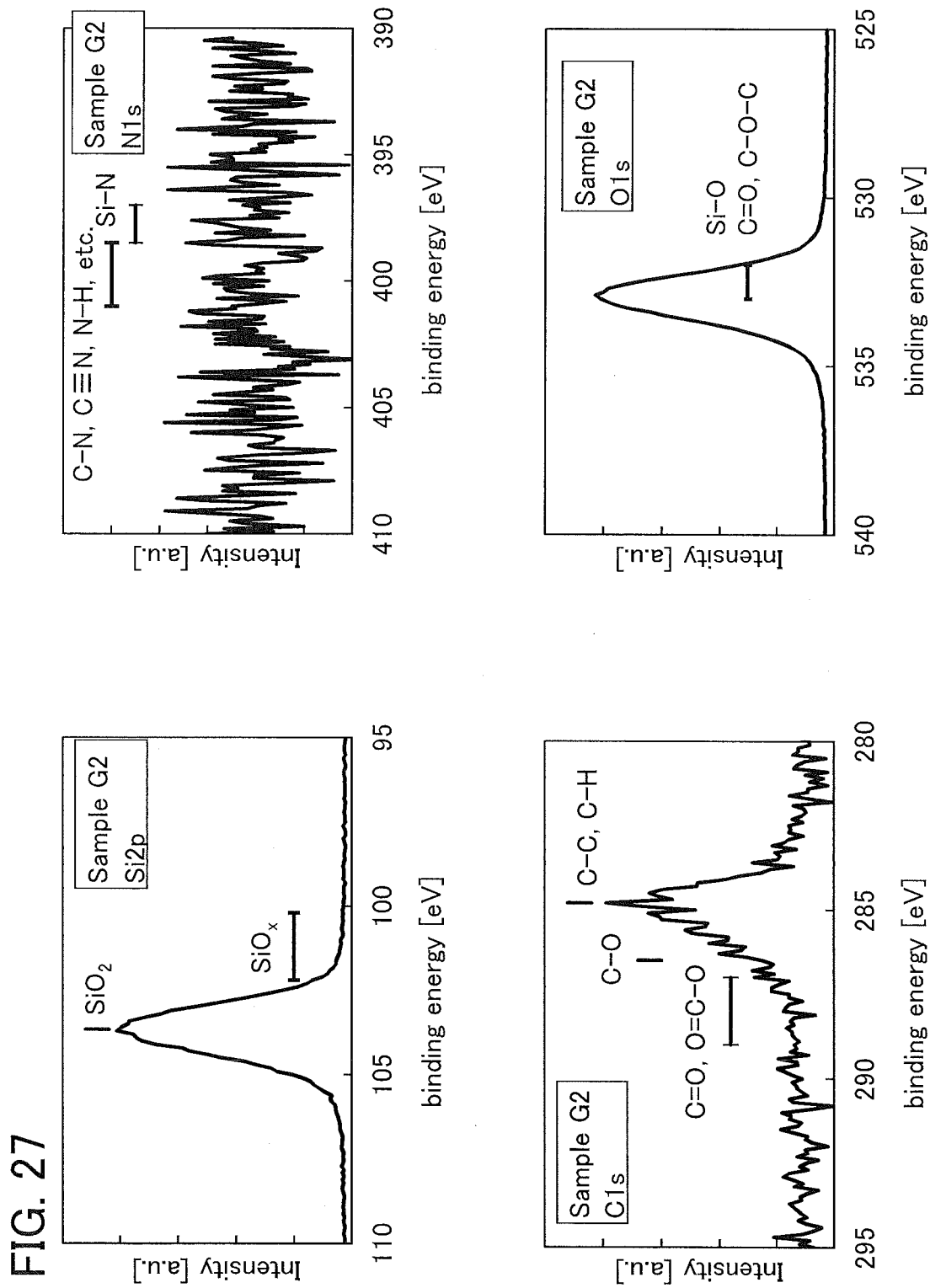
FIG. 27 shows XPS spectra of a silicon oxynitride film.
Figure 28:
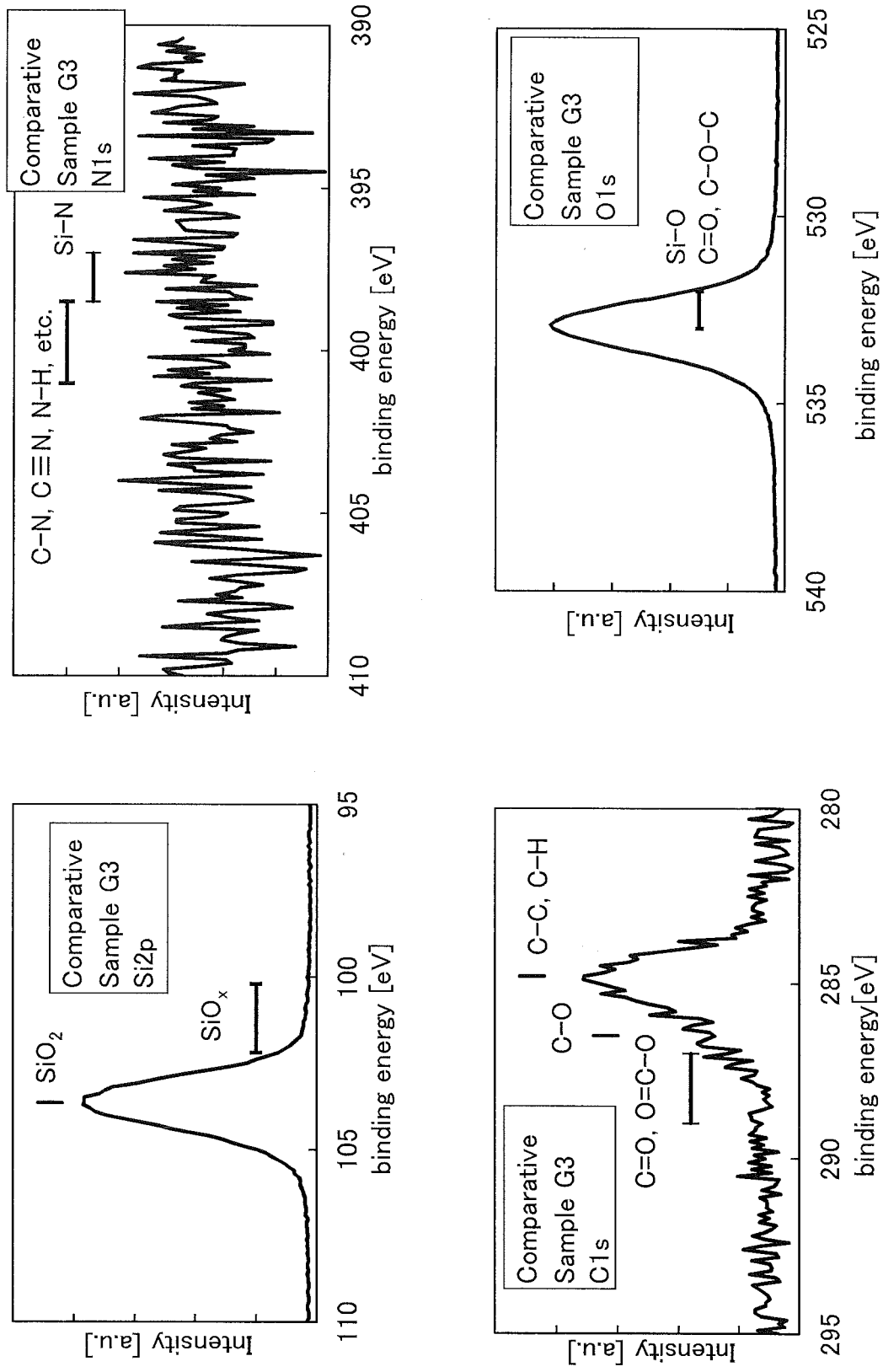
FIG. 28 shows XPS spectra of a silicon oxynitride film.

Next, high-resolution XPS spectra of each sample in the vicinity of peaks are shown in FIG. 26, FIG. 27, and FIG. 28. FIG. 26, FIG. 27, and FIG. 28 show the high-resolution XPS spectra of Sample G1, Sample G2, and Comparative Sample G3, respectively. The main binding states and chemical shifts are shown in FIG. 26, FIG. 27, and FIG. 28 for reference.

By comparing the high-resolution XPS spectra in FIG. 26, FIG. 27, and FIG. 28, it was found that only Sample G1 had a slight peak at a binding energy of 397.0 eV to 398.5 eV. This means that Sample G1 has a Si—N bond.

EXAMPLE 4

In this example, the silicon oxynitride film described in Example 1 was formed over an oxide semiconductor layer, and the oxide semiconductor layer was evaluated.

First, a method for fabricating samples is described.

A 100-nm-thick In—Ga—Zn oxide layer was formed over a quartz substrate by a sputtering method. Here, the In—Ga—Zn oxide layer was formed under the following conditions: a sputtering target containing In, Ga, and Zn at an atomic ratio of 1:1:1 was used, Ar with a flow rate of 30 sccm and oxygen with a flow rate of 15 sccm were supplied as a sputtering gas to a reaction chamber of a sputtering apparatus, the pressure in the reaction chamber was controlled to 0.4 Pa, and a direct current power of 0.5 kW was supplied. Note that the substrate temperature in the formation of the In—Ga—Zn oxide layer was set at 300° C.

Next, a 100-nm-thick silicon oxynitride film was formed over the In—Ga—Zn oxide layer. Conditions for forming the silicon oxynitride film were similar to those in Example 1. Here, the silicon oxynitride film was deposited at a pressure of 200 Pa for Sample D1, 100 Pa for Sample D2, and 40 Pa for Comparative Sample D3.

Sample D1, Sample D2, and Comparative Sample D3 were subjected to ESR measurement. The ESR measurement was performed under the following conditions: the measurement temperature was room temperature (25° C.), the high-frequency power (power of microwaves) of 9.5 GHz was 20 mW, and the direction of a magnetic field was parallel to a surface of each sample. Note that the lower limit of detection of the spin density corresponding to a signal at a g-factor of 1.93 due to oxygen vacancies in the In—Ga—Zn oxide layer was $1\times10^{17}$ spins/$cm^3$ ($1\times10^{11}$ spins/$cm^2$ per unit area).

Figure 29A:
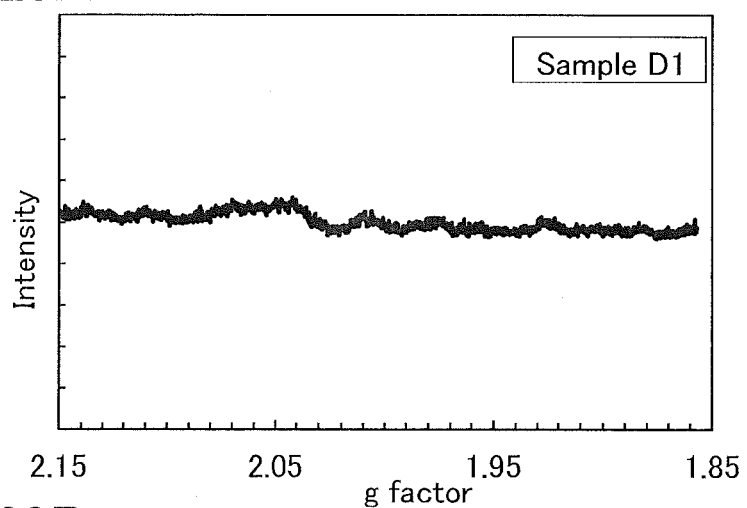
FIGS. 29A to 29C each show the result of ESR measurement performed on an oxide semiconductor layer.
Figure 29B:
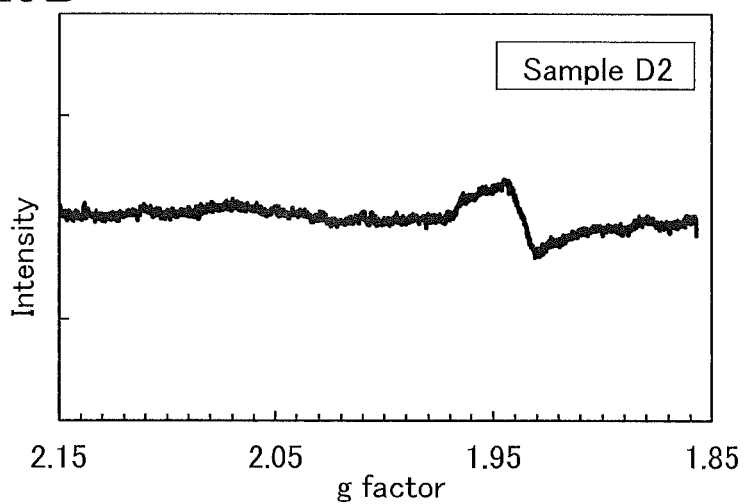
Figure 29C:
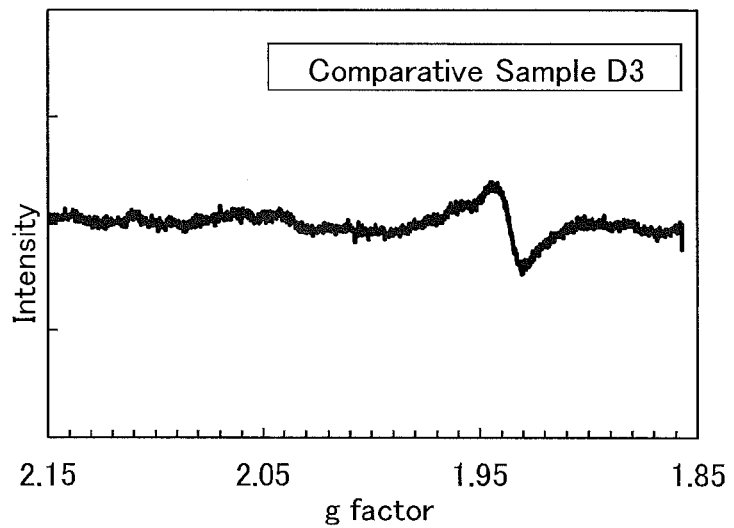

FIGS. 29A to 29C show the results of the ESR measurement performed on Sample D1, Sample D2, and Comparative Sample D3. FIG. 29A, FIG. 29B, and FIG. 29C show the results of ESR measurement of Sample D1, Sample D2, and Comparative Sample D3, respectively. In the graphs shown in FIGS. 29A to 29C, the vertical axis represents a first-order derivative of the absorption intensity of a microwave, and the horizontal axis represents a g-factor.

As shown in FIGS. 29A to 29C, a signal at a g-factor of 1.93 was not observed in Sample D1, whereas a signal at a g-factor of 1.93 was observed in Sample D2 and Comparative Sample D3. Then, the spectral intensity in each of FIGS. 29A to 29C was fitted with a Lorentz profile, and the spin density corresponding to the absorption intensity of the microwave was obtained by calculating the integral value of the signal at a g-factor of around 1.93. Note that the spin density in Sample D1 was less than the lower limit of detection of the absorption of the microwave ($1\times10^{17}$ spins/$cm^3$).

Figure 30:
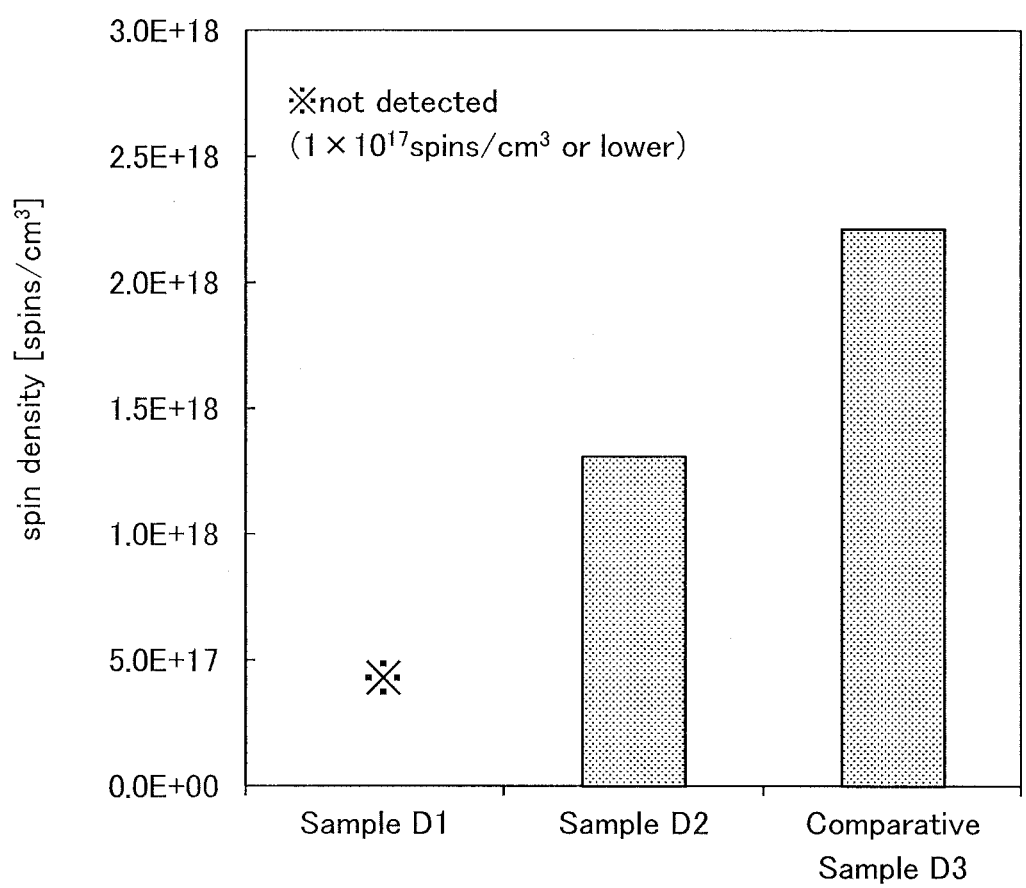
FIG. 30 shows the spin densities of oxide semiconductor layers.

FIG. 30 shows the spin densities each corresponding to the signal at a g-factor of 1.93. As seen from FIG. 30, the spin density in the In—Ga—Zn oxide was lowered as the pressure in deposition of the silicon oxynitride film was increased, and became less than the lower limit of detection ($1 \times 10^{17}$ spins/cm$^3$) at a deposition pressure of 200 Pa.

The above results show that when the pressure in deposition of a gate insulating layer over an In—Ga—Zn oxide is increased, oxygen vacancies in the In—Ga—Zn oxide can be reduced and the In—Ga—Zn oxide can have stable characteristics.

EXAMPLE 5

In this example, the silicon oxynitride film described in Example 1 was formed over an oxide semiconductor layer, and the impurity concentrations in the silicon oxynitride film and in the oxide semiconductor layer were measured.

First, a method for fabricating samples is described.

A 300-nm-thick silicon oxide film was formed over a single crystal silicon substrate by a sputtering method. The silicon oxide film was formed under the following conditions: oxygen with a flow rate of 50 sccm was supplied as a sputtering gas to a reaction chamber of a sputtering apparatus, the pressure in the reaction chamber was controlled to 0.4 Pa, and a direct current power of 1.5 kW was supplied. The substrate temperature was set to 100° C.

Then, a 100-nm-thick In—Ga—Zn oxide layer was formed over the silicon oxide film by a sputtering method. Here, the In—Ga—Zn oxide layer was formed under the following conditions: a sputtering target containing In, Ga, and Zn at an atomic ratio of 1:1:1 was used, Ar with a flow rate of 30 sccm and oxygen with a flow rate of 15 sccm were supplied as a sputtering gas to a reaction chamber of a sputtering apparatus, the pressure in the reaction chamber was controlled to 0.4 Pa, and a direct current power of 0.5 kW was supplied. Note that the substrate temperature in the formation of the In—Ga—Zn oxide layer was set at 300° C.

Here, heat treatment was performed. The heat treatment was performed at 450° C. in a nitrogen atmosphere for one hour and then in an oxygen atmosphere for one hour.

Next, a 20-nm-thick silicon oxynitride film was formed over the In—Ga—Zn oxide layer by a plasma CVD method. Conditions for forming the silicon oxynitride film were similar to those in Example 1. Here, the silicon oxynitride film was deposited at a pressure of 200 Pa for Sample E1, 100 Pa for Sample E2, and 40 Pa for Comparative Sample E3.

Figure 31:
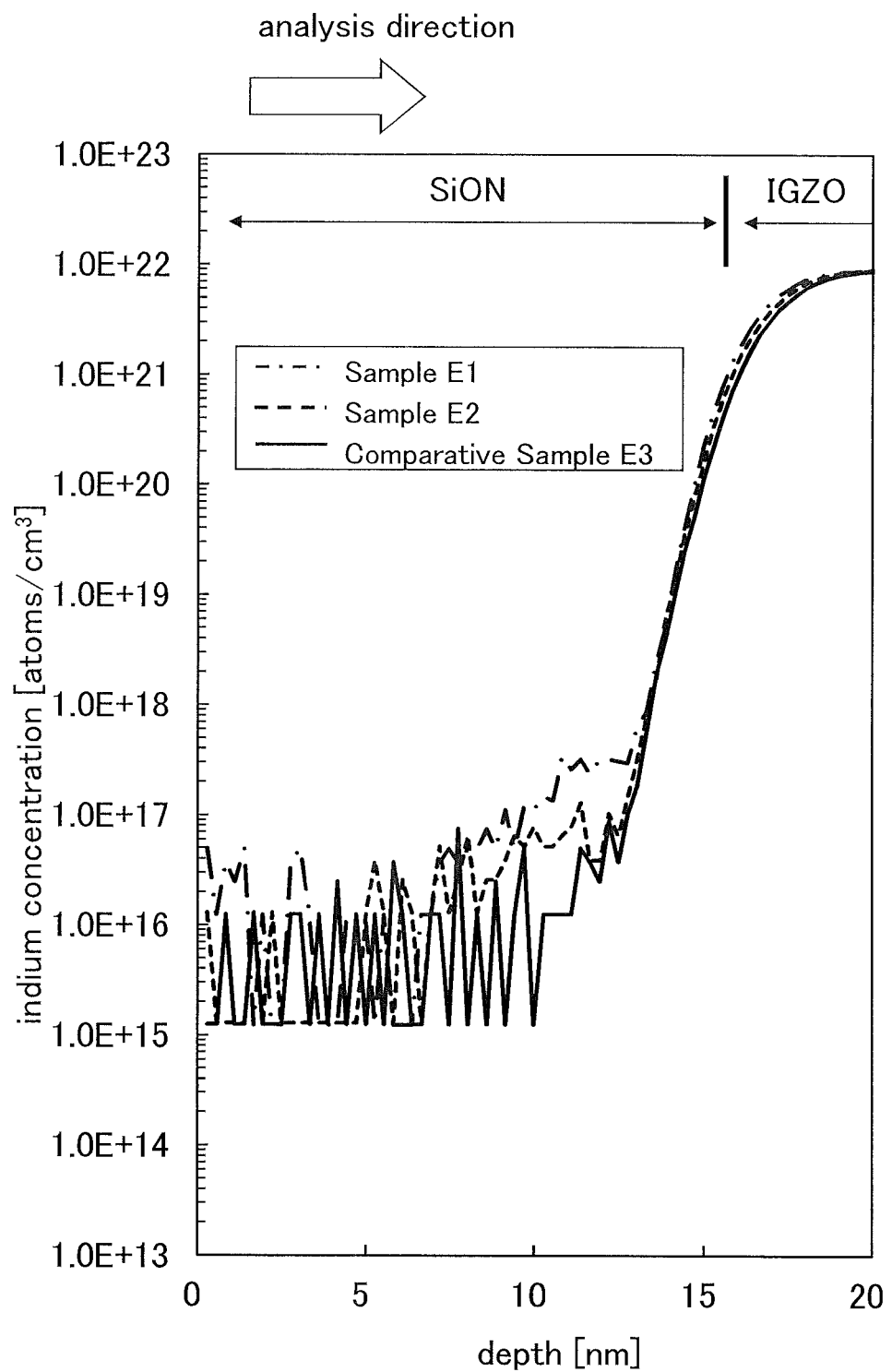
FIG. 31 shows the results of measuring indium concentrations in silicon oxynitride films by SIMS.

FIG. 31 shows the results of measuring the indium concentration in the silicon oxynitride film in each sample. The dashed-dotted line, the dotted line, and the solid line in the graph show the measurement results of Sample E1, Sample E2, and Comparative Sample E3, respectively. In the graph, SiON represents silicon oxynitride, and IGZO represents the In—Ga—Zn oxide. The concentration of indium which enters the silicon oxynitride from the interface between the In—Ga—Zn oxide layer and the silicon oxynitride film (the interface is located at a depth of 15 nm in the graph) is lowered as the deposition pressure is increased, as shown in FIG. 31. This means that as the deposition pressure is increased, diffusion of indium from the In—Ga—Zn oxide layer is reduced more. For example, when a silicon oxynitride film is used as a gate insulating layer, high indium concentration in the silicon oxynitride film might cause a decrease in withstand voltage, formation of a defect state, or the like. A reduction in diffusion of indium enables a transistor including an oxide semiconductor layer to have stable electrical characteristics.

Next, the impurity concentrations in the oxide semiconductor layer were measured in Sample E1, Sample E2, and Comparative Sample E3.

Here, the hydrogen concentration, the carbon concentration, the nitrogen concentration, and the fluorine concentration in the depth direction in each sample were analyzed by SIMS. The results are shown in FIGS. 32A and 32B and FIGS. 33A and 33B. The solid line, the broken line, and the dashed-dotted line show the results of Sample E1, Sample E2, and Comparative Sample E3, respectively. In the graph, SiON represents silicon oxynitride, IGZO represents the In—Ga—Zn oxide, and SiOx represents silicon oxide. The SIMS analysis was performed by using a PHI ADEPT-1010 quadrupole SIMS instrument manufactured by ULVAC-PHI, Inc.

Figure 32A:
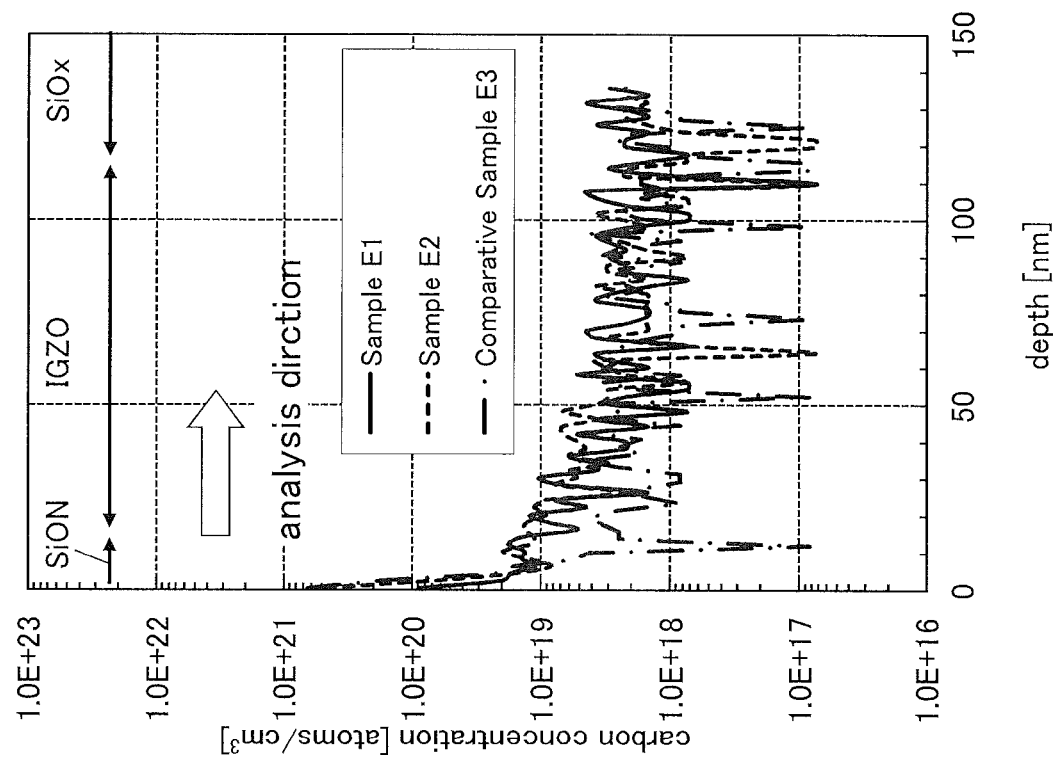
FIGS. 32A and 32B show the results of measuring hydrogen concentrations and carbon concentrations in oxide semiconductor layers by SIMS.
Figure 32B:
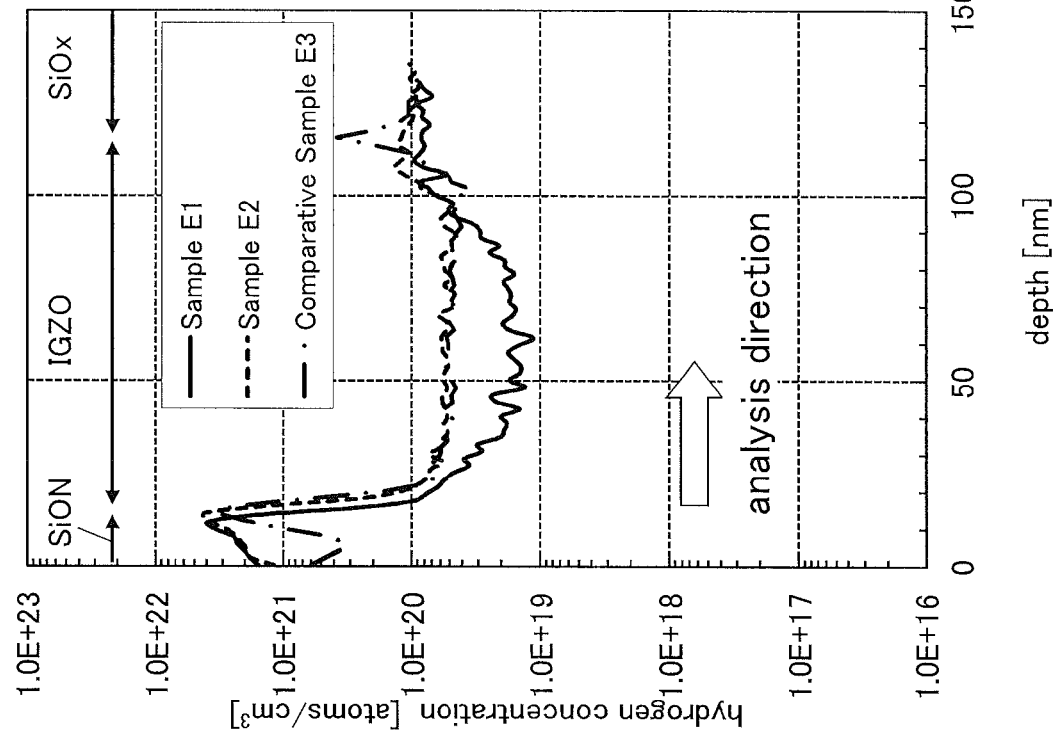
Figure 33A:
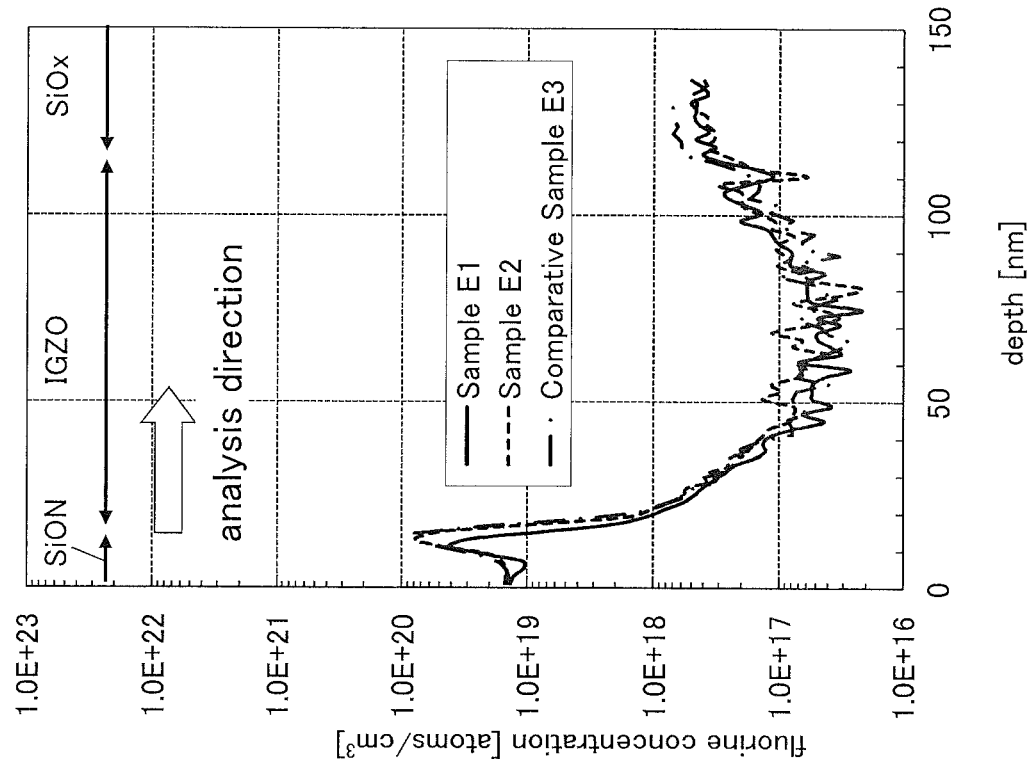
FIGS. 33A and 33B show the results of measuring nitrogen concentrations and fluorine concentrations in oxide semiconductor layers by SIMS.
Figure 33B:
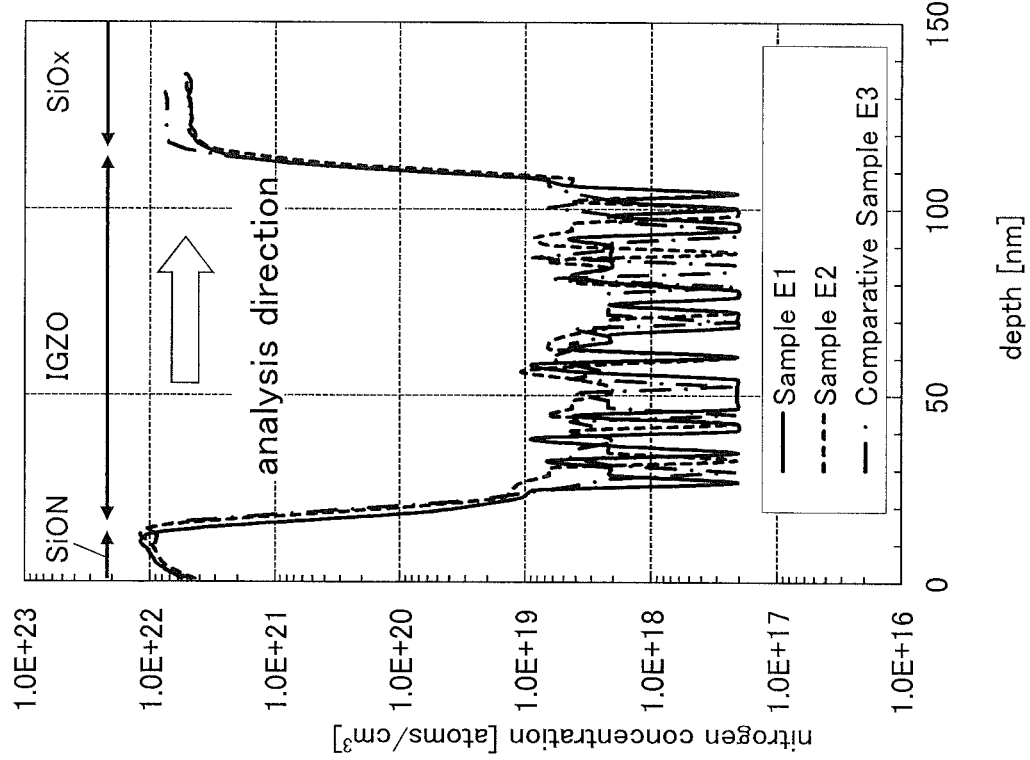

In FIG. 32A, the hydrogen concentration in each In—Ga—Zn oxide layer is quantified. In FIG. 32B, the carbon concentration in each In—Ga—Zn oxide layer is quantified. In FIG. 33A, the nitrogen concentration in each In—Ga—Zn oxide layer is quantified. In FIG. 33B, the fluorine concentration in each In—Ga—Zn oxide layer is quantified. Each sample was analyzed from the upper surface side. Note that the depth represented by the horizontal axis in each of FIGS. 32A and 32B and FIGS. 33A and 33B was not actually measured but was estimated from the etching rate of a standard sample.

The hydrogen concentration in the In—Ga—Zn oxide layer in Sample E1 was lower than those in Sample E2 and Comparative Sample E3. There was almost no difference between the samples in the carbon concentration, the nitrogen concentration, and the fluorine concentration in the In—Ga—Zn oxide layer.

Hydrogen is an impurity for an oxide semiconductor and may cause a defect state or the like. Thus, the hydrogen concentration in the oxide semiconductor layer is preferably as low as possible. This means that the silicon oxynitride film in Sample E1 is particularly suitable for a transistor including an oxide semiconductor layer.

EXAMPLE 6

In this example, a transistor including a gate insulating layer which can be used in a semiconductor device of one embodiment of the present invention was compared with Comparative Transistor in electrical characteristics.

First, a method for fabricating transistors is described.

A 300-nm-thick silicon oxynitride film as a base insulating layer was formed over a single crystal silicon substrate by a plasma CVD method. For the formation of the silicon oxynitride film, silane with a flow rate of 2.3 sccm and dinitrogen monoxide with a flow rate of 800 sccm as a source gas were supplied to a treatment chamber, and a power of 50 W was supplied with the use of a 27.12 MHz high-frequency power source. Further, the temperature of the substrate at the formation of the silicon oxynitride film was 450° C. Note that the plasma CVD apparatus used in this example is a parallel-plate plasma CVD apparatus in which the electrode area is 615 cm$^2$ and the power density is $8.1 \times 10^{-2}$ W/cm$^2$.

Next, a surface of the silicon oxynitride film was subjected to polishing treatment by a chemical mechanical polishing method, so that the average surface roughness ($R_a$) of the surface of the silicon oxynitride film was approximately 0.2 nm. Then, oxygen was implanted to the silicon oxynitride film by an ion implantation method. The conditions of the oxygen implantation were as follows: an acceleration voltage of 60 kV and a dosage of $2 \times 10^{16}$ ions/cm$^2$.

A 15-nm-thick In—Ga—Zn oxide layer as an oxide semiconductor layer was formed over the base insulating layer. The In—Ga—Zn oxide layer was formed by a sputtering method using an oxide target containing In, Ga, and Zn at an atomic ratio of 1:1:1 under the following conditions: argon with a flow rate of 30 sccm and oxygen with a flow rate of 15 sccm as a sputtering gas were supplied, the pressure was 0.4 Pa, the power was 0.5 kW, and the substrate temperature was 300° C.

Next, heat treatment was performed. The heat treatment was performed at 450° C. in a nitrogen atmosphere for one hour and then in an oxygen atmosphere for one hour.

Then, the In—Ga—Zn oxide layer was etched by an inductively coupled plasma (ICP) etching method under the following conditions: $BCl_3$ with a flow rate of 60 sccm and $Cl_2$ with a flow rate of 20 sccm as an etching gas were supplied, the power was 450 W, the bias power was 100 W, and the pressure was 1.9 Pa. By this etching, the In—Ga—Zn oxide layer was processed into an island-shaped oxide semiconductor layer.

Next, a 100-nm-thick tungsten film to be a source electrode layer and a drain electrode layer was formed over the base insulating layer and the oxide semiconductor layer by a sputtering method.

Then, the tungsten film was etched by an ICP etching method. This etching included first etching in which chlorine ($Cl_2$) with a flow rate of 45 sccm, carbon tetrafluoride ($CF_4$) with a flow rate of 55 sccm, and oxygen ($O_2$) with a flow rate of 55 sccm were supplied as an etching gas, the power was 3000 W, the bias power was 110 W, and the pressure was 0.67 Pa; second etching in which oxygen ($O_2$) with a flow rate of 100 sccm was supplied as an etching gas, the power was 2000 W, the bias power was 0 W, and the pressure was 3 Pa; and third etching in which chlorine ($Cl_2$) with a flow rate of 45 sccm, carbon tetrafluoride ($CF_4$) with a flow rate of 55 sccm, and oxygen ($O_2$) with a flow rate of 55 sccm were supplied as an etching gas, the power was 3000 W, the bias power was 110 W, and the pressure was 0.67 Pa. By this etching, the source electrode layer and the drain electrode layer having stepped-shape periphery portions were formed.

Next, a 20-nm-thick silicon oxynitride film to be a gate insulating layer was formed over the source electrode layer and the drain electrode layer. For the formation of the silicon oxynitride film, silane with a flow rate of 1 sccm and dinitrogen monoxide with a flow rate of 800 sccm as a source gas were supplied to a treatment chamber, and a power of 150 W was supplied with the use of a 60 MHz high-frequency power source. Further, the temperature of the substrate at the formation of the silicon oxynitride film was 350° C. Here, the deposition pressure was set to 200 Pa for Example Transistor and 40 Pa for Comparative Transistor.

A stack of a 30-nm-thick tantalum nitride film and a 135-nm-thick tungsten film to be a gate electrode layer was formed over the gate insulating layer by a sputtering method. Deposition conditions were as follows: for the tantalum nitride film, argon (Ar) with a flow rate of 50 sccm and nitrogen ($N_2$) with a flow rate of 10 sccm were supplied, the pressure was 0.6 Pa, and the power was 1 kW; and for the tungsten film, argon (Ar) with a flow rate of 100 sccm was supplied, the pressure was 2 Pa, and the power was 4 kW.

Next, the stack of the tantalum nitride film and the tungsten film was etched by an ICP etching method. This etching included first etching in which chlorine ($Cl_2$) with a flow rate of 45 sccm, carbon tetrafluoride ($CF_4$) with a flow rate of 55 sccm, and oxygen ($O_2$) with a flow rate of 55 sccm were supplied as an etching gas, the power was 3000 W, the bias power was 110 W, and the pressure was 0.67 Pa; and second etching in which chlorine ($Cl_2$) with a flow rate of 100 sccm was supplied as an etching gas, the power was 2000 W, the bias power was 50 W, and the pressure was 0.67 Pa.

Next, a stack of a 50-nm-thick silicon nitride film and a 300-nm-thick silicon oxynitride film to be an interlayer insulating layer was formed. The silicon nitride film was formed by a plasma CVD method under the following conditions: silane with a flow rate of 20 sccm and nitrogen with a flow rate of 500 sccm as a source gas were supplied to a treatment chamber, and a power of 900 W was supplied with the use of a 27.12 MHz high-frequency power source. Further, the temperature of the substrate at the formation of the silicon nitride film was 350° C. The silicon oxynitride film was formed by a plasma CVD method under the following conditions: silane with a flow rate of 5 sccm and dinitrogen monoxide with a flow rate of 1000 sccm as a source gas were supplied to a treatment chamber, and a power of 35 W was supplied with the use of a 13.56 MHz high-frequency power source. Further, the temperature of the substrate at the formation of the silicon oxynitride film was 325° C.

Figure 34:
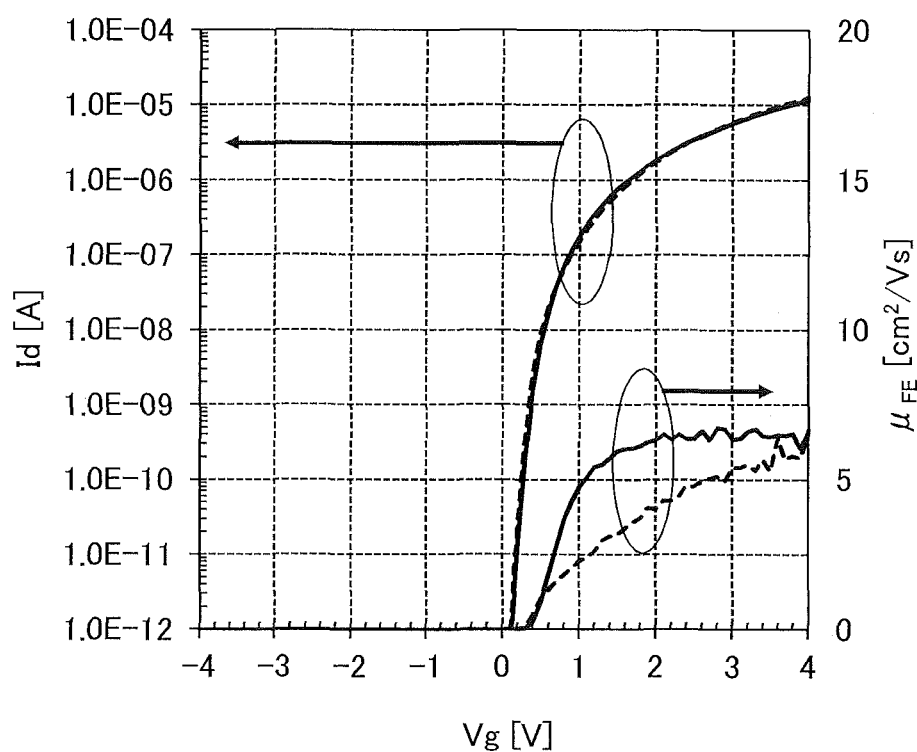
FIG. 34 shows characteristics of transistors which differ in the pressure in deposition of gate insulating layers.

FIG. 34 shows the gate voltage (Vg)-drain current (Id) characteristics of Example Transistor and Comparative Transistor at a drain voltage (Vd) of 3.3 V and the field-effect mobility of the transistors with respect to the gate voltage at a drain voltage of 0.1 V.

In FIG. 34, the left vertical axis represents the Id of the transistors; the solid line shows the result of Example Transistor and the dotted line shows the result of Comparative Transistor. The Vg-Id characteristics of the transistors were almost the same; thus, Vg-Id curves in FIG. 34 overlap with each other. The right vertical axis represents the field-effect mobility of the transistors; the solid line shows the result of Example Transistor and the dotted line shows the result of Comparative Transistor. Note that the field-effect mobility was obtained by operation of each transistor in a saturation region.

Example Transistor and Comparative Transistor had almost the same Vg-Id characteristics, whereas Example Transistor had higher field-effect mobility than Comparative Transistor at low gate voltage. In particular, Example Transistor had a field-effect mobility as high as about 5 $cm^2/Vs$ at a gate voltage of 1 V.

These results show that a transistor including a gate insulating layer deposited at a high pressure, which can be used in a semiconductor device of one embodiment of the present invention, is capable of high-speed operation even at a low voltage.

EXAMPLE 7

In this example, characteristics of transistors, each of which is a semiconductor device of one embodiment of the present invention, were evaluated. First, a method for fabricating the transistors employed in this example is described. In this example, transistors with a structure similar to that of the transistor illustrated in FIG. 5B were fabricated; thus, description is given using the reference numerals in FIG. 5B as appropriate.

A 300-nm-thick silicon oxynitride film as the base insulating layer 402 was formed over a single crystal silicon substrate by a plasma CVD method. For the formation of the silicon oxynitride film, silane with a flow rate of 2.3 sccm and dinitrogen monoxide with a flow rate of 800 sccm as a source gas were supplied to a treatment chamber, and a power of 50 W was supplied with the use of a 27.12 MHz high-frequency power source. Further, the temperature of the substrate at the formation of the silicon oxynitride film was 450° C. Note that the plasma CVD apparatus used in this example is a parallel-plate plasma CVD apparatus in which the electrode area is 615 cm$^2$ and the power density is $8.1 \times 10^{-2}$ W/cm$^2$.

Next, a surface of the silicon oxynitride film was subjected to polishing treatment by a chemical mechanical polishing method, so that the average surface roughness ($R_a$) of the surface of the silicon oxynitride film was approximately 0.2 nm. Then, oxygen was implanted to the silicon oxynitride film by an ion implantation method. The conditions of the oxygen implantation were as follows: an acceleration voltage of 60 kV and a dosage of $2 \times 10^{16}$ ions/cm$^2$.

Next, in order to form the oxide stack 404, an oxide layer, an oxide semiconductor layer, and another oxide layer were formed in succession. As an oxide layer to be the oxide layer 404a, a 5-nm-thick In—Ga—Zn oxide layer was formed by a sputtering method using an oxide target containing In, Ga, and Zn at an atomic ratio of 1:3:2. Deposition conditions were as follows: argon with a flow rate of 30 sccm and oxygen with a flow rate of 15 sccm as a sputtering gas were supplied, the pressure was 0.4 Pa, the power was 0.5 kW, and the substrate temperature was 200° C.

As an oxide semiconductor layer to be the oxide semiconductor layer 404b, a 15-nm-thick In—Ga—Zn oxide layer was formed by a sputtering method using an oxide target containing In, Ga, and Zn at an atomic ratio of 1:1:1. Deposition conditions were as follows: argon with a flow rate of 30 sccm and oxygen with a flow rate of 15 sccm as a sputtering gas were supplied, the pressure was 0.4 Pa, the power was 0.5 kW, and the substrate temperature was 300° C. A 5-nm-thick oxide layer to be the oxide layer 404c was formed over the oxide semiconductor layer under conditions similar to those for the oxide layer to be the oxide layer 404a.

Then, the stack of the In—Ga—Zn oxide layers was etched by an inductively coupled plasma (ICP) etching method under the following conditions: boron trichloride (BCl$_3$) with a flow rate of 60 sccm and chlorine (Cl$_2$) with a flow rate of 20 sccm as an etching gas were supplied, the power was 450 W, the bias power was 100 W, and the pressure was 1.9 Pa. By this etching, the stack was processed into an island shape and the oxide layer 404a, the oxide semiconductor layer 404b, and the oxide layer 404c were formed.

Next, a 100-nm-thick tungsten film to be the source electrode layer 406a and the drain electrode layer 406b was formed over the base insulating layer 402 and the oxide stack 404 by a sputtering method.

Then, the tungsten film was etched by an ICP etching method. This etching included first etching in which chlorine (Cl$_2$) with a flow rate of 45 sccm, carbon tetrafluoride (CF$_4$) with a flow rate of 55 sccm, and oxygen (O$_2$) with a flow rate of 55 sccm were supplied as an etching gas, the power was 3000 W, the bias power was 110 W, and the pressure was 0.67 Pa; second etching in which oxygen (O$_2$) with a flow rate of 100 sccm was supplied as an etching gas, the power was 2000 W, the bias power was 0 W, and the pressure was 3 Pa; and third etching in which chlorine (Cl$_2$) with a flow rate of 45 sccm, carbon tetrafluoride (CF$_4$) with a flow rate of 55 sccm, and oxygen (O$_2$) with a flow rate of 55 sccm were supplied as an etching gas, the power was 3000 W, the bias power was 110 W, and the pressure was 0.67 Pa. By this etching, the source electrode layer 406a and the drain electrode layer 406b having stepped-shape periphery portions were formed.

Next, a 20-nm-thick silicon oxynitride film to be the gate insulating layer 408 was formed over the source electrode layer 406a and the drain electrode layer 406b. For the formation of the silicon oxynitride film, silane with a flow rate of 1 sccm and dinitrogen monoxide with a flow rate of 800 sccm as a source gas were supplied to a treatment chamber, and a power of 150 W was supplied with the use of a 60 MHz high-frequency power source. Further, the temperature of the substrate was 350° C. and the deposition pressure was 200 Pa at the formation of the silicon oxynitride film.

Then, a stack of a 30-nm-thick tantalum nitride film and a 135-nm-thick tungsten film to be the gate electrode layer 410 was formed over the gate insulating layer 408 by a sputtering method. Deposition conditions were as follows: for the tantalum nitride film, argon (Ar) with a flow rate of 50 sccm and nitrogen (N$_2$) with a flow rate of 10 sccm were supplied, the pressure was 0.6 Pa, and the power was 1 kW; and for the tungsten film, argon (Ar) with a flow rate of 100 sccm was supplied, the pressure was 2 Pa, and the power was 4 kW.

Next, the stack of the tantalum nitride film and the tungsten film was etched by an ICP etching method. This etching included first etching in which chlorine (Cl$_2$) with a flow rate of 45 sccm, carbon tetrafluoride (CF$_4$) with a flow rate of 55 sccm, and oxygen (O$_2$) with a flow rate of 55 sccm were supplied as an etching gas, the power was 3000 W, the bias power was 110 W, and the pressure was 0.67 Pa; and second etching in which chlorine (Cl$_2$) with a flow rate of 100 sccm was supplied as an etching gas, the power was 2000 W, the bias power was 50 W, and the pressure was 0.67 Pa.

Next, a stack of a 50-nm-thick silicon nitride film and a 300-nm-thick silicon oxynitride film to be the interlayer insulating layer 412 was formed. The silicon nitride film was formed by a plasma CVD method under the following conditions: silane with a flow rate of 20 sccm and nitrogen with a flow rate of 500 sccm as a source gas were supplied to a treatment chamber, and a power of 900 W was supplied with the use of a 27.12 MHz high-frequency power source. Further, the temperature of the substrate at the formation of the silicon nitride film was 350° C. The silicon oxynitride film was formed by a plasma CVD method under the following conditions: silane with a flow rate of 5 sccm and dinitrogen monoxide with a flow rate of 1000 sccm as a source gas were supplied to a treatment chamber, and a power of 35 W was supplied with the use of a 13.56 MHz high-frequency power source. Further, the temperature of the substrate at the formation of the silicon oxynitride film was 325° C.

After formation of the interlayer insulating layer 412, heat treatment was performed in an oxygen atmosphere. Here, the transistor which was subjected to heat treatment at 350° C. for one hour is Sample H1, and the transistor which was subjected to heat treatment at 450° C. for one hour is Sample H2.

Next, a method for fabricating Comparative Sample H3 is described. Comparative Sample H3 has the same structure as Sample H1 and Sample H2 except that the oxide layer 404a and the oxide layer 404c are omitted and that heat treat after formation of the interlayer insulating layer 412 is skipped.

Figure 35A:
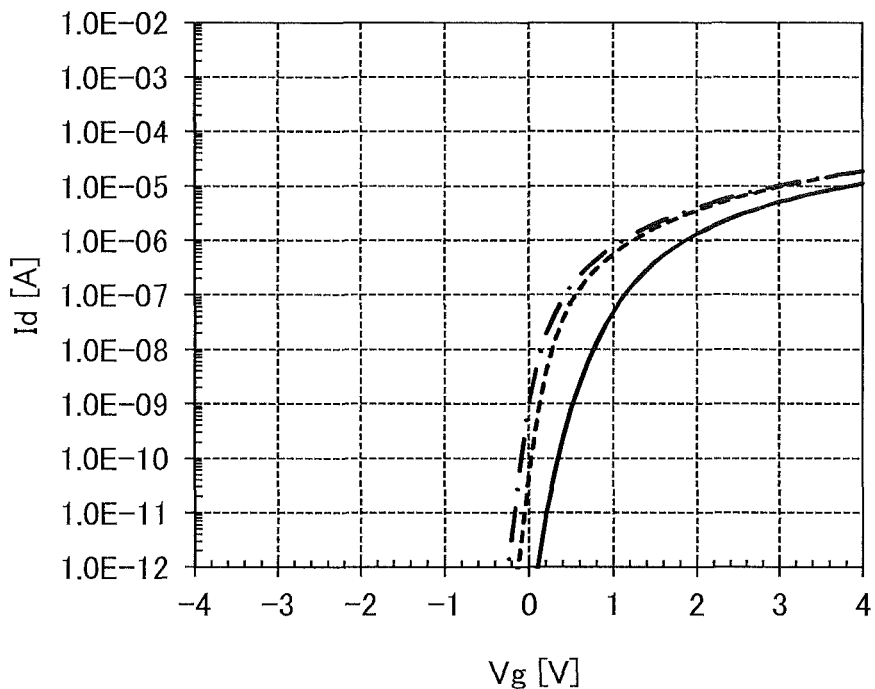
FIGS. 35A and 35B each show electrical characteristics of transistors.

The electrical characteristics of Sample H1, Sample H2, and Comparative Sample H3 fabricated in the above manner were measured. FIG. 35A shows the Vg-Id characteristics of the transistors at a drain voltage (Vd) of 3.3 V, and FIG. 35B shows the Vg-Id characteristics of the transistors at a drain voltage of 0.1 V.

Figure 35B:
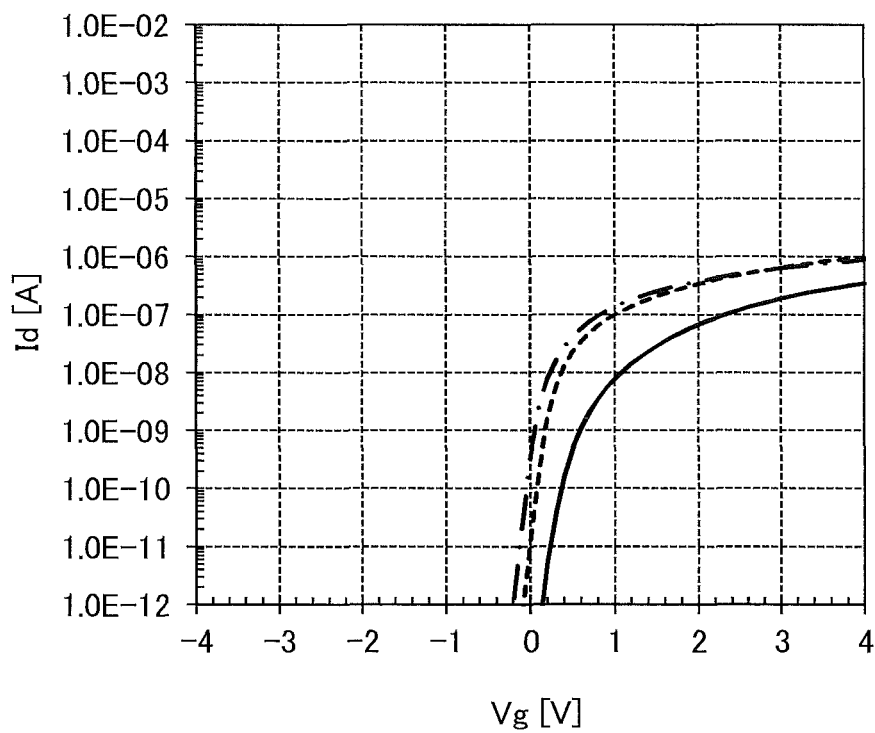

The dotted line, the solid line, and the dashed-dotted line in each of FIGS. 35A and 35B show the Vg-Id characteristics of Sample H1, Sample H2, and Comparative Sample H3, respectively.

FIGS. 35A and 35B show that the threshold voltages of Sample H1 and Sample H2 were higher than that of Comparative Sample H3 at both the drain voltage of 0.1 V and the drain voltage of 3.3 V and that Sample H1 and Sample H2 are transistors with low off-state current at a gate voltage of 0 V. In particular, drain current of Sample H2 was less than $1 \times 10^{-12}$ A at a gate voltage of 0 V, which means that Sample H2 has normally-off electrical characteristics.

Next, Sample H1, Sample H2, and Comparative Sample H3 were subjected to a bias-temperature stress test (BT stress test) and the characteristics thereof were compared.

A measurement method in a positive BT stress test is described. To measure electrical characteristics in the initial state (a state before stress application) of the target transistors, a change in current (drain current (Id)) between the source and the drain, that is, Vg-Id characteristics were measured under the following conditions: the substrate temperature was 40° C., the drain voltage was 0.1 V or 3.3 V, and the gate voltage was swept from −4 V to +4 V.

Next, the substrate temperature was increased to 150° C., and then, the drain voltage of each transistor was set to 0 V. After that, a gate voltage of 3.3 V was applied so that the intensity of the electric field applied to the gate insulating layer was 1.65 MV/cm. The gate voltage was kept being applied for 3600 seconds.

Note that a gate voltage of −3.3 V was applied in a negative BT stress test.

Figure 36:
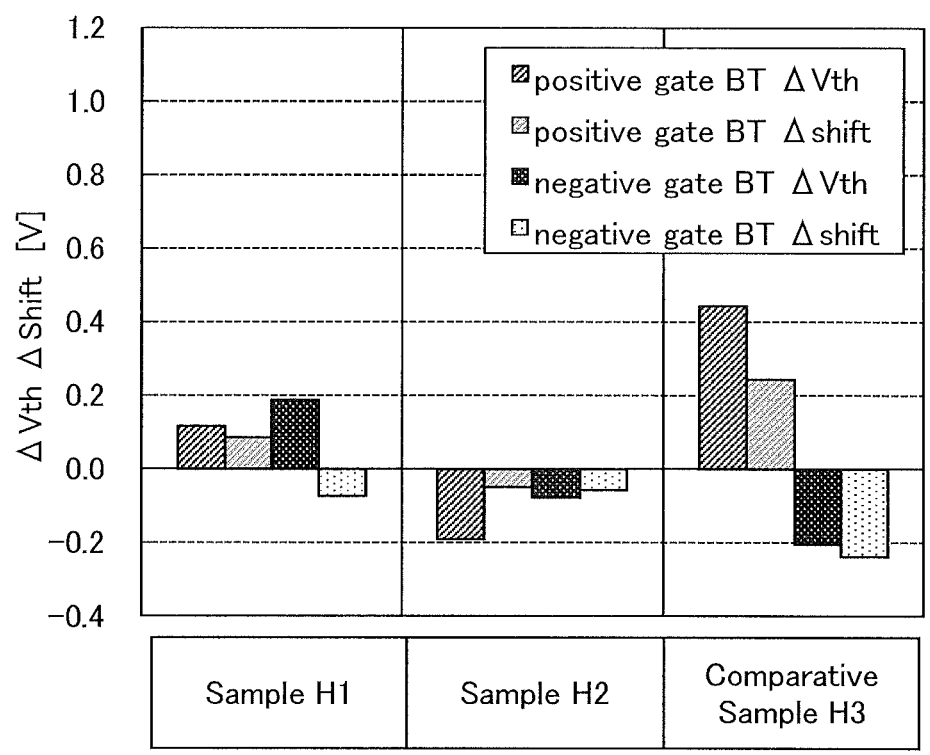
FIG. 36 shows the results of a gate bias-temperature (BT) stress test performed on transistors.

FIG. 36 shows the results of the BT stress test. As shown in FIG. 36, the amount of change in threshold voltage (ΔVth) in the positive gate BT stress test was 0.12 V in Sample H1, −0.19 V in Sample H2, and 0.44 V in Comparative Sample H3. The amount of change in shift value (Δshift) in the positive gate BT stress test was 0.09 V in Sample H1, −0.05 V in Sample H2, and 0.24 V in Comparative Sample H3. The amount of change in threshold voltage in the negative gate BT stress test was 0.19 V in Sample H1, −0.08 V in Sample H2, and −0.20 V in Comparative Sample H3. The amount of change in shift value in the negative gate BT stress test was −0.07 V in Sample H1, −0.06 V in Sample H2, and −0.24 V in Comparative Sample H3. According to FIG. 36, the amount of change in the BT stress test was smaller in Sample H1 and Sample H2 than in Comparative Sample H3. This shows that Sample H1 and Sample H2 of one embodiment of the present invention have higher reliability than Comparative Sample H3.

It was found from the above results that a transistor of one embodiment of the present invention is a highly reliable transistor which has a high threshold voltage (normally-off electrical characteristics), low off-state current, and a small amount of change in a gate BT stress test.

EXAMPLE 8

In this example, characteristics of transistors, each of which is a semiconductor device of one embodiment of the present invention, were evaluated. First, a method for fabricating the transistors employed in this example is described. In this example, transistors with a structure similar to that of the transistor illustrated in FIG. 5B were fabricated; thus, description is given using the reference numerals in FIG. 5B as appropriate.

A 300-nm-thick silicon oxynitride film as the base insulating layer 402 was formed over a single crystal silicon substrate by a plasma CVD method. For the formation of the silicon oxynitride film, silane with a flow rate of 2.3 sccm and dinitrogen monoxide with a flow rate of 800 sccm as a source gas were supplied to a treatment chamber, and a power of 50 W was supplied with the use of a 27.12 MHz high-frequency power source. Further, the temperature of the substrate at the formation of the silicon oxynitride film was 450° C. Note that the plasma CVD apparatus used in this example is a parallel-plate plasma CVD apparatus in which the electrode area is 615 $cm^2$ and the power density is $8.1 \times 10^{-2}$ $W/cm^2$.

Next, a surface of the silicon oxynitride film was subjected to polishing treatment by a chemical mechanical polishing method, so that the average surface roughness ($R_a$) of the surface of the silicon oxynitride film was approximately 0.2 nm. Then, oxygen was implanted to the silicon oxynitride film by an ion implantation method. The conditions of the oxygen implantation were as follows: an acceleration voltage of 60 kV and a dosage of $2 \times 10^{16}$ $ions/cm^2$.

Next, in order to form the oxide stack 404, an oxide layer, an oxide semiconductor layer, and another oxide layer were formed in succession. As an oxide layer to be the oxide layer 404a, an In—Ga—Zn oxide layer was formed by a sputtering method using an oxide target containing In, Ga, and Zn at an atomic ratio of 1:3:2. The thickness of the In—Ga—Zn oxide layer was varied (5 nm and 20 nm). Deposition conditions were as follows: argon with a flow rate of 30 sccm and oxygen with a flow rate of 15 sccm as a sputtering gas were supplied, the pressure was 0.4 Pa, the power was 0.5 kW, and the substrate temperature was 200° C.

As an oxide semiconductor layer to be the oxide semiconductor layer 404b, a 15-nm-thick In—Ga—Zn oxide layer was formed by a sputtering method using an oxide target containing In, Ga, and Zn at an atomic ratio of 1:1:1. Deposition conditions were as follows: argon with a flow rate of 30 sccm and oxygen with a flow rate of 15 sccm as a sputtering gas were supplied, the pressure was 0.4 Pa, the power was 0.5 kW, and the substrate temperature was 300° C. A 5-nm-thick oxide layer to be the oxide layer 404c was formed over the oxide semiconductor layer under conditions similar to those for the oxide layer to be the oxide layer 404a.

Then, the stack of the In—Ga—Zn oxide layers was etched by an inductively coupled plasma (ICP) etching method under the following conditions: boron trichloride ($BCl_3$) with a flow rate of 60 sccm and chlorine ($Cl_2$) with a flow rate of 20 sccm as an etching gas were supplied, the power was 450 W, the bias power was 100 W, and the pressure was 1.9 Pa. By this etching, the stack was processed into an island shape and the oxide layer 404a, the oxide semiconductor layer 404b, and the oxide layer 404c were formed.

Next, a 100-nm-thick tungsten film to be the source electrode layer 406a and the drain electrode layer 406b was formed over the base insulating layer 402 and the oxide stack 404 by a sputtering method.

Then, the tungsten film was etched by an ICP etching method. This etching included first etching in which chlorine ($Cl_2$) with a flow rate of 45 sccm, carbon tetrafluoride ($CF_4$) with a flow rate of 55 sccm, and oxygen ($O_2$) with a flow rate of 55 sccm were supplied as an etching gas, the power was 3000 W, the bias power was 110 W, and the pressure was 0.67 Pa; second etching in which oxygen ($O_2$) with a flow rate of 100 sccm was supplied as an etching gas, the power was 2000 W, the bias power was 0 W, and the pressure was 3 Pa; and third etching in which chlorine ($Cl_2$) with a flow rate of 45 sccm, carbon tetrafluoride ($CF_4$) with a flow rate of 55 sccm, and oxygen ($O_2$) with a flow rate of 55 sccm were supplied as an etching gas, the power was 3000 W, the bias power was 110 W, and the pressure was 0.67 Pa. By this etching, the source electrode layer 406a and the drain electrode layer 406b having stepped-shape periphery portions were formed.

Next, a 20-nm-thick silicon oxynitride film to be the gate insulating layer 408 was formed over the source electrode layer 406a and the drain electrode layer 406b. For the formation of the silicon oxynitride film, silane with a flow rate of 1 sccm and dinitrogen monoxide with a flow rate of 800 sccm as a source gas were supplied to a treatment chamber, and a power of 150 W was supplied with the use of a 60 MHz high-frequency power source. Further, the temperature of the substrate was 350° C. and the deposition pressure was varied (200 Pa, 100 Pa, and 40 Pa) at the formation of the silicon oxynitride film.

Then, a stack of a 30-nm-thick tantalum nitride film and a 135-nm-thick tungsten film to be the gate electrode layer 410 was formed over the gate insulating layer 408 by a sputtering method. Deposition conditions were as follows: for the tantalum nitride film, argon (Ar) with a flow rate of 50 sccm and nitrogen ($N_2$) with a flow rate of 10 sccm were supplied, the pressure was 0.6 Pa, and the power was 1 kW; and for the tungsten film, argon (Ar) with a flow rate of 100 sccm was supplied, the pressure was 2 Pa, and the power was 4 kW.

Next, the stack of the tantalum nitride film and the tungsten film was etched by an ICP etching method. This etching included first etching in which chlorine ($Cl_2$) with a flow rate of 45 sccm, carbon tetrafluoride ($CF_4$) with a flow rate of 55 sccm, and oxygen ($O_2$) with a flow rate of 55 sccm were supplied as an etching gas, the power was 3000 W, the bias power was 110 W, and the pressure was 0.67 Pa; and second etching in which chlorine ($Cl_2$) with a flow rate of 100 sccm was supplied as an etching gas, the power was 2000 W, the bias power was 50 W, and the pressure was 0.67 Pa.

Next, a stack of a 50-nm-thick silicon nitride film and a 300-nm-thick silicon oxynitride film to be the interlayer insulating layer 412 was formed. The silicon nitride film was formed by a plasma CVD method under the following conditions: silane with a flow rate of 20 sccm and nitrogen with a flow rate of 500 sccm as a source gas were supplied to a treatment chamber, and a power of 900 W was supplied with the use of a 27.12 MHz high-frequency power source. Further, the temperature of the substrate at the formation of the silicon nitride film was 350° C. The silicon oxynitride film was formed by a plasma CVD method under the following conditions: silane with a flow rate of 5 sccm and dinitrogen monoxide with a flow rate of 1000 sccm as a source gas were supplied to a treatment chamber, and a power of 35 W was supplied with the use of a 13.56 MHz high-frequency power source. Further, the temperature of the substrate at the formation of the silicon oxynitride film was 325° C.

After formation of the interlayer insulating layer 412, heat treatment was performed at 450° C. in a nitrogen atmosphere for one hour and then heat treatment was performed at 450° C. in an oxygen atmosphere for one hour.

For comparison, samples in which the oxide layer 404a and the oxide layer 404c are omitted were prepared by the above method for fabricating samples.

Table 1 briefly shows fabrication conditions of the samples in this example.

TABLE 1

| Sample Name | Gate Insulating Layer | Oxide Layer (404a) | Oxide Semiconductor | Oxide Layer (404c) |
|---|---|---|---|---|
| I1 | 200 Pa | not formed | 15 nm | not formed |
| I2 | 100 Pa | | | |
| I3 | 40 Pa | | | |
| I4 | 200 Pa | 5 nm | 15 nm | 5 nm |
| I5 | 100 Pa | | | |
| I6 | 40 Pa | | | |
| I7 | 200 Pa | 20 nm | 15 nm | 5 nm |
| I8 | 100 Pa | | | |
| I9 | 40 Pa | | | |

Samples I1 to I9 fabricated in the above manner were subjected to a positive BT stress test and a negative BT stress test, and the Vg-Id characteristics thereof before and after the tests were compared. In measuring the Vg-Id characteristics, the drain voltage was set to 0.1 V or 3.3 V and the gate voltage was swept from −4 V to +4 V. FIGS. 37A1, 37A2, 37B1, 37B2, 37C1, and 37C2, FIGS. 38A1, 38A2, 38B1, 38B2, 38C1, and 38C2, and FIGS. 39A1, 39A2, 39B1, 39B2, 39C1, and 39C2 show the Vg-Id characteristics before and after the tests.

FIG. 37A1 shows the Vg-Id characteristics of Sample I1 before and after the positive BT stress test. FIG. 37A2 shows the Vg-Id characteristics of Sample I1 before and after the negative BT stress test. FIG. 37B1 shows the Vg-Id characteristics of Sample I2 before and after the positive BT stress test. FIG. 37B2 shows the Vg-Id characteristics of Sample I2 before and after the negative BT stress test. FIG. 37C1 shows the Vg-Id characteristics of Sample I3 before and after the positive BT stress test. FIG. 37C2 shows the Vg-Id characteristics of Sample I3 before and after the negative BT stress test. FIG. 38A1 shows the Vg-Id characteristics of Sample I4 before and after the positive BT stress test. FIG. 38A2 shows the Vg-Id characteristics of Sample I4 before and after the negative BT stress test. FIG. 38B1 shows the Vg-Id characteristics of Sample I5 before and after the positive BT stress test. FIG. 38B2 shows the Vg-Id characteristics of Sample I5 before and after the negative BT stress test. FIG. 38C1 shows the Vg-Id characteristics of Sample I6 before and after the positive BT stress test. FIG. 38C2 shows the Vg-Id characteristics of Sample I6 before and after the negative BT stress test. FIG. 39A1 shows the Vg-Id characteristics of Sample I7 before and after the positive BT stress test. FIG. 39A2 shows the Vg-Id characteristics of Sample I7 before and after the negative BT stress test. FIG. 39B1 shows the Vg-Id characteristics of Sample I8 before and after the positive BT stress test. FIG. 39B2 shows the Vg-Id characteristics of Sample I8 before and after the negative BT stress test. FIG. 39C1 shows the Vg-Id characteristics of Sample I9 before and after the positive BT stress test. FIG. 39C2 shows the Vg-Id characteristics of Sample I9 before and after the negative BT stress test. In each graph, the solid line represents the Vg-Id characteristics before the test and the dotted line represents the Vg-Id characteristics after the test.

FIG. 40 shows the amounts of change in threshold voltage (ΔVth) and shift value (ΔShift) due to the tests. Refer to the description in Example 7 for conditions of the positive BT stress test and the negative BT stress test.

FIGS. 37A1, 37A2, 37B1, 37B2, 37C1, and 37C2, FIGS. 38A1, 38A2, 38B1, 38B2, 38C1, and 38C2, FIGS. 39A1, 39A2, 39B1, 39B2, 39C1, and 39C2, and FIG. 40 show that the amounts of change in threshold voltage and shift value between before and after the positive BT stress test and between before and after the negative BT stress test were particularly small in Sample I4, Sample I5, Sample I7, and Sample I8.

According to this example, a transistor in which the amounts of change in threshold voltage and shift value are particularly small and which can be applied to a semiconductor device of one embodiment of the present invention has extremely high reliability.

This application is based on Japanese Patent Application serial no. 2012-230363 filed with Japan Patent Office on Oct. 17, 2012, Japanese Patent Application serial no. 2012-252327 filed with Japan Patent Office on Nov. 16, 2012, and Japanese Patent Application serial no. 2013-052623 filed with Japan Patent Office on Mar. 15, 2013, the entire contents of which are hereby incorporated by reference.

What is claimed is:

1. A semiconductor device comprising:
an oxide stack comprising:
an oxide layer; and
an oxide semiconductor layer over the oxide layer, wherein an electron affinity of the oxide semiconductor layer is higher than an electron affinity of the oxide layer by 0.1 eV or more;
a gate insulating layer in contact with the oxide stack; and
a gate electrode layer overlapping with the oxide stack with the gate insulating layer there between,
wherein the oxide semiconductor layer has a spin density corresponding to a signal at a g-factor of greater than or equal to 1.90 and less than or equal to 1.95 is $1.5 \times 10^{12}$ spins/cm$^2$ or less and the gate insulating layer has a spin density corresponding to a signal at a g-factor of greater than or equal to 2.00 and less than or equal to 2.01 is $2 \times 10^{12}$ spins/cm$^2$ or more in electron spin resonance spectroscopy.

2. The semiconductor device according to claim 1, wherein the oxide semiconductor layer and the oxide layer comprise indium, and
wherein a proportion of indium in the oxide semiconductor layer is higher than a proportion of indium in the oxide layer.

3. The semiconductor device according to claim 1, wherein the oxide semiconductor layer and the oxide layer comprise indium, gallium, and zinc.

4. The semiconductor device according to claim 1, wherein the oxide semiconductor layer comprises a crystal whose c-axis is aligned in a direction substantially perpendicular to an upper surface of the oxide semiconductor layer.

5. The semiconductor device according to claim 1, wherein a concentration of silicon in the oxide semiconductor layer is lower than $2 \times 10^{18}$ atoms/cm$^3$.

6. The semiconductor device according to claim 1, wherein the gate insulating layer is provided over the oxide stack, and
wherein the gate electrode layer is provided over the gate insulating layer.

7. A semiconductor device comprising:
a base insulating layer;
an oxide stack comprising:
an oxide layer over the base insulating layer; and
an oxide semiconductor layer over the oxide layer, wherein an electron affinity of the oxide semiconductor layer is higher than an electron affinity of the oxide layer by 0.1 eV or more;
a source electrode layer and a drain electrode layer in contact with the oxide stack;
a gate insulating layer over the source electrode layer and the drain electrode layer;
a gate electrode layer over the gate insulating layer; and
an interlayer insulating layer over the gate electrode layer,
wherein the oxide semiconductor layer has a spin density of $1.5 \times 10^{18}$ spins/cm$^2$ or less corresponding to a signal at a g-factor of greater than or equal to 1.90 and less than or equal to 1.95 in electron spin resonance spectroscopy, and
wherein the gate insulating layer has a spin density of $2 \times 10^{18}$ spins/cm$^2$ or more corresponding to a signal at a g-factor of greater than or equal to 2.00 and less than or equal to 2.01 in electron spin resonance spectroscopy.

8. The semiconductor device according to claim 7,
wherein the oxide semiconductor layer and the oxide layer comprise indium, and
wherein a proportion of indium in the oxide semiconductor layer is higher than a proportion of indium in the oxide layer.

9. The semiconductor device according to claim 7, wherein the oxide semiconductor layer and the oxide layer comprise indium, gallium, and zinc.

10. The semiconductor device according to claim 7, wherein the oxide semiconductor layer comprises a crystal whose c-axis is aligned in a direction substantially perpendicular to an upper surface of the oxide semiconductor layer.

11. The semiconductor device according to claim 7, wherein a concentration of silicon in the oxide semiconductor layer is lower than $2 \times 10^{18}$ atoms/cm$^3$.

12. The semiconductor device according to claim 7, wherein each of the source electrode layer and the drain electrode layer has a stepped shape in a periphery portion thereof.

13. The semiconductor device according to claim 7, wherein each of the source electrode layer and the drain electrode layer comprises a first electrode layer and a second electrode layer over the first electrode layer.

14. A semiconductor device comprising:
an oxide stack comprising:
a first oxide layer;
an oxide semiconductor layer over the first oxide layer; and
a second oxide layer over the oxide semiconductor layer, wherein an electron affinity of the oxide semiconductor layer is higher than an electron affinity of the first oxide layer or the second oxide layer by 0.1 eV or more;
a source electrode layer and a drain electrode layer in contact with the oxide stack;
a gate insulating layer in contact with the oxide stack; and
a gate electrode layer overlapping with the oxide stack with the gate insulating layer there between,
wherein the oxide semiconductor layer has a spin density of $1.5 \times 10^{18}$ spins/cm$^2$ or less corresponding to a signal at a g-factor of greater than or equal to 1.90 and less than or equal to 1.95 in electron spin resonance spectroscopy, and
wherein the gate insulating layer has a spin density of $2 \times 10^{18}$ spins/cm$^2$ or more corresponding to a signal at a g-factor of greater than or equal to 2.00 and less than or equal to 2.01 in electron spin resonance spectroscopy.

15. The semiconductor device according to claim 14,
wherein the oxide semiconductor layer, the first oxide layer, and the second oxide layer comprise indium, and wherein a proportion of indium in the oxide semiconductor layer is higher than a proportion of indium in the first oxide layer or the second oxide layer.

16. The semiconductor device according to claim 14, wherein the oxide semiconductor layer, the first oxide layer, and the second oxide layer comprise indium, gallium, and zinc.

17. The semiconductor device according to claim 14, wherein the oxide semiconductor layer comprises a crystal whose c-axis is aligned in a direction substantially perpendicular to an upper surface of the oxide semiconductor layer.

18. The semiconductor device according to claim 14, wherein a concentration of silicon in the oxide semiconductor layer is lower than $2 \times 10^{18}$ atoms/cm$^3$.

19. The semiconductor device according to claim 14, wherein each of the source electrode layer and the drain electrode layer has a stepped shape in a periphery portion thereof.

20. The semiconductor device according to claim 14, wherein each of the source electrode layer and the drain electrode layer comprises a first electrode layer and a second electrode layer over the first electrode layer.

21. The semiconductor device according to claim 14,
wherein the gate insulating layer is provided over the oxide stack, and
wherein the gate electrode layer is provided over the gate insulating layer.

* * * * *